(12) United States Patent
Maruyama et al.

(10) Patent No.: US 7,696,024 B2
(45) Date of Patent: Apr. 13, 2010

(54) SEMICONDUCTOR DEVICE AND MANUFACTURING METHOD THEREOF

(75) Inventors: Hotaka Maruyama, Tochigi (JP); Kengo Akimoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 315 days.

(21) Appl. No.: 11/693,447

(22) Filed: Mar. 29, 2007

(65) Prior Publication Data
US 2007/0232005 A1 Oct. 4, 2007

(30) Foreign Application Priority Data
Mar. 31, 2006 (JP) .............................. 2006-100263

(51) Int. Cl.
*H01L 21/00* (2006.01)
*H01L 27/088* (2006.01)

(52) U.S. Cl. ...................... 438/151; 438/163; 438/164; 257/347; 257/384; 257/E21.415

(58) Field of Classification Search ................ 438/299, 438/151, 163, 164, 664; 257/347, 349, 352, 257/384, E21.415
See application file for complete search history.

(56) References Cited

U.S. PATENT DOCUMENTS

| | | | |
|---|---|---|---|
| 5,412,493 A * | 5/1995 | Kunii et al. .................... 349/43 |
| 5,648,277 A | 7/1997 | Zhang et al. |
| 5,719,065 A | 2/1998 | Takemura et al. |
| 5,736,414 A | 4/1998 | Yamaguchi |
| 5,773,327 A | 6/1998 | Yamazaki et al. |
| 5,945,711 A | 8/1999 | Takemura et al. |
| 5,962,872 A | 10/1999 | Zhang et al. |
| 5,962,897 A | 10/1999 | Takemura et al. |
| 6,049,092 A | 4/2000 | Konuma et al. |
| 6,127,702 A | 10/2000 | Yamazaki et al. |
| 6,218,678 B1 | 4/2001 | Zhang et al. |
| 6,259,120 B1 | 7/2001 | Zhang et al. |
| 6,335,231 B1 | 1/2002 | Yamazaki et al. |
| 6,335,555 B1 | 1/2002 | Takemura et al. |
| 6,380,046 B1 | 4/2002 | Yamazaki |
| 6,455,875 B2 | 9/2002 | Takemura et al. |
| 6,469,317 B1 * | 10/2002 | Yamazaki et al. ............. 257/59 |
| 6,475,839 B2 | 11/2002 | Zhang et al. |
| 6,501,098 B2 | 12/2002 | Yamazaki |

(Continued)

FOREIGN PATENT DOCUMENTS

GB 2339966 2/2000

(Continued)

*Primary Examiner*—Michael Trinh
(74) *Attorney, Agent, or Firm*—Fish & Richardson P.C.

(57) ABSTRACT

A semiconductor device is provided, which comprises a semiconductor film, a gate insulating film, a gate electrode, an insulating film, and a source and drain electrodes. The semiconductor film includes at least a channel forming region, a region, a source and drain regions disposed between the channel forming region and the region, a first silicide region over the region, and a second silicide region over a portion of the source and drain regions. The insulating film has a contact hole to expose at least the first silicide region. Each of the source and drain electrodes is electrically connected to the first silicide region via the contact hole. The region includes an element imparting one conductivity type at a lower concentration than the source and drain regions.

22 Claims, 26 Drawing Sheets

U.S. PATENT DOCUMENTS

| | | |
|---|---|---|
| 6,518,594 B1 | 2/2003 | Nakajima et al. |
| 6,599,785 B2 * | 7/2003 | Hamada et al. ............. 438/151 |
| 6,617,612 B2 | 9/2003 | Zhang et al. |
| 6,617,644 B1 | 9/2003 | Yamazaki et al. |
| 6,624,473 B1 * | 9/2003 | Takehashi et al. ........... 257/344 |
| 6,777,763 B1 | 8/2004 | Zhang et al. |
| 6,790,749 B2 | 9/2004 | Takemura et al. |
| 6,803,264 B2 | 10/2004 | Yamazaki et al. |
| 6,835,607 B2 | 12/2004 | Takemura et al. |
| 6,867,431 B2 * | 3/2005 | Konuma et al. ............... 257/66 |
| 7,109,108 B2 | 9/2006 | Takemura et al. |
| 7,166,503 B2 | 1/2007 | Zhang et al. |
| 7,170,138 B2 | 1/2007 | Takemura et al. |
| 7,199,024 B2 | 4/2007 | Yamazaki |
| 7,301,209 B2 | 11/2007 | Takemura et al. |
| 7,339,235 B1 | 3/2008 | Yamazaki et al. |
| 7,381,599 B2 | 6/2008 | Konuma et al. |
| 7,473,592 B2 | 1/2009 | Yamazaki et al. |
| 7,473,971 B2 | 1/2009 | Yamazaki et al. |
| 7,476,576 B2 | 1/2009 | Yamazaki et al. |
| 7,525,158 B2 | 4/2009 | Konuma et al. |
| 2005/0153489 A1 | 7/2005 | Konuma et al. |
| 2006/0091397 A1 | 5/2006 | Akimoto et al. |
| 2006/0292726 A1 | 12/2006 | Akimoto et al. |
| 2007/0007529 A1 | 1/2007 | Takemura et al. |
| 2007/0173000 A1 | 7/2007 | Yamazaki |
| 2008/0054269 A1 | 3/2008 | Yamazaki et al. |
| 2008/0061299 A1 | 3/2008 | Takemura et al. |
| 2008/0061301 A1 | 3/2008 | Yamazaki |
| 2008/0067529 A1 | 3/2008 | Yamazaki |
| 2008/0067596 A1 | 3/2008 | Yamazaki et al. |
| 2008/0067597 A1 | 3/2008 | Yamazaki |
| 2008/0070335 A1 | 3/2008 | Yamazaki et al. |
| 2008/0083953 A1 | 4/2008 | Yamazaki |
| 2008/0113487 A1 | 5/2008 | Yamazaki et al. |
| 2008/0213953 A1 | 9/2008 | Yamazaki |
| 2008/0286941 A1 | 11/2008 | Yamazaki |
| 2008/0286942 A1 | 11/2008 | Yamazaki |
| 2008/0286956 A1 | 11/2008 | Yamazaki |
| 2009/0200611 A1 | 8/2009 | Takemura et al. |

FOREIGN PATENT DOCUMENTS

| | | |
|---|---|---|
| JP | 07-147396 A | 6/1995 |
| JP | 08-064549 A | 3/1996 |
| JP | 10-098199 | 4/1998 |
| JP | 10-135474 A | 5/1998 |

* cited by examiner

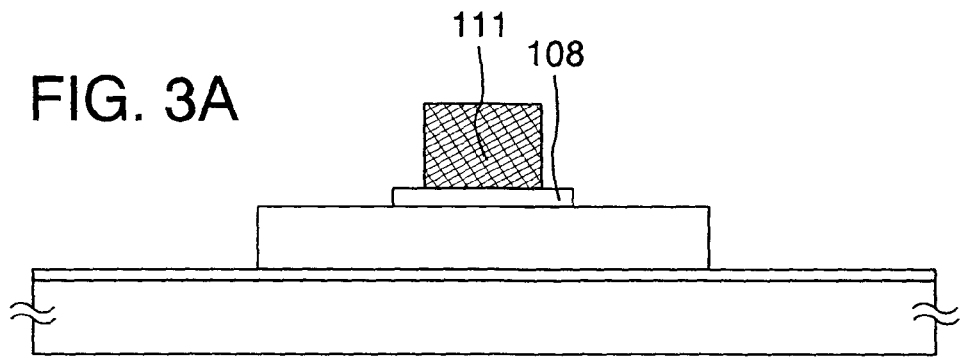
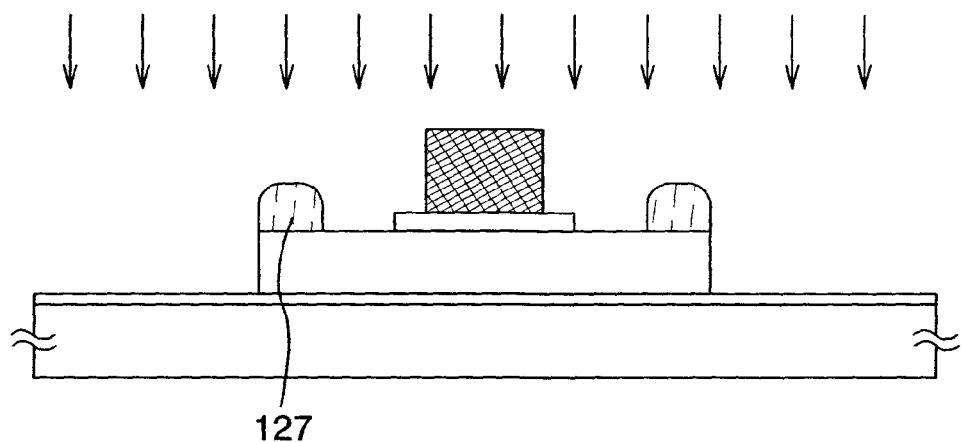
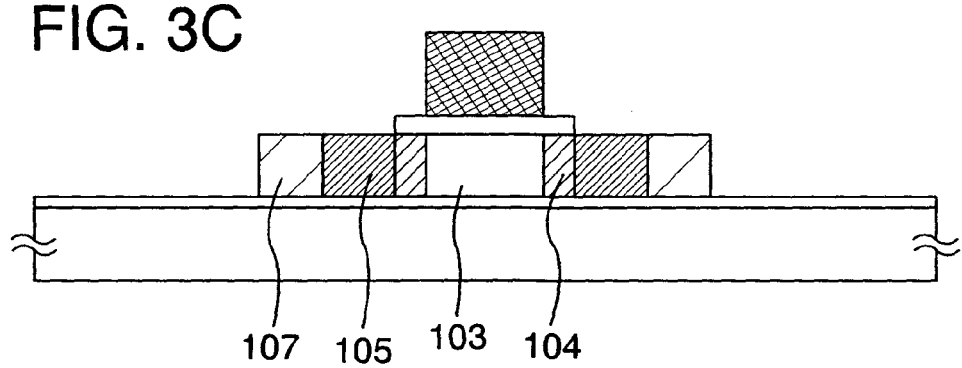
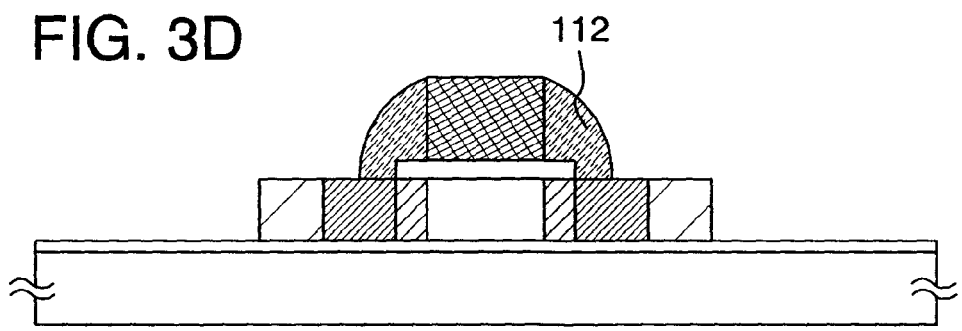

324 322 321
323

327

329 328

331

333   334

335

341  342

344  343

345  346  347  348

351  352  353

356  357

358

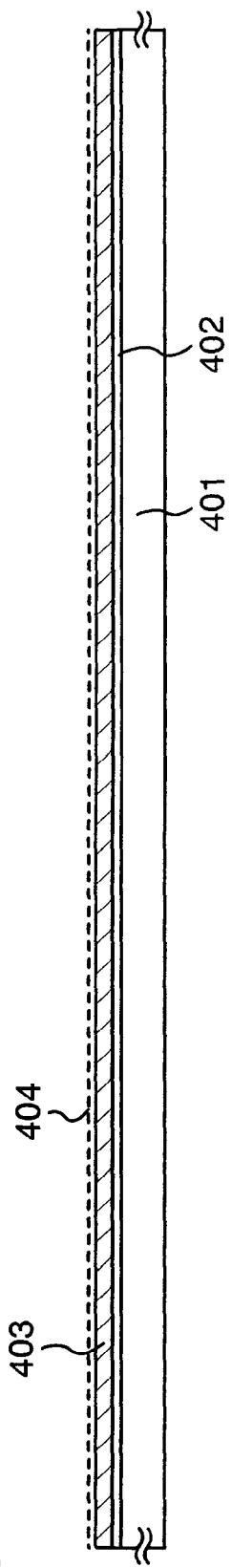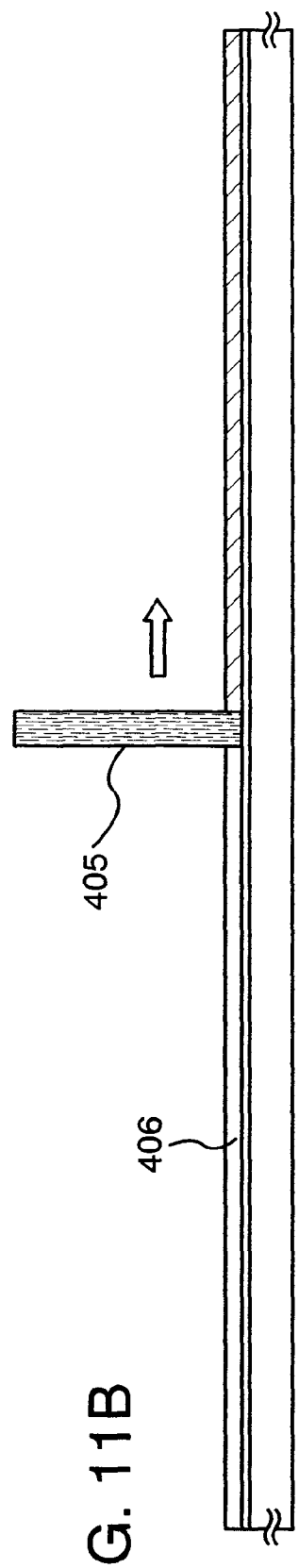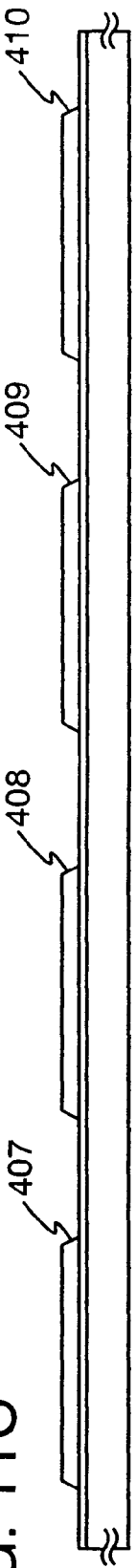

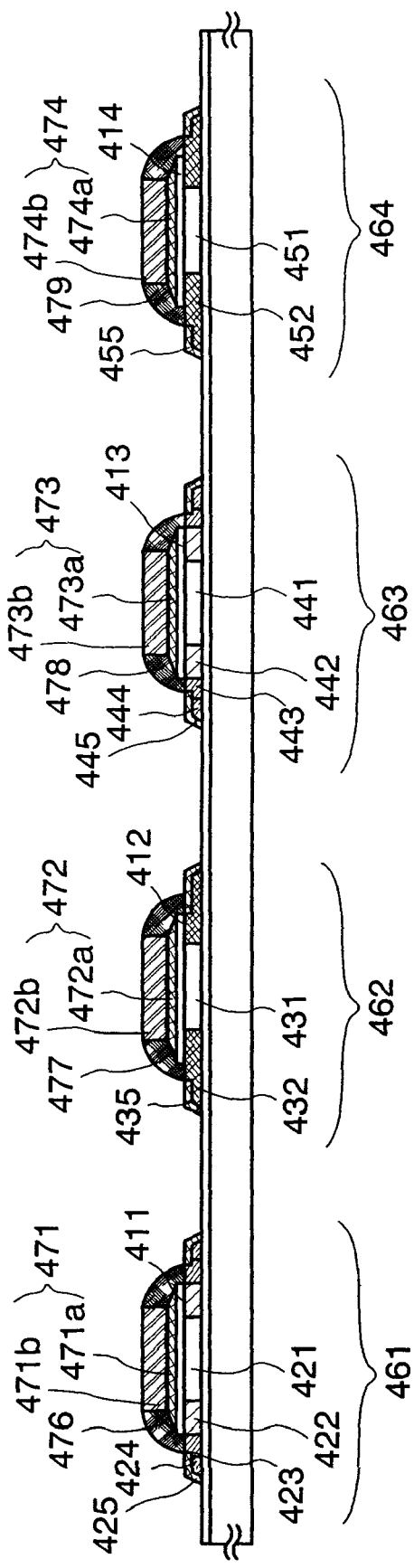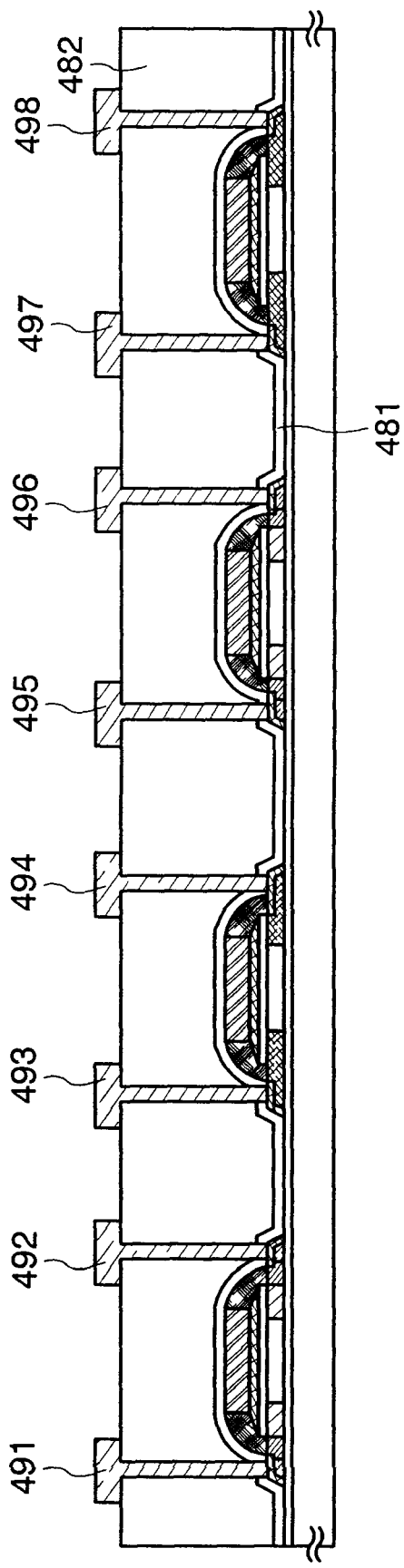

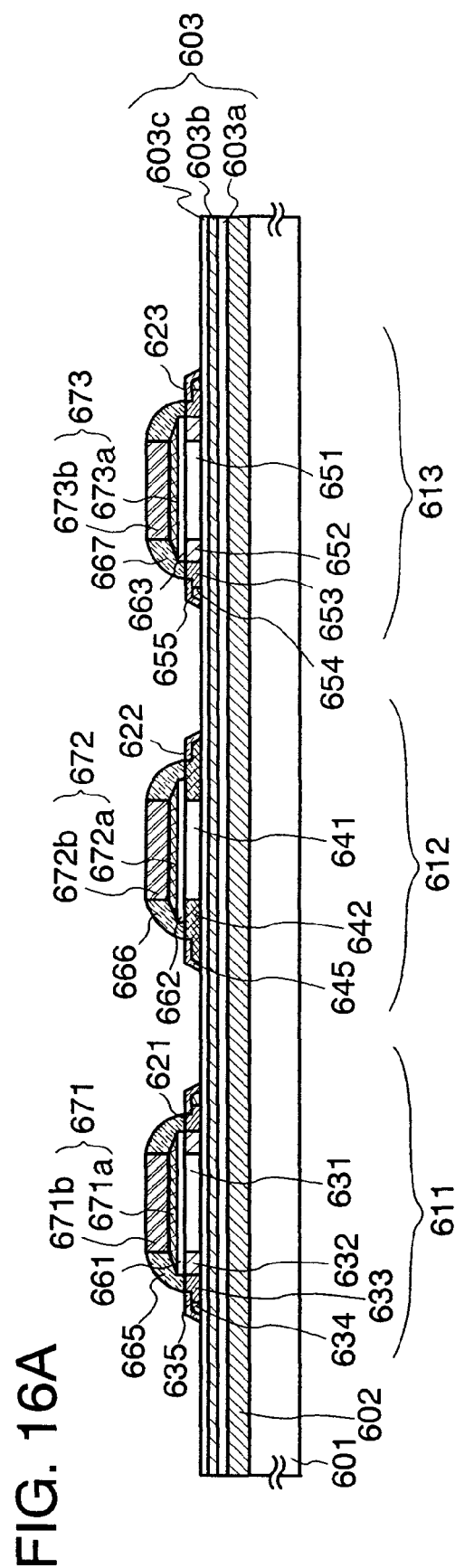
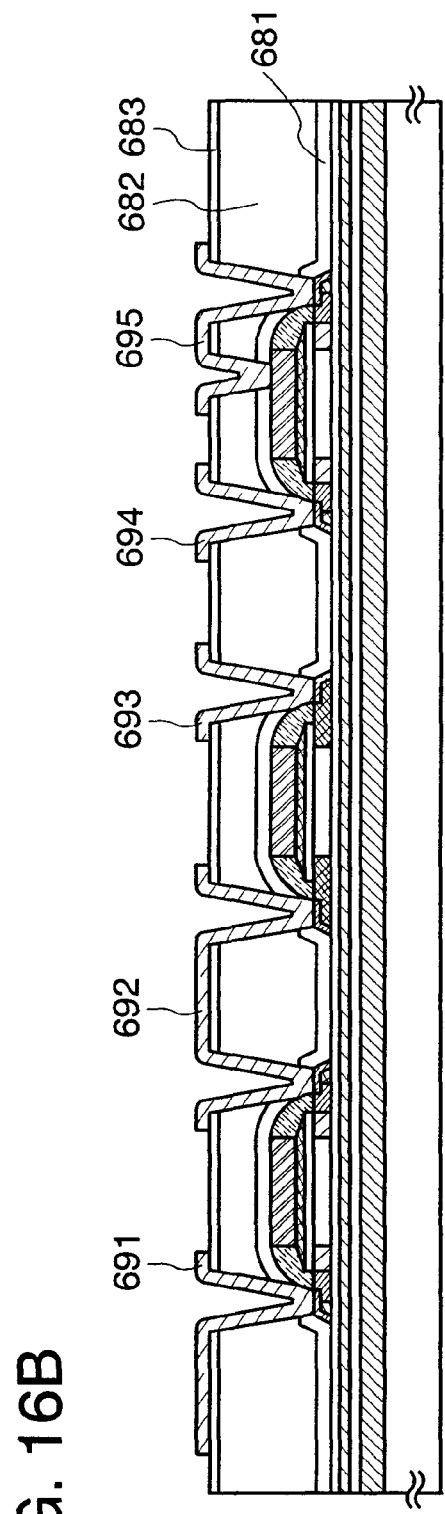

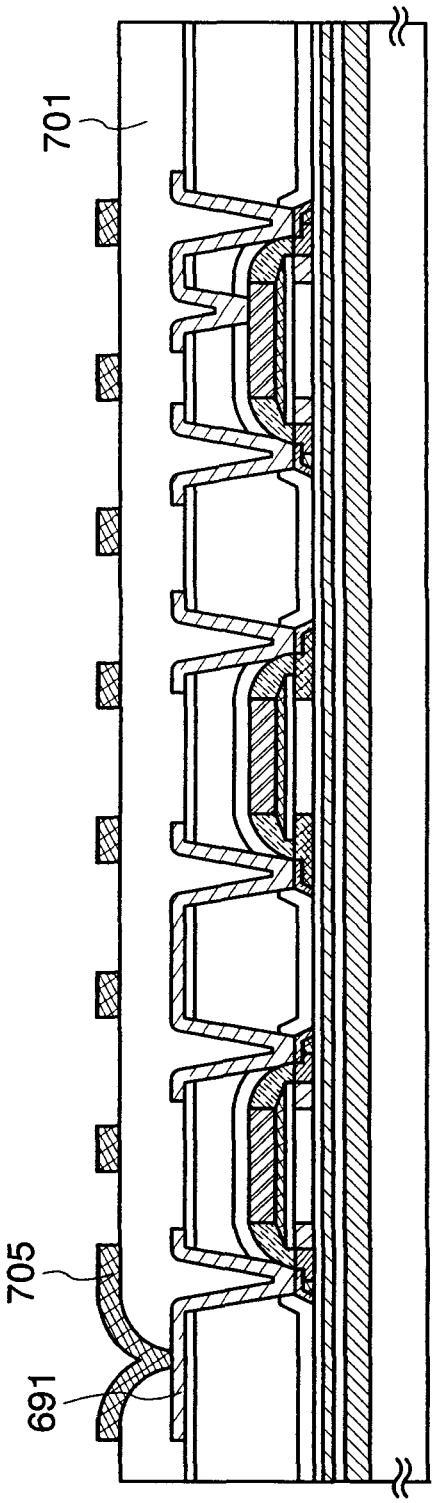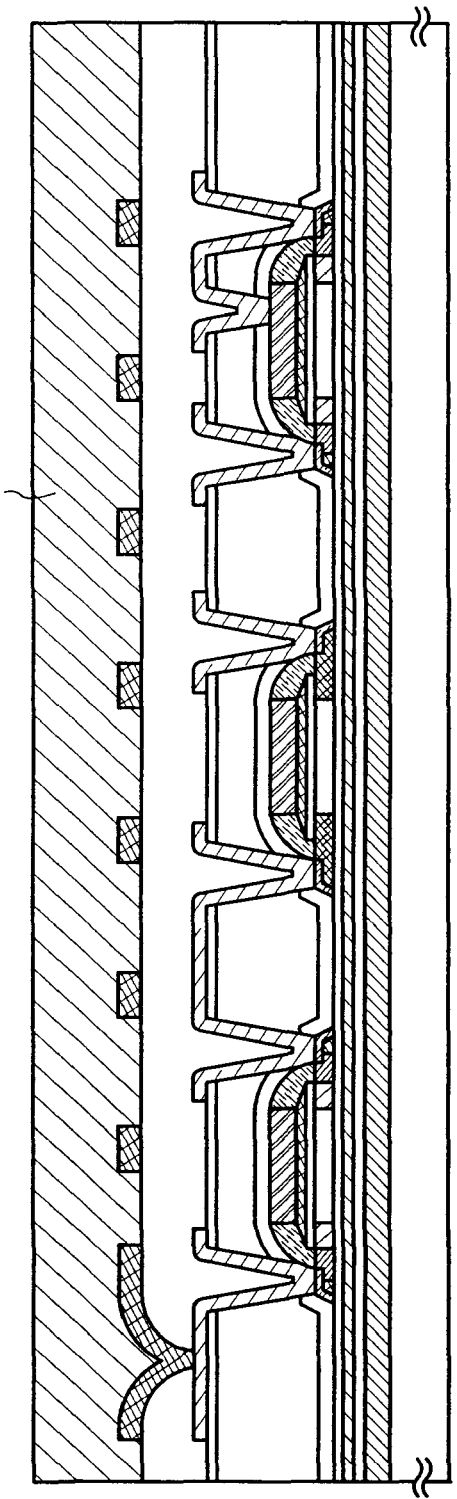
FIG. 17A
FIG. 17B

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

In recent years, the technique for manufacturing a semiconductor device such as a thin film transistor (hereinafter referred to as a TFT) over a substrate has advanced drastically, and has been developed to be applied to an active-matrix display device for example. In particular, a TFT using a crystalline semiconductor film can operate at high speed since the TFT has higher field-effect mobility (also referred to as mobility) than a TFT using a conventional amorphous semiconductor film.

As an example of forming a TFT over a substrate, there is one in which a base film, an active layer, a gate insulating film, a gate electrode, an interlayer insulating film, and a source or drain electrode are formed in this order. In order to further increase response speed of this TFT, decreasing contact resistance with the source or drain electrode by forming silicide in a source or drain region of the active layer can be considered other than shrinking a design rule.

In order to form such silicide, titanium (Ti), nickel (Ni), cobalt (Co), tungsten (W), platinum (Pt), or the like is generally used (refer to patent document 1: Japanese Published Patent Application No. H10-98199).

SUMMARY OF THE INVENTION

A process of manufacturing a TFT includes the following stapes: a step of carrying out silicide formation after adding an element imparting one conductivity type to an active layer and then forming a metal film; a step of forming an interlayer insulating film; and a step of forming a source or drain electrode.

In the step of forming the source or drain electrode, a step in which a contact hole is formed in the interlayer insulating film and then an oxide film on a silicide surface is removed with hydrofluoric acid so that electrical resistance with silicide is small, is included.

It is found that when this step of removing the oxide film on the silicide surface is carried out, there is a possibility that silicide is lost by hydrofluoric acid or the like. Specifically, it is found that when removal of the oxide film (mainly silicon oxide) on the silicide surface is carried out by etching after adding an element imparting n-type conductivity and then forming silicide, silicide just in a bottom portion of the contact hole is lost.

With that, an object of the present invention is to make favorable electrical contact between the source or drain electrode and the silicide without losing the silicide in the bottom portion of the contact hole.

A feature of the present invention is to prevent loss of silicide by not adding an element imparting n-type conductivity to a region of an active layer that is exposed by a contact hole in an interlayer insulating layer.

One feature of the present invention is a semiconductor device including over a substrate an island-shaped semiconductor film; a channel forming region, a source or drain region, a connection region containing an impurity imparting one conductivity type at a lower concentration than the source or drain region, and a silicide region formed in a vicinity of a surface of a portion in the source or drain region and a vicinity of a surface of the connection region, which are included in the island-shaped semiconductor film; a gate insulating film over the island-shaped semiconductor film; a gate electrode over the gate insulating film; a sidewall formed over side surfaces of the gate insulating film and the gate electrode; an interlayer insulating film covering the island-shaped semiconductor film, the gate insulating film, the gate electrode, and the sidewall; and a source or drain electrode that is formed over the interlayer insulating film and is electrically connected to the silicide region in the vicinity of the surface of the connection region via a contact hole formed in the interlayer insulating film.

Another feature of the present invention is a semiconductor device including over a substrate a first island-shaped semiconductor film and a second island-shaped semiconductor film; a first channel forming region, first source or drain regions containing an impurity imparting n-type conductivity, connection regions containing the impurity at a lower concentration than the first source or drain regions, and a first silicide region formed in a portion of a vicinity of a surface of each of the first source or drain regions and in a vicinity of a surface of each of the connection regions, which are included in the first island-shaped semiconductor film; a first gate insulating film over the first island-shaped semiconductor film; a first gate electrode over the first gate insulating film; a first sidewall formed over side surfaces of the first gate insulating film and the first gate electrode; a second channel forming region, second source or drain regions containing an impurity imparting p-type conductivity, and a second silicide region formed in a portion of a vicinity of a surface of each of the second source or drain regions, which are included in the second island-shaped semiconductor film; a second gate insulating film over the second island-shaped semiconductor film; a second gate electrode over the second gate insulating film; a second sidewall formed over side surfaces of the second gate insulating film and the second gate electrode; an interlayer insulating film covering the first and second island-shaped semiconductor films, the first and second gate insulating films, the first and second gate electrodes, and the first and second sidewalls; a first electrode that is formed over the interlayer insulating film and is electrically connected to one the first silicide regions in the vicinity of the surface of the connection regions, via a contact hole formed in the interlayer insulating film; a second electrode that is formed over the interlayer insulating film and is electrically connected to one of the second silicide regions formed in the portion of the vicinity of one of the second source or drain regions, via a contact hole formed in the interlayer insulating film; and a third electrode that is formed over the interlayer insulating film and is electrically connected to the other second silicide region formed in the portion of the vicinity of the surface of the other second source or drain region while being electrically connected to the first silicide region, that is different from that of the first electrode, in the vicinity of the surface of the connection region via a contact hole formed in the interlayer insulating film.

In the present invention, the silicide region includes a silicide of titanium (Ti), nickel (Ni), cobalt (Co), tungsten (W), or platinum (Pt).

Yet another feature of the present invention is a manufacturing method of a semiconductor device in which a base film is formed over a substrate; an island-shaped semiconductor film is formed over the base film; a gate insulating film is formed over the island-shaped semiconductor film; a gate electrode is formed over the gate insulating film; a resist is formed over a portion of the island-shaped semiconductor film; an element imparting one conductivity type is introduced into the island-shaped semiconductor film with the resist as a mask; a channel forming region and a source or drain region are formed in the island-shaped semiconductor film and a connection region is formed in a portion of the island-shaped semiconductor film over which the resist is formed, by the introduction of the element; a sidewall is formed over a side surface of the gate insulating film and the gate electrode; a metal film is formed covering the island-shaped semiconductor film and the sidewall; a silicide region is formed in a vicinity of a surface of a portion of the source or drain region and a vicinity of a surface of the connection region; an interlayer insulating film is formed covering the island-shaped semiconductor film, the gate insulating film, the gate electrode, and the sidewall; a contact hole is formed in the interlayer insulating film that reaches the silicide region in the vicinity of the surface of the connection region; and a source or drain electrode is formed that is electrically connected to the silicide region in the vicinity of the surface of the connection region via the contact hole.

In the present invention, the metal film is made of any one of titanium (Ti), nickel (Ni), cobalt (Co), tungsten (W), and platinum (Pt).

In the present invention, the element imparting one conductivity type is an element imparting n-type conductivity.

Note that in this specification, a semiconductor device refers to elements and devices in general which function by utilizing a semiconductor. An electro-optical device including a liquid crystal display device or the like and an electronic appliance mounted with the elector-optic device are included in the category of semiconductor devices.

According to the present invention, loss of silicide due to etching can be prevented, and electrical contact between a source or drain electrode and silicide can be made to be favorable.

Also, a semiconductor device manufactured according to the present invention can have high driving speed and reliability.

The present invention can be applied to a semiconductor device including a TFT. A TFT of the present invention can prevent loss of silicide due to etching, and can make electrical contact between a source or drain electrode and the silicide to be favorable.

Further, a semiconductor device manufactured according to the present invention can have high driving speed as well as high reliability.

BRIEF DESCRIPTION OF DRAWINGS

FIGS. 3A to 3D each show a manufacturing step of a semiconductor device of the present invention;

FIGS. 11A to 11C each show a manufacturing step of a CPU of the present invention;

FIGS. 12A and 12B each show a manufacturing step of a CPU of the present invention;

FIGS. 16A and 16B each show a manufacturing step of an ID chip of the present invention;

FIGS. 17A and 17B each show a manufacturing step of an ID chip of the present invention;

DETAILED DESCRIPTION OF THE INVENTION

Embodiment Mode 1

Figure 1:
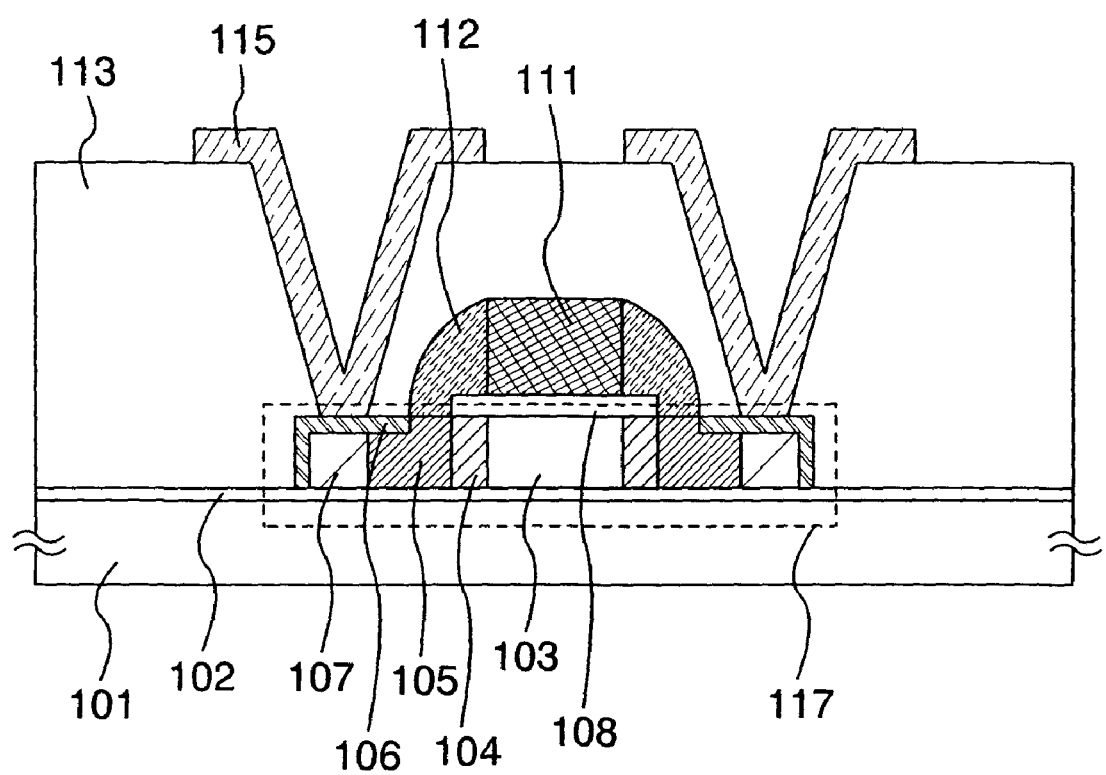
FIG. 1 shows a semiconductor device of the present invention.

In this embodiment mode, a semiconductor device of the present invention is described with reference to FIGS. 1 to 5B.

However, the present invention is not limited to the description below, and it is easily understood by those skilled in the art that modes and details herein disclosed can be modified in various ways without departing from the spirit and the scope of the present invention. Therefore, the present invention should not be interpreted as being limited to the description of the embodiment modes to be given below. Note that in the structure of the present invention described hereinafter, reference numerals denoting the same portions are used in common in the drawings.

FIG. 1 shows a structure of a thin film transistor of this embodiment mode. A base film 102 is formed over a substrate 101, and an island-shaped semiconductor film 117 which is an active layer is formed over the base film 102.

In the island-shaped semiconductor film 117, a channel forming region 103, low-concentration impurity regions (also called an LDD (Lightly Doped Drain) region) 104, source or drain regions 105 which are high-concentration impurity regions, and connection regions 107 to which an element having one conductivity type, which in this embodiment mode is an impurity imparting n-type conductivity, is not added, are included. Note that the low-concentration impurity regions 104 are not provided if it is unnecessary.

However, if necessary, an element having one conductivity type may also be included in the connection regions 107 in an amount with which silicide is not lost. That is, each of the connection regions 107 has silicide formed over a surface thereof, and includes an impurity imparting one conductivity type at a lower concentration than the source or drain region.

A gate insulating film 108 is provided over the island-shaped semiconductor film 117, and a gate electrode 111 is formed over the gate insulating film 108. Over a side portion of the gate electrode 111, a sidewall 112 made from an insulating film is formed.

A silicide region 106 is formed in a vicinity of a surface of a portion of each of the source or drain regions 105 and a vicinity of a surface of each the connection regions 107 of the island-shaped semiconductor film 117. One end portion of the silicide region 106 may be aligned with an end portion of the sidewall 112.

An example of a manufacturing method of the semiconductor device in FIG. 1 is described below.

Figure 2A:
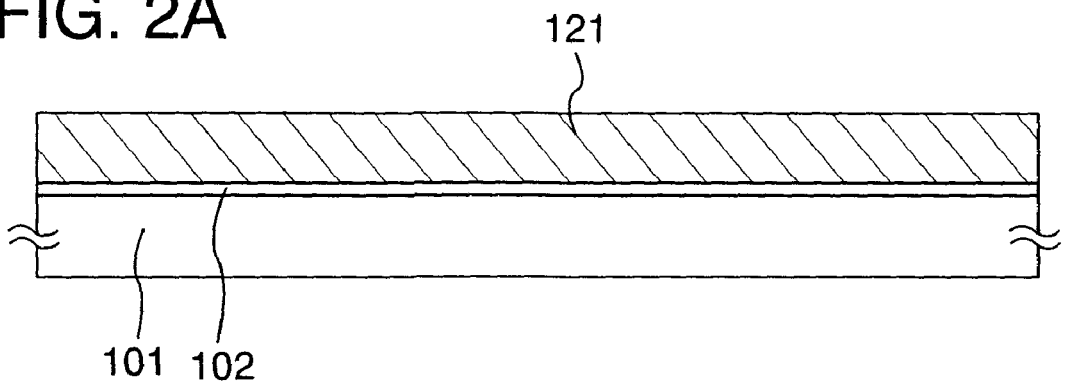
FIGS. 2A to 2C each show a manufacturing step of a semiconductor device of the present invention.

First, as show in FIG. 2A, the base film 102 is formed over the substrate 101. As the substrate 101, a glass substrate of barium borosilicate glass, alumino borosilicate glass, or the like, a quartz substrate, a stainless steel substrate, or the like can be used. Also, a substrate made of a synthetic resin having flexibility such as acrylic or plastic represented by polyethylene terephthalate (PET), a polyethylene naphthalate (PEN), and a polyethersulfone (PES) can be also used.

The base film 102 is provided to prevent an alkali metal such as Na or an alkaline earth metal contained in the substrate 101 from diffusing into a semiconductor film and having an adverse effect on a characteristic of a semiconductor element. Therefore, the base film 102 is formed using an insulating film of silicon nitride, silicon oxide containing nitrogen, or the like which can suppress diffusion of the alkali metal or alkaline earth metal into the semiconductor film. In this embodiment mode, the base film 102 is formed using a plasma CVD method by stacking a silicon oxide film and a silicon oxide film containing nitrogen so that thicknesses thereof are 10 to 100 nm (preferably 20 to 70 nm, more preferably 50 nm) and 10 to 400 nm (preferably 50 to 300 nm, more preferably 100 nm), respectively.

Note that the base film 102 may be a single layer of an insulating film made of silicon nitride, silicon oxide containing nitrogen, silicon nitride containing oxygen, or a stack of layers of a plurality of insulating films of silicon oxide, silicon nitride, silicon oxide containing nitrogen, silicon nitride containing oxygen, or the like. Further, in a case of using a substrate containing an alkali metal or alkaline earth metal in any amount, it is effective to provide a base film in terms of preventing diffusion of an impurity; however, if diffusion of an impurity is not much of a problem as in a case of using a quartz substrate, it is not always necessary to provide a base film.

Next, a semiconductor film 121 is formed over the base film 102. A thickness of the semiconductor film 121 is to be 25 to 100 nm (preferably, 30 to 80 nm). Note that the semiconductor film 121 may be an amorphous semiconductor, or a polycrystalline semiconductor. Also, silicon germanium (SiGe) can be used as well as silicon (Si) as a semiconductor. In a case of using silicon germanium, a concentration of germanium is preferably about 0.01 to 4.5 atomic %. In this embodiment mode, an amorphous silicon film is formed to have a thickness of 66 nm as the semiconductor film 121.

Figure 2B:
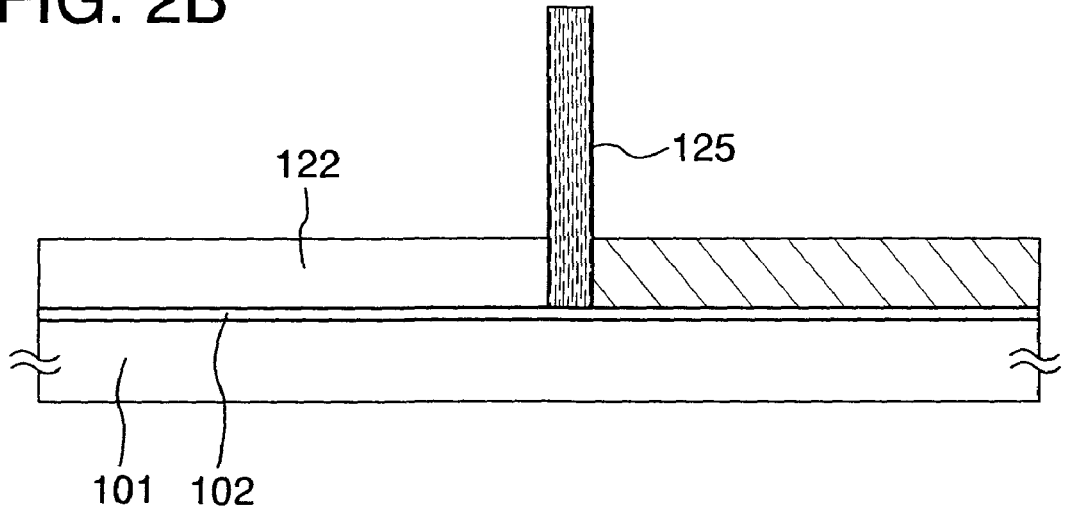

Subsequently, a linear beam 125 is emitted to the semiconductor film 121 from a laser irradiation apparatus to carry out crystallization, as shown in FIG. 2B.

In the case of carrying out laser crystallization, the semiconductor film 121 may be subjected to a heating treatment at 500° C. for one hour before laser crystallization, in order to increase resistance of the semiconductor film 121 against a laser beam.

For the laser crystallization, a continuous wave laser or a pulsed laser with an oscillation frequency of 10 MHz or more, preferably 80 MHz or more as a pseudo CW laser can be used.

Specifically, the following and the like can be given as examples of the continuous wave laser: an Ar laser, a Kr laser, a $CO_2$ laser, a YAG laser, a $YVO_4$ laser, a forsterite ($Mg_2SiO_4$) laser, a YLF laser, a $YAlO_3$ laser, a $GdVO_4$ laser, a $Y_2O_3$ laser, an alexandrite laser, a Ti:sapphire laser, a helium cadmium laser, and a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Also, as the pseudo CW laser, a pulsed laser such as the following can be used if pulse oscillation at an oscillation frequency of 10 MHz or more, preferably 80 MHz or more, is possible: an Ar laser, a Kr laser, an excimer laser, a $CO_2$ laser, a YAG laser, a $Y_2O_3$ laser, a $YVO_4$ laser, a forsterite ($Mg_2SiO_4$) laser, a YLF laser, $YAlO_3$ laser, a $GdVO_4$ laser, an alexandrite laser, a Ti:sapphire laser, a copper vapor laser, a gold vapor laser, or a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Such a pulsed laser eventually exhibits an effect equivalent to that of a continuous wave laser when oscillation frequency is increased.

For example, in a case of using a solid-state laser capable of continuous oscillation, a crystal with a large grain diameter can be obtained by irradiation with laser light of a second harmonic to a fourth harmonic. Typically, it is desirable to use the second harmonic (532 nm) or a third harmonic (355 nm) of the YAG laser (fundamental wave of 1064 nm). For example, laser light emitted from a continuous wave YAG laser is converted to a high harmonic by a nonlinear optical element, and emitted to the semiconductor film 121. A power density may be about 0.01 to 100 $MW/cm^2$ (preferably 0.1 to 10 $MW/cm^2$). Then, irradiation is carried out with a scanning speed of about 10 to 2000 cm/sec.

Note that a laser of which a medium is a monocrystalline YAG, $YVO_4$, forsterite ($Mg_2SiO_4$), $YAlO_3$, or $GdVO_4$ doped with one or more of Nd, Yb, Cr, Ti, Ho, Er, Tm, and Ta as a dopant, or a polycrystalline (ceramic) YAG, $Y_2O_3$, $YVO_4$, $YAlO_3$, or $GdVO_4$, doped with one or more of Nd, Yb, Cr, Ti, Ho, Er, Tm, and Ta as a dopant; an Ar laser; a Kr laser; or a Ti:sapphire laser is capable of continuous oscillation, and also capable of pulse oscillation by carrying out a Q switch operation, mode-locking, or the like. When a laser beam is oscillated at an oscillation frequency of 10 MHz or more, the semiconductor film is irradiated with a subsequent pulse while the semiconductor film is melted by a preceding laser and then solidified. Consequently, since a solid-liquid interface in the semiconductor film can be moved continuously unlike in a case of using a pulsed laser with low oscillation frequency, crystal grains that continuously grow towards a scanning direction can be obtained.

When ceramics (polycrystals) are used for a medium, the medium can be formed into a free shape in a short amount of time and at low cost. When monocrystals are used, a column-shaped medium with several mm in diameter and several ten mm long is usually used, but a larger medium can be formed when ceramic is used.

Since a concentration of a dopant such as Nd or Yb in the medium which directly contributes to light emission cannot be changed significantly in either monocrystals or polycrystals, improvement in laser output by increasing the concentration is limited to a certain extent. However, in the case of ceramics, there is a possibility that output can be drastically improved since the size of the medium can be significantly increased compared to monocrystals.

Further, in the case of ceramics, a medium having a parallelepiped shape or a rectangular parallelepiped shape can be easily formed. When a medium having such a shape is used and oscillation light goes in zigzag in the medium, an oscillation light path can be longer. Accordingly, amplification is increased and oscillation with high output is possible. Since a laser beam emitted from the medium having such a shape has a cross section of a quadrangular shape when being emitted, a linear beam can be easily shaped compared with the case of a circular beam. The laser beam emitted in such a manner is shaped by using an optical system; accordingly, a linear beam having a short side of less than or equal to 1 mm and a long side of several mm to several m can be easily obtained. In addition, by uniformly irradiating the medium with excited light, a linear beam has a uniform energy distribution in a long side direction.

By irradiation of the semiconductor film with this linear beam, the entire surface of the semiconductor film can be annealed more uniformly. In the case where uniform annealing is required from one end to the other end of the linear beam, slits may be provided for the ends so as to shield a portion where energy is attenuated from light.

By irradiating the semiconductor film 121 with laser light as mentioned above, a crystalline semiconductor film 112 with improved crystallinity is formed.

Figure 2C:
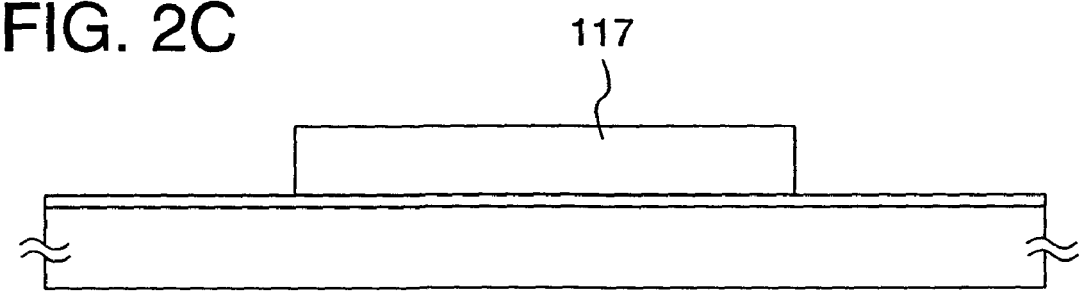

Next, as shown in FIG. 2C, the crystalline semiconductor film 122 is used to form the island-shaped semiconductor film 117. This island-shaped semiconductor film 117 serves as an active layer of a TFT to be formed in a subsequent process.

Subsequently, an impurity is introduced into the island-shaped semiconductor film for controlling threshold voltage. In this embodiment mode, boron (B) is introduced into the island-shaped semiconductor film by doping with diborane ($B_2H_6$).

Next, the gate insulating film 108 is formed over the island-shaped semiconductor film 117. For the gate insulating film 108, silicon oxide, silicon nitride, silicon oxide containing nitrogen, or the like with a film thickness of 10 to 110 nm can be used. Also, as a film formation method, a plasma CVD method, a sputtering method, or the like can be used. In this embodiment mode, the gate insulating film 108 is formed using a silicon oxide film containing nitrogen that is formed by a plasma CVD method to have a film thickness of 20 nm.

Subsequently, after forming a conductive film over the gate insulating film 108, the gate electrode 111 is formed using the conductive film (see FIG. 3A).

The gate electrode 111 is formed to have a structure with a single layer of a conductive film, or a structure in which two or more layers of conductive films are stacked. In the case where two or more conductive films are stacked, the gate electrode 111 may be formed by stacking layers of an element selected from tantalum (Ta), tungsten (W), titanium (Ti), molybdenum (Mo), or aluminum (Al); or an alloy material or compound material mainly containing the element. Alternatively, the gate electrode may be formed using a semiconductor film typified by a polycrystalline silicon film doped with an impurity element such as phosphorus (P). In this embodiment mode, the gate electrode 111 is formed using a tungsten film that is formed to have a thickness of 400 nm.

The gate electrode 111 may be formed as a portion of a gate wiring. Alternatively, a gate wiring may be separately formed, and then the gate electrode 111 may be connected to the gate wiring.

Next, a resist 127 is formed over a region of the island-shaped semiconductor film 117 which later becomes the connection regions 107. With this, it is made so that an element imparting one conductivity type is not added to the connection regions 107.

Then, using the gate electrode 111, the gate insulating film 108, and the resist 127 as masks, the impurity imparting one conductivity type is added to the island-shaped semiconductor film 117, and a source region, a drain region, a low-concentration impurity region, and the like are formed.

As the impurity imparting one conductivity type, phosphorus (P) or arsenic (As) may be used if it is an impurity imparting n-type conductivity. If it is an impurity imparting p-type conductivity, boron (B) may be used. In this embodiment mode, first, as a first adding step, phosphorus (P) is introduced into the island-shaped semiconductor film 117 using phosphine ($PH_3$), with an application voltage of 40 to 120 keV, and a dose amount of $1 \times 10^{13}$ to $1 \times 10^{15}$ cm$^{-2}$. In this embodiment mode, phosphorus is added into the island-shaped semiconductor film 117 using phosphine, with an application voltage of 60 keV and a dose amount $2.6 \times 10^{-13}$ cm$^{-2}$. At the time of this introduction of an impurity, the channel forming region 103 is formed.

Further, as a second adding step, phosphorus (P) is introduced into the island-shaped semiconductor film 117 using phosphine ($PH_3$), with an application voltage of 10 to 50 keV, for example 20 keV, and a dose amount of $5.0 \times 10^{14}$ to $2.5 \times 10^{16}$ cm$^{-2}$, for example $3.0 \times 10^{15}$ cm$^{-2}$. Accordingly, the low-concentration impurity regions 104 and the source or drain regions 105 are formed. Further, region covered by the resist 127 becomes the connection regions 107 to which the element imparting one conductivity type is not added. Also, the resist 127 is removed (see FIG. 3C).

A border between the low-concentration impurity regions 104 and the source or drain regions 105 is aligned with an end portion of the gate insulating film 108. That is, one end portion of the low-concentration impurity regions 104, one end portion of the source or drain regions 105, and the end portion of the gate insulating film are aligned with each other.

In this embodiment mode, the source or drain regions 105 of a TFT includes phosphorus (P) at a concentration of $1 \times 10^{19}$ to $5 \times 10^{21}$ cm$^{-3}$. Also, in the low-concentration impurity regions 104 of the TFT, phosphorus (P) is included at a concentration of $1 \times 10^{18}$ to $5 \times 10^{19}$ cm$^{-3}$.

However, the first adding step may be carried out in a state before forming the resist 127 shown in FIG. 3B. Consequently, an impurity concentration of the low-concentration impurity regions 104 is determined. The resist 127 may be subsequently formed, and the second adding step may be carried out. Consequently, an impurity concentration of the source or drain regions 105 is determined. When such adding steps are carried out, the connection regions 107 also include the impurity element imparting one conductivity type. In this case, it is necessary to control dose amount and application voltage in the first adding step so that the impurity concentration in the connection regions 107 is at a level at which silicide that is formed in a later step is not lost.

Subsequently, an insulating film, that is, the sidewall 112 is formed so as to cover side surfaces of the gate electrode 111 and the gate insulating film 108, as show in FIG. 3D.

The sidewall 112 can be formed from an insulating film including silicon by using a plasma CVD method or a low pressure CVD (LPCVD) method. In this embodiment mode, a taper-form sidewall 112 is formed by forming a silicon oxide film with a film thickness of 50 to 200 nm, preferably 100 nm, and then etching the silicon oxide film, by a plasma CVD method. Alternatively, the sidewall 112 may be formed using a silicon oxide film containing nitrogen.

Also, the sidewall 112 does not necessarily have to have a taper form, and it may have a rectangular form.

By forming the sidewall 112, short-circuiting between the gate electrode 111 and the source or drain regions 105 can be prevented.

Figure 4A:
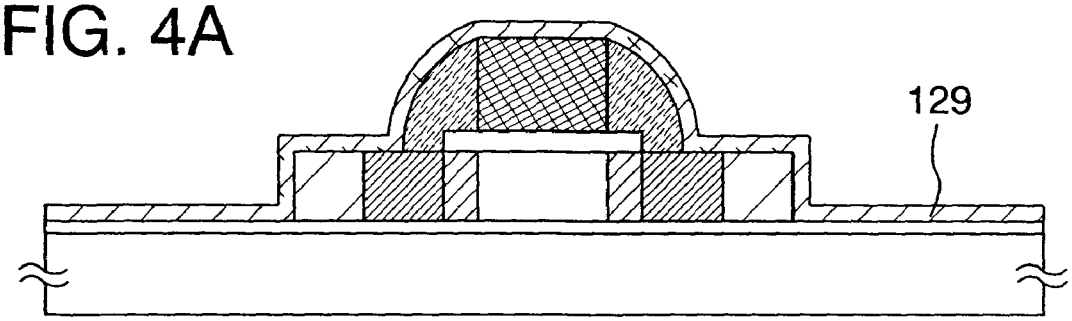
FIGS. 4A to 4C each show a manufacturing step of a semiconductor device of the present invention.
Figure 4B:
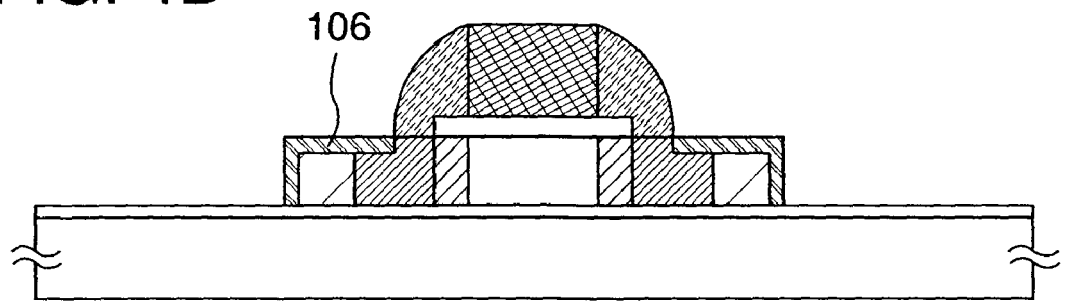

Next, a metal film 129 is formed so as to cover the island-shaped semiconductor film 117, the gate insulating film 108, the gate electrode 111, and the sidewall 112 (see FIG. 4A).

For the metal film 129, titanium (Ti), nickel (Ni), cobalt (Co), tungsten (W), platinum (Pt), or the like can be used. In this embodiment mode, a nickel film is formed to have a thickness of 10 nm as the metal film 129.

Subsequently, the island-shaped semiconductor film 117, over which the metal film 129 is formed, is heated by applying a thermal annealing method using an annealing furnace, a laser annealing method, or a rapid thermal annealing method (RTA method). Consequently, the silicide regions 106 are formed in the island-shaped semiconductor film 117. In particular, each of the silicide regions 106 is formed in a vicinity of a surface of an exposed region of the island-shaped semiconductor film 117, which is not covered with the sidewall 112, the gate electrode 111, and the gate insulating film 108. In this embodiment mode, the silicide regions 106 are formed by a rapid thermal annealing method by heating at a temperature of 350° C. or higher.

After the silicide regions 106 are formed, the metal film 129 that is unreacted is etched and removed with a chemical solution of sulfuric acid, nitric acid, or the like.

Figure 4C:
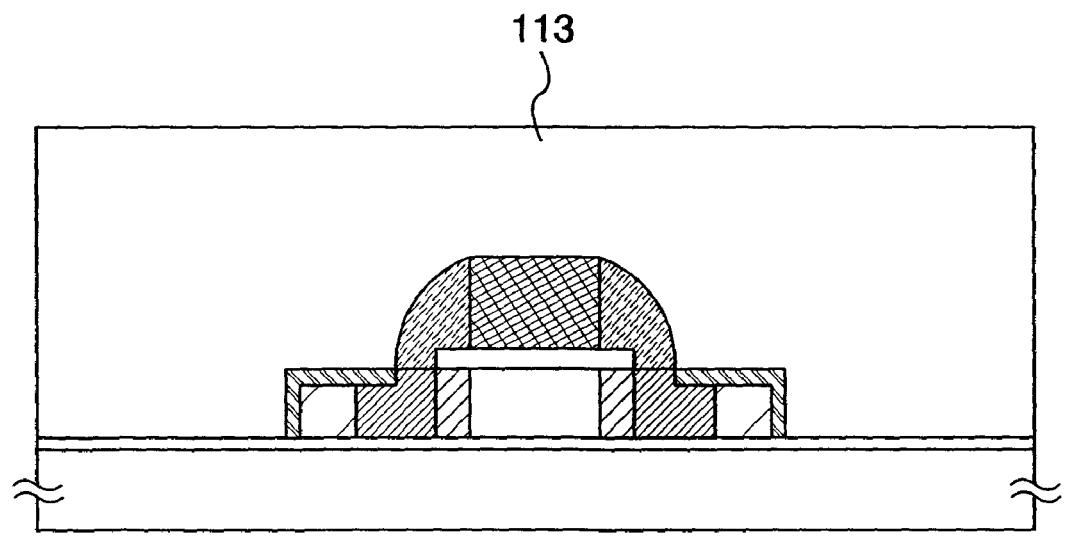

Next, the interlayer insulating film 113 is formed so as to cover the island-shaped semiconductor film 117, the gate insulating film 108, the gate electrode 111, and the sidewall 112 (see FIG. 4C).

As the interlayer insulating film 113, an insulating film containing silicon, for example a silicon oxide film, a silicon nitride film, or a silicon oxide film containing nitrogen, or stacked films thereof are formed using a plasma CVD method or a sputtering method. Of course, the interlayer insulating film 113 is not limited to the silicon oxide film containing nitrogen, the silicon nitride film, or the stacked film thereof, and other insulating film containing silicon may be used as a single layer or stacked-layer structure.

In this embodiment mode, a silicon oxide film containing nitrogen is formed to have a thickness of 50 nm by a plasma CVD method, and an impurity is activated by a laser irradiation method. Alternatively, after forming the silicon oxide film containing nitrogen, the impurity may be activated by heating in a nitrogen atmosphere at 550° C. for four hours.

Next, a silicon nitride film is formed to have a thickness of 100 nm by a plasma CVD method, and a silicon oxide film is additionally formed to have a thickness of 600 nm. These stacked layers of the silicon oxide film containing nitrogen, the silicon nitride film containing oxygen, and the silicon oxide film are the interlayer insulating film 113.

Subsequently, the entire substrate is heated at 410° C. for one hour, and hydrogenation is carried out by releasing hydrogen from the silicon nitride film.

Contact holes 131 that reach the island-shaped semiconductor film 117 are formed in the interlayer insulating film 113 by etching the interlayer insulating film 113. At that time, etching is carried out so that the contact holes 131 reach only the connection regions 107, and so that the source or drain regions 105 are not exposed. That is, when etching the interlayer insulating film 113, a resist is formed over the interlayer insulating film 113 so that the contact holes 131 are formed only over the connection regions 107.

Next, in order to remove an oxide film (mainly including silicon oxide) on surfaces of the connection regions 107, the surfaces of the connection regions 107 are washed with hydrofluoric acid, or the substrate is placed in a hydrogen plasma atmosphere and a plasma treatment is carried out on the surfaces of the connection regions 107. In the present invention, this removal of an oxide film is only carried out on the connection regions 107. Since the source or drain regions 105 are covered by the interlayer insulating film 113, the silicide regions in the source or drain regions 105 are not removed. Consequently, electrical contact between source or drain electrodes 115 and the island-shaped semiconductor film 117 can be made to be favorable.

Figure 5A:
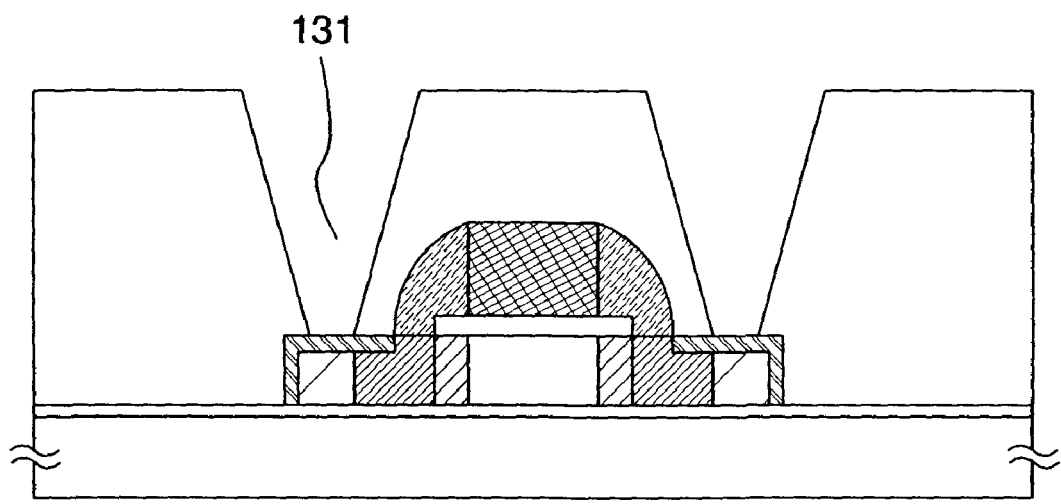
FIGS. 5A and 5B each show a manufacturing step of a semiconductor device of the present invention.
Figure 5B:
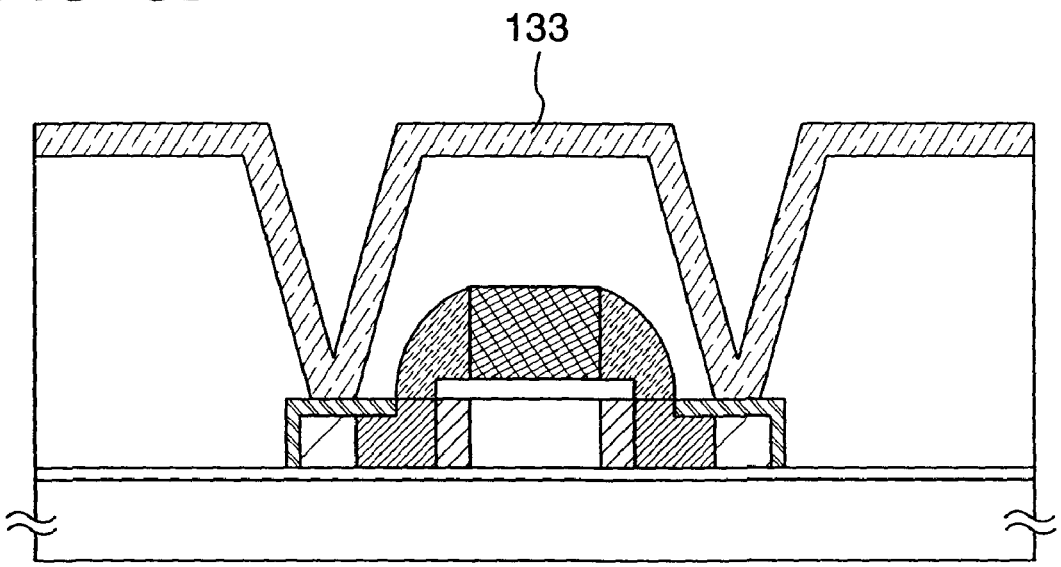

Next, a conductive film 133 is formed over the interlayer insulating film 113 via the contact holes 131 (see FIG. 5B). The source or drain electrodes 115 are formed using the conductive film 133 (see FIG. 1). The source or drain electrodes 115 are electrically connected to the silicide regions in the connection regions 107.

In this embodiment mode, a metal film is used for the conductive film 133. This metal film may be formed using a film made of the following element: aluminum (Al), titanium (Ti), molybdenum (Mo), tungsten (W), or silicon (Si). Alternatively, the metal film may be formed using an alloy film using the element.

In this embodiment mode, the source or drain electrodes 115 are formed using stacked layers of a titanium film (Ti), an aluminum film (Al), and a titanium film (Ti), formed to have thicknesses of 100 nm, 300 nm, and 100 nm, respectively.

Also, these source or drain electrodes 115 may be formed of an aluminum alloy film containing carbon and at least one type of element selected from nickel, cobalt, and iron. With such an aluminum alloy film, even if they come into contact with silicon, interdiffusion of silicon and aluminum can be prevented. Also, with such an aluminum alloy film, an oxidation-reduction reaction does not occur even if it comes into contact with a transparent conductive film, for example an ITO (Indium Tin Oxide) film, and they can be in direct contact with each other. Further, such an aluminum alloy film has low resistivity and excellent heat resistance; therefore, it is useful as a wiring material.

Further, for each of the source or drain electrodes 115, the electrode and a wiring may be formed with the same material in one step, or the electrode and the wiring may be formed separately and then connected.

Through the series of steps mentioned above, the semiconductor device of this embodiment mode can be manufactured. In this embodiment mode, when the element imparting n-type conductivity is added, the regions in the island-shaped semiconductor film 117 over which the contact holes 131 are formed is masked by a resist, and in the regions over which the contact holes 131 are formed, the element imparting n-type conductivity is not introduced. Consequently, silicide regions can be formed in the source or drain regions 105 while forming an n-type conductivity semiconductor film, and can be connected to the source or drain electrodes 115.

Also, if necessary, this embodiment mode can be freely combined with any part of the description of other embodiment modes and embodiments.

Embodiment Mode 2

In this embodiment mode, a semiconductor device having a different structure from that of Embodiment Mode 1 is described with reference to FIG. 6, Note that in this embodiment mode, same portions as those in Embodiment Mode 1 are denoted by the same reference numerals, and descriptions in Embodiment Mode 1 are referred to for those without particular descriptions.

Figure 6:
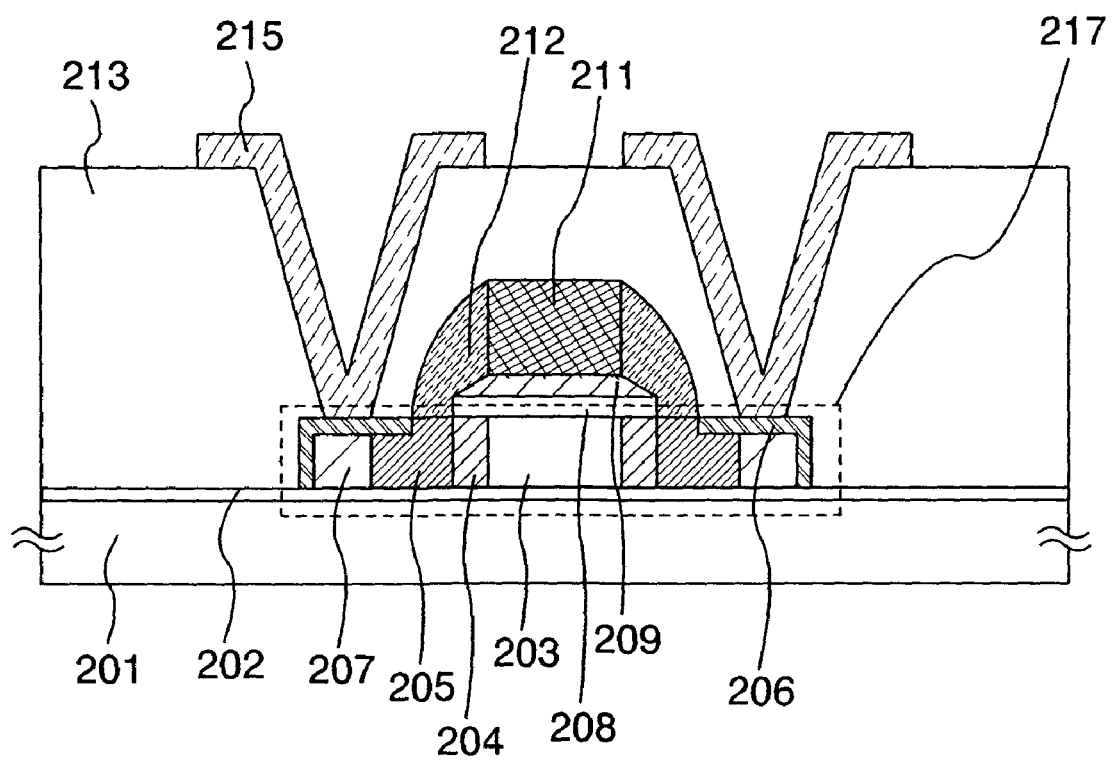
FIG. 6 shows a semiconductor device of the present invention.

In a semiconductor device shown in FIG. 6, a base film 202 is formed over a substrate 201, and an island-shaped semiconductor film 217 that is an active layer is formed over the base film 202.

In the island-shaped semiconductor film 217, a channel forming region 203, low-concentration impurity regions 204, source or drain regions 205, and connection regions 207 are formed. Also, a silicide region 206 is formed in a vicinity of a portion of each of the source or drain regions 205 and a vicinity of a surface of each of the connection regions 207.

Over the island-shaped semiconductor film 217, a gate insulating film 208, a lower gate electrode 209, and an upper gate electrode 211 are formed. Note that the substrate 201, the base film 202, the island-shaped semiconductor film 217, and the gate insulating film 208 may be manufactured with similar materials and by similar steps to those of the substrate 101, the base film 102, the island-shaped semiconductor film 117, and the gate insulating film 108 in Embodiment Mode 1, respectively.

The lower gate electrode 209 and the upper gate electrode 211 are formed in the following manner.

First, the structure in Embodiment Mode 1 shown in FIG. 2C is obtained. Then, a tantalum nitride (TaN) film for example is formed over the island-shaped semiconductor film 217 as a first conductive film, to have a film thickness of 10 to 50 nm, for example, 30 nm. Subsequently, as a second conductive film, a tungsten (W) film is formed over the first conductive film to have a film thickness of 200 to 400 nm, for example 370 nm, and thus, a stacked layer of the first conductive film and the second conductive film is formed.

Next, the second conductive film is etched by anisotropic etching, and the upper gate electrode 211 is formed. Then, the first conductive film is etched by isotropic etching, and the lower gate electrode 209 is formed.

After the lower gate electrode 209 and the upper gate electrode 211 are formed, resists are formed over regions that become the connection regions 207 as mentioned in Embodiment Mode 1, and an element imparting one conductivity type is introduced into the island-shaped semiconductor film 217 with the gate insulating film 208, the lower gate electrode 209, the upper gate electrode 211, and the resists as masks. With this, the channel forming region 203, the low-concentration impurity regions 204, and the source or drain regions 205 are formed, and the regions covered by the resists are not added with the element imparting one conductivity type, and become the connection regions 207.

Further, a sidewall 212 is formed covering side surfaces of the gate insulating film 208, the lower gate electrode 209, and the upper gate electrode 211. The sidewall 212 may be formed with a similar material and by a similar step to those of the sidewall 112.

Next, a metal film is formed covering the island-shaped semiconductor film 217, the sidewall 212, and the upper gate electrode 211, and the silicide regions 206 are formed in the island-shaped semiconductor film 217 by a heating treatment. One end portion of the silicide regions 206 may be aligned with an end portion of the sidewall 212.

Then, the unnecessary metal film is removed, an interlayer insulating film 213 is formed, the interlayer insulating film 213 is etched, and contact holes that reach the connection regions 207 are formed. After surfaces of the connection regions 207 are treated with hydrofluoric acid or hydrogen plasma to remove oxide films on the surfaces of the connection regions 207, source or drain electrodes 215 that are connected to silicide regions in the connection regions 207 via the contact holes are formed.

Note that the interlayer insulating film 213 and the source or drain electrodes 215 may be formed with similar materials and by similar steps to those of the interlayer insulating film 113 and the source or drain electrodes 115 in Embodiment Mode 1.

Also, if necessary, this embodiment mode can be freely combined with any part of the description of other embodiment modes and embodiments.

Embodiment Mode 3

In this embodiment mode, a semiconductor device manufactured by a manufacturing method that is different from those in Embodiment Modes 1 and 2 is described with reference to FIGS. 25A to 26C. Note that in this embodiment mode, same portions as those in Embodiment Modes 1 and 2 are denoted by the same reference numerals, and descriptions in Embodiment Mode 1 are referred to for those without particular descriptions.

In a process of manufacturing a thin film transistor, it is known that when a silicide region is formed after adding an element imparting one conductivity type to a source or drain region, the element imparting one conductivity type is rediffused when the silicide region is formed. In order to avoid this, a step of adding the element imparting one conductivity type after forming the silicide in the source or drain region is also possible. A manufacturing method thereof is described below.

First, based on the description in Embodiment Mode 1, components up to the gate insulating film 108 and the gate electrode 111 are manufactured as in FIG. 3A. Next, a sidewall 151 is formed over side surfaces of the gate insulating film 108 and the gate electrode 111 (see FIG. 25A). The sidewall 151 may be formed in a similar manner to the sidewall 112 of Embodiment Mode 1.

Figure 25A:
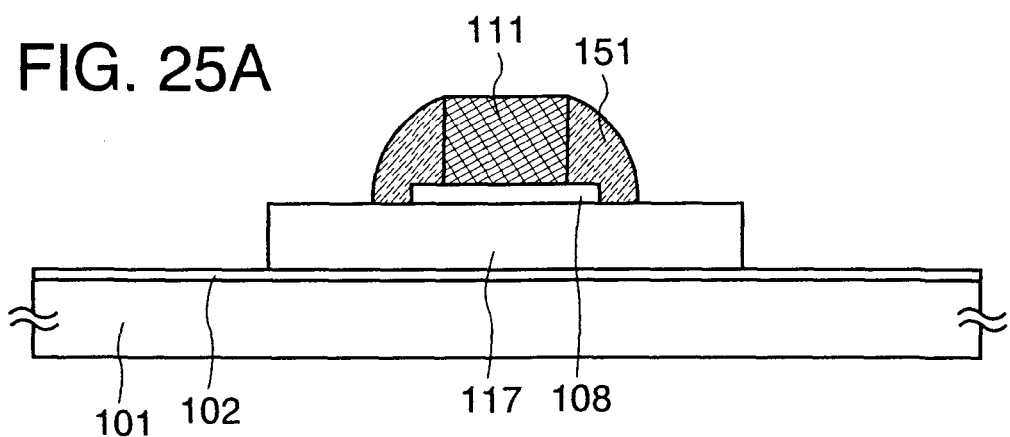
FIGS. 25A to 25D each show a manufacturing step of a semiconductor device of the present invention.
Figure 25B:
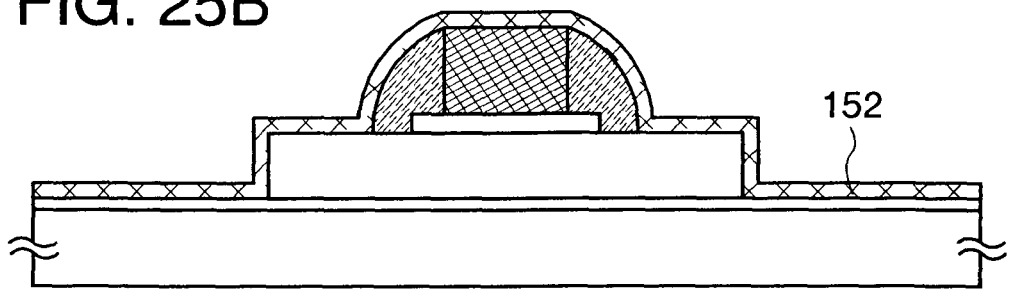
Figure 25C:
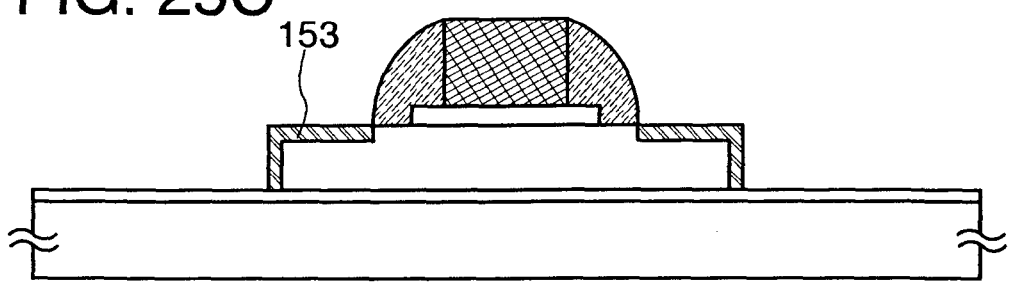

Next, a metal film 152 is formed covering the island-shaped semiconductor film 117, the gate insulating film 108, the gate electrode 111, and the sidewall 151 (see FIG. 25B). The metal film 152 may be formed with a similar material and by a similar step to those of the metal film 129 in Embodiment Mode 1.

After forming the metal film 152, a silicide region 153 is formed in the island-shaped semiconductor film 117 by heating the island-shaped semiconductor film 117 and the metal film 152. An end portion of the silicide region 153 may be aligned with an end portion of the sidewall 151. Subsequently, the unreacted metal film 152 is removed (see FIG. 25C).

Figure 25D:
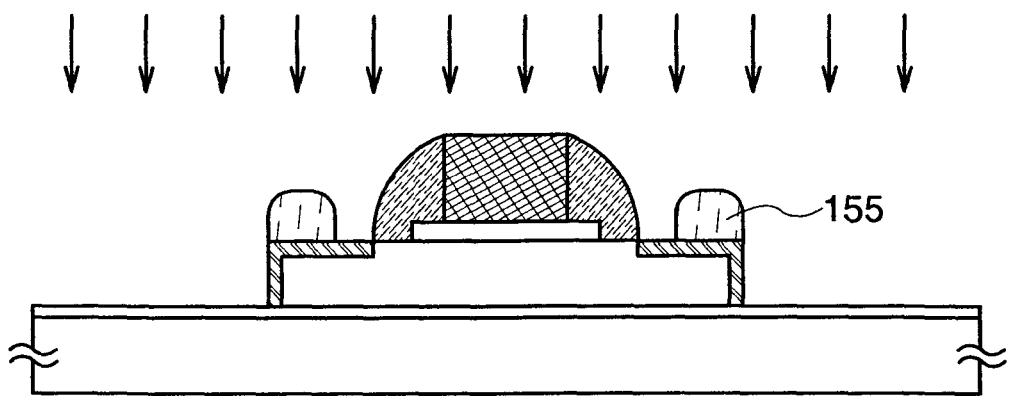

A resist 155 is formed over a region of a portion of the island-shaped semiconductor film 117, and an element imparting one conductivity type is added to the island-shaped semiconductor film 117 with the resist 155, the gate electrode 111, and the sidewall 151 as masks (see FIG. 25D). In this embodiment mode, as the element imparting one conductivity type, phosphorus (P) which is an element imparting n-type conductivity is added to the island-shaped semiconductor film 117. After that, the resist 155 is removed.

Figure 26A:
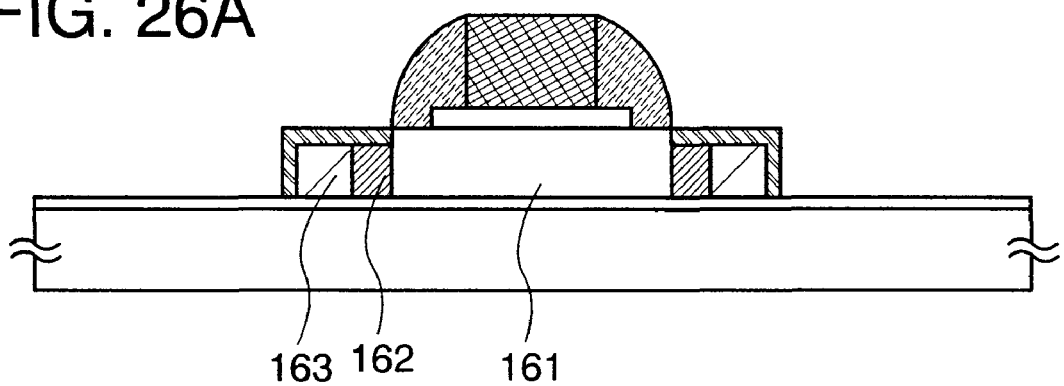
FIGS. 26A to 26C each show a manufacturing step of a semiconductor device of the present invention.

In a case where the element is added by an introduction of the element imparting one conductivity type at an application voltage at which the element does not penetrate through the sidewall 151, a channel forming region 161 and a source or drain region 162 are formed as shown in FIG. 26A. Also, a connection region 163 is formed in a region of the island-shaped semiconductor film 117 in which the resist 155 is formed.

Figure 26B:
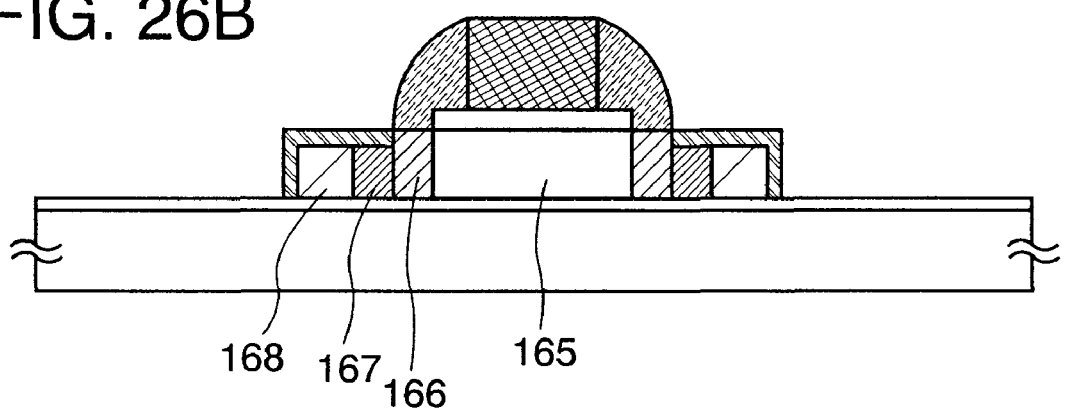

Also, in a case where the element is added at an application voltage at which the element penetrates through the sidewall 151, a channel forming region 165, a low-concentration impurity region 166, and a source or drain region 167 are formed as shown in FIG. 26B. Further, a connection region 168 is formed in a region of the island-shaped semiconductor film 117 in which the resist 155 is formed.

In FIG. 26A, the silicide region 153 is formed in the source or drain region 162 and the connection region 163. Also, an end portion of the silicide region 153 is aligned with one end of the source or drain region 162, and may also be aligned with an end portion of the sidewall 151.

In FIG. 26B, the silicide region 153 is formed in the source or drain region 167 and the connection region 168. Also, one end portion of the silicide region 153 is aligned with one end of the source or drain region 167, and may also be aligned with the end portion of the sidewall 151.

However, the connection region 168 may also include the element imparting one conductivity type in an amount with which silicide is not lost. For example, before forming the resist 155, a step of adding the element imparting one conductivity type, which determines an impurity concentration of the low-concentration impurity region 166, may be carried out. However, in that case, it is necessary to control application voltage so that the concentration is at a level at which silicide is not lost.

Next, an interlayer insulating film 171 is formed covering the island-shaped semiconductor film 117, the gate insulating film 108, the gate electrode 111, and the sidewall 151. Based on the description in Embodiment Mode 1, a contact hole is formed in the interlayer insulating film 171. The contact hole is formed so as to reach only the connection region 163, and so as not to reach the source or drain region 162.

A surface of the connection region 163 that is exposed by the contact hole is treated with hydrofluoric acid or the like, and an oxide film (mainly silicon oxide) over the silicide region in the connection region 163 is removed. Next, a conductive film is formed and then etched to form a source or drain electrode 173 (see FIG. 26C).

Figure 26C:
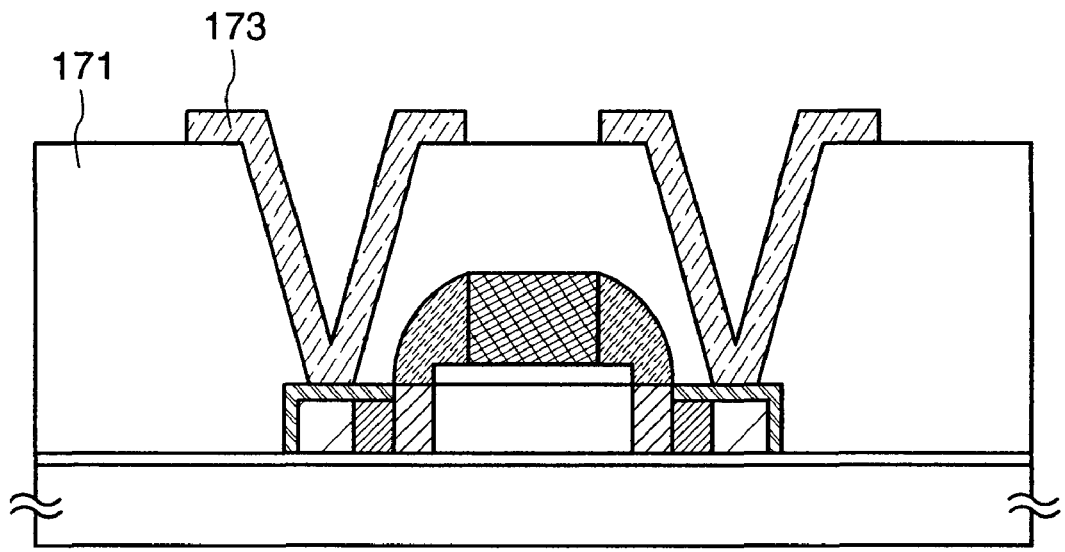

Note that although FIG. 26C shows a structure in which the interlayer insulating film 171 and the source or drain electrode 173 are formed in addition to the structure in FIG. 26A, it goes without saying that the interlayer insulating film and the source or drain electrode can be formed in addition to the structured in FIG. 26B by the foregoing manufacturing steps.

In this embodiment mode also, the source or drain electrode 173 electrically connects with the island-shaped semiconductor film 117 only in the connection regions 163 and 168. The contact hole for electrically connecting the source or drain electrode 173 in the interlayer insulating film 171 to the island-shaped semiconductor film 117 only reaches the connection regions 163 and 168. Consequently, the silicide region 153 is not removed, and favorable electrical contact can be obtained.

Embodiment 1

In this embodiment, phosphorus is used as an element imparting one conductivity type, and sheet resistances of a nickel silicide added with phosphorus and a nickel silicide not added with phosphorus are measured and compared. This embodiment is described below with reference to FIGS. 22 to 24.

First, a substrate used for the measurement is described. Nickel silicide is formed in a silicon film that is formed over the substrate, a mask is provided over a region of the silicon film, and then phosphorus (P) is added.

In this embodiment, it is considered that the region provided with the mask does not contain phosphorus as contrasted with a region not provided with a mask, and this region is considered as a connection region (a non-doped region). On the other hand, the region not provided with a mask contains phosphorus. In this embodiment, the region containing phosphorus is called a doped region. However, phosphorus may be contained in the connection region also, if the concentration is at a level at which silicide is not lost in a later step.

Figure 22:
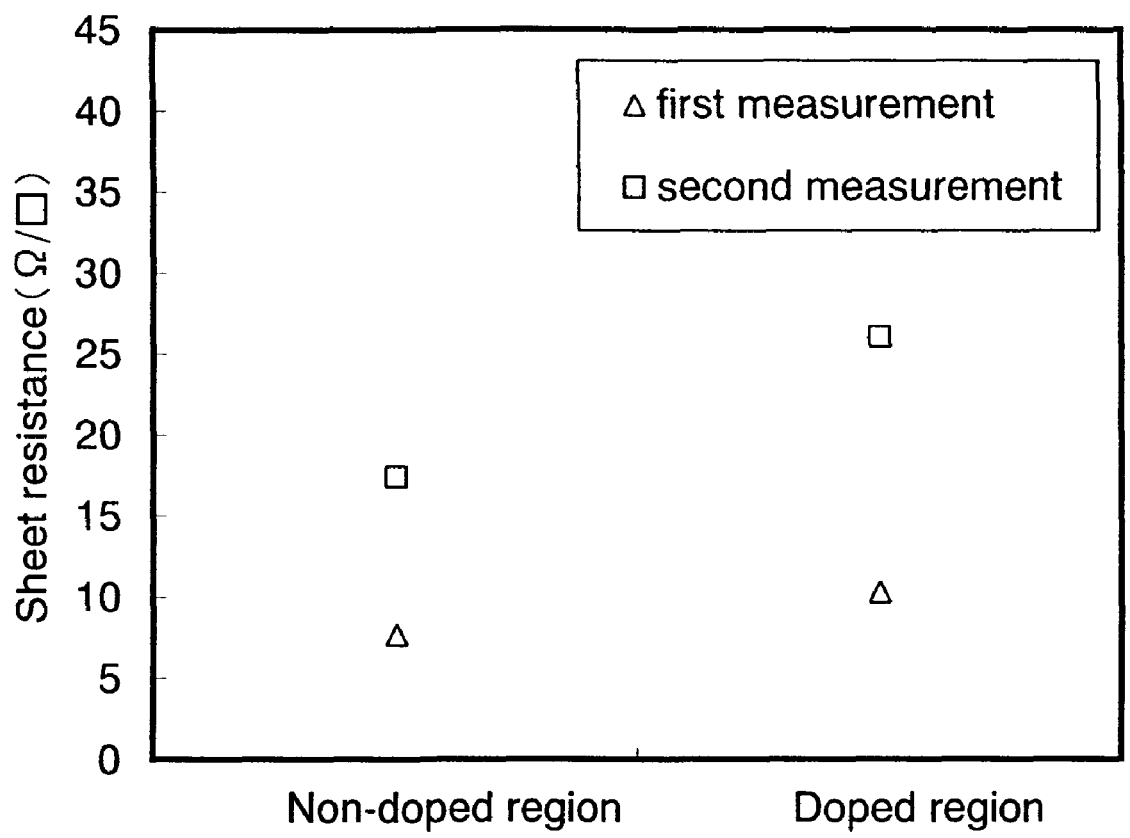
FIG. 22 shows a comparison of sheet resistances of a region to which an element imparting one conductivity type is added and a region to which the element is not added.
Figure 23:
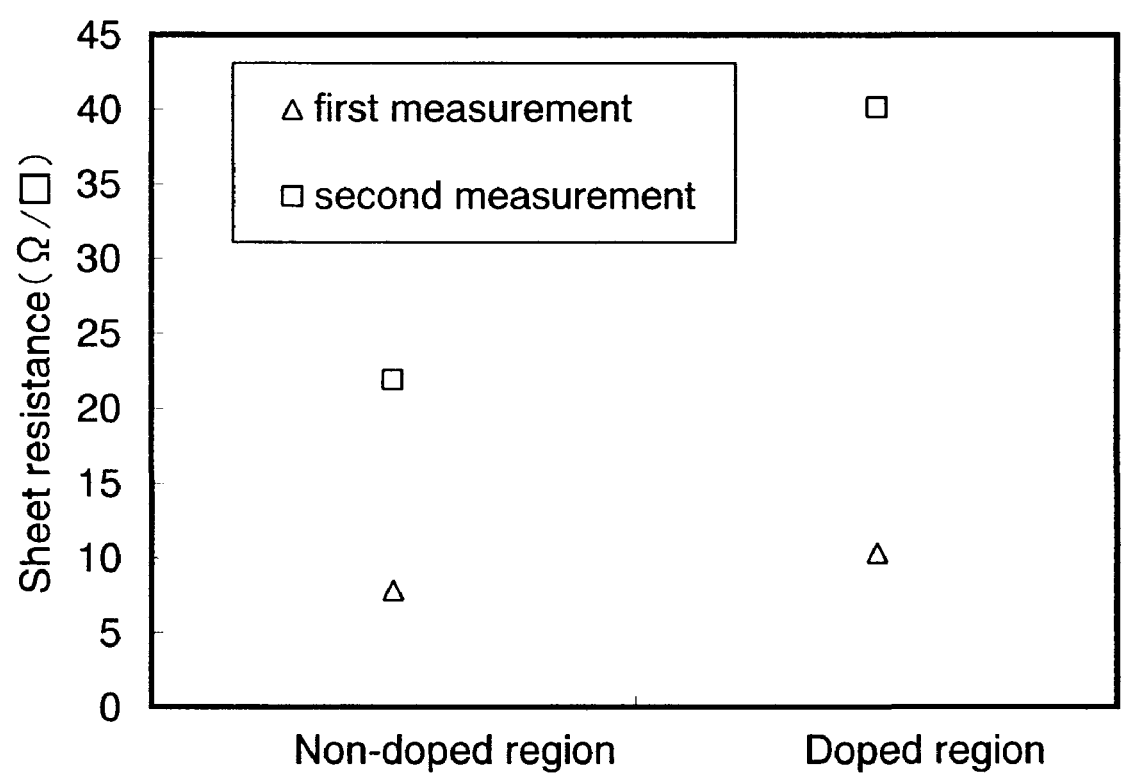
FIG. 23 shows a comparison of sheet resistances of a region to which an element imparting one conductivity type is added and a region to which the element is not added.
Figure 24:
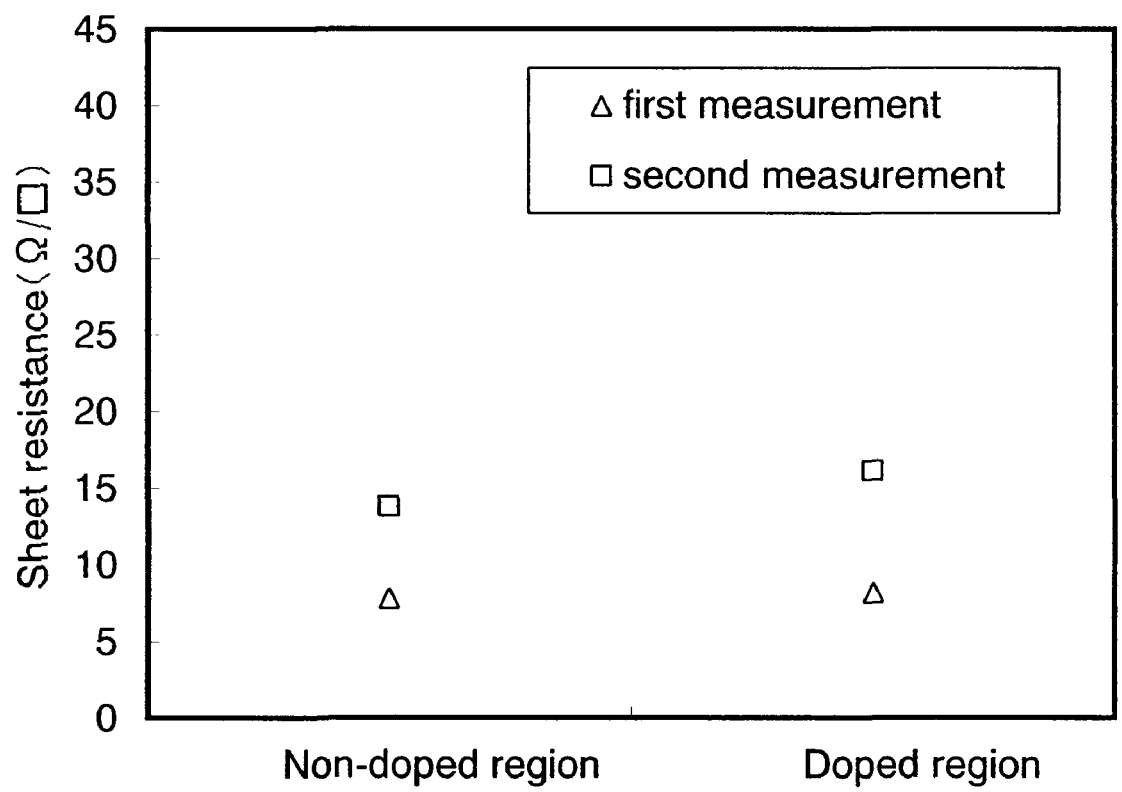
FIG. 24 shows a comparison of sheet resistances of a region to which an element imparting one conductivity type is added and a region to which the element is not added.

In FIGS. 22 to 24, after phosphorus is added, unreacted nickel is removed by etching, and a first measurement is carried out right after the removal of nickel. Then, silicide is treated with hydrofluoric acid (HF), removal of an oxide film (mainly silicon oxide) over a silicide surface is carried out, and a second measurement is carried out.

Further, in FIGS. 22 to 24, doping amounts of phosphorus in the doped region are changed. The doping amounts of phosphorus in FIGS. 22 to 24 are $5 \times 10^{15}$ cm$^{-2}$, $3 \times 10^{15}$ cm$^{-2}$, and $1 \times 10^{15}$ cm$^{-2}$, respectively.

It is apparent that sheet resistance of the connection region is lower than that of the doped region, in all of FIGS. 22 to 24. It is also apparent that when the connection region and the doped region in which silicide is treated are compared, sheet resistance is higher in the doped region, and sheet resistance is much lower in the connection region. That is, it is proved according to this measurement that silicide in the doped region is lost by a hydrofluoric acid treatment, and sheet resistance is increased; in other words, conductivity becomes poor. To the contrary, since silicide is not lost by a hydrofluoric acid treatment in the connection region, sheet resistance is low; in other words, conductivity is favorable. Therefore, it is apparent that it is favorable to use a silicide region in the connection region to electrically connect an electrode and a wiring.

Embodiment 2

This embodiment is described with reference to FIG. 7A to 9D.

First, based on the description in Embodiment Mode 1, components up to the island-shaped semiconductor film are manufactured as in FIG. 2C. In this embodiment, a base film 302 is formed over a substrate 301, and island-shaped semiconductor films 303 and 304 are formed thereover (see FIG. 7A).

Note that the substrate 301, the base film 302, and the island-shaped semiconductor films 303 and 304 may be formed with similar materials and by similar steps to those of the substrate 101, the base film 102, and the island-shaped semiconductor film 117 of Embodiment Mode 1, respectively.

Subsequently, an impurity is introduced into the island-shaped semiconductor films for controlling threshold voltage. In this embodiment, boron (B) is introduced into the island-shaped semiconductor films 303 and 304 by doping with diborane ($B_2H_6$).

Next, an insulating film 306 is formed covering the island-shaped semiconductor films 303 and 304. For the insulating film 306, silicon oxide, silicon nitride, silicon oxide containing nitrogen, or the like can be used, for example. As a formation method, a plasma CVD method, a sputtering method, or the like can be used.

Figure 7A:
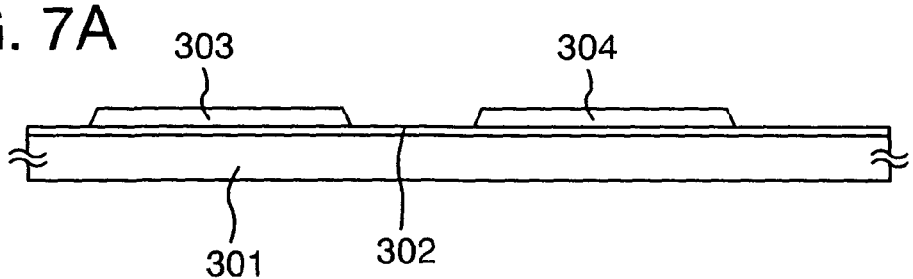
FIGS. 7A to 7F each show a manufacturing step of a semiconductor device of the present invention.
Figure 7B:
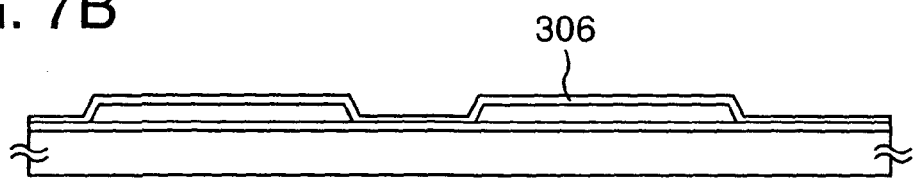
Figure 7C:
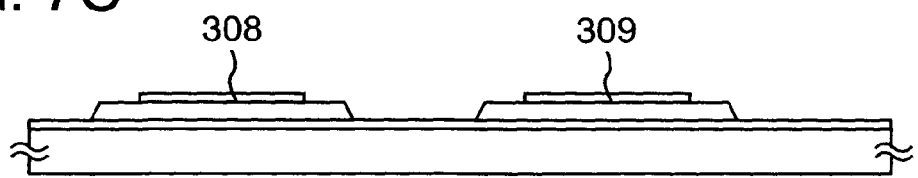

Subsequently, a gate insulating film 308 and a gate insulating film 309 are formed over the island-shaped semiconductor film 303 and the island-shaped semiconductor film 304, respectively, using the insulating film 306 (see FIG. 7C).

Figure 7D:
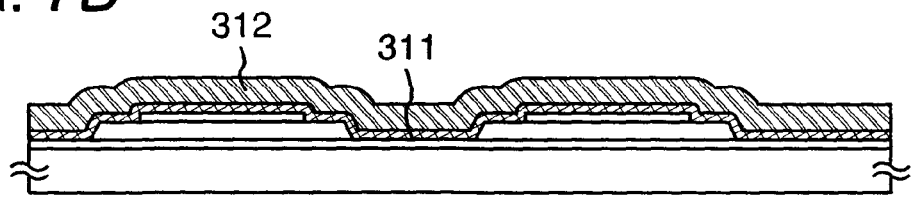
Figure 7E:
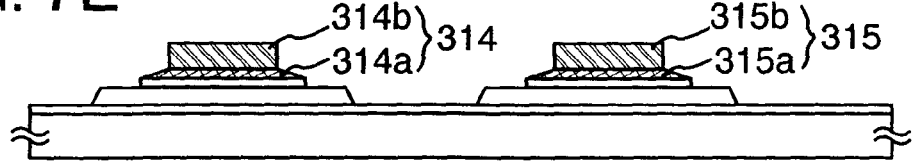
Figure 7F:
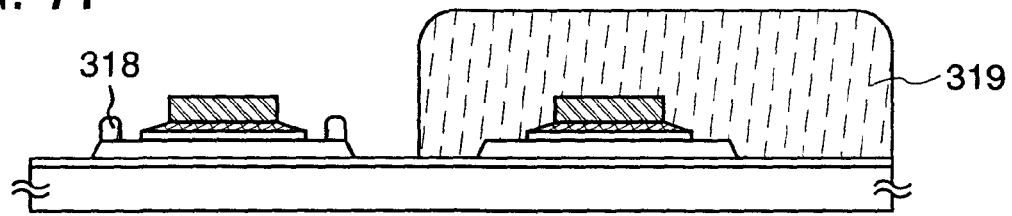

A first conductive film 311 and a second conductive film 312 are formed covering the island-shaped semiconductor films 303 and 304, and the gate insulating films 308 and 309 (see FIG. 7D).

For the first conductive film 311 and the second conductive film 312, elements selected from tantalum (Ta), tungsten (W), titanium (Ti), molybdenum (Mo), and aluminum (Al); or alloy materials or compound materials mainly containing the element are stacked.

In this embodiment, as the first conductive film 311, a tantalum nitride (TaN) film, for example, is formed to have a film thickness of 10 to 50 nm, for example, 30 nm. Then, over the first conductive film 311, a tungsten (W) film, for example, is formed to have a thickness of 200 to 400 nm, for example, 370 nm, to form a staked layer film of the first conductive film 311 and the second conductive film 312.

Subsequently, the second conductive film 312 is etched by anisotropic etching so that upper gate electrodes 314$b$ and 315$b$ are formed. Next, the first conductive film 311 is etched by isotropic etching so that lower gate electrodes 314$a$ and 315$a$ are formed. With the foregoing, gate electrodes 314 and 315 are formed (see FIG. 7E).

The gate electrodes 314 and 315 may be formed as a portion of a gate wiring. Alternatively, the gate wiring may be formed separately, and then the gate electrodes 314 and 315 may be connected to the gate wiring.

Next, a resists 318 is formed over a region of the island-shaped semiconductor film 303 that becomes a connection region in a later step. Also, a resist 319 is formed over the island-shaped semiconductor film 304, the gate insulating film 309, and the gate electrode 315.

Figure 8A:
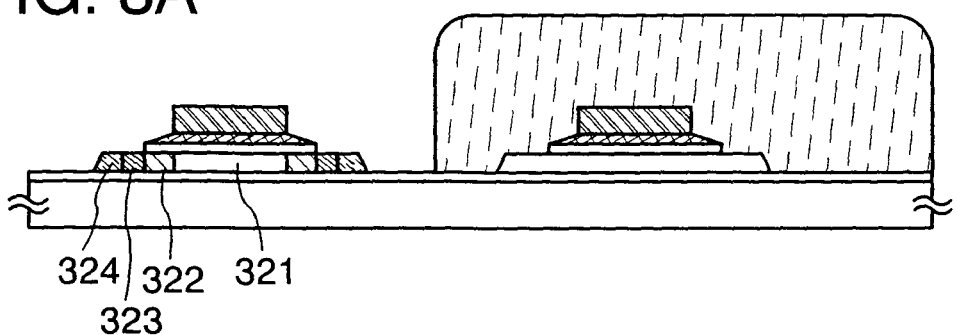
FIGS. 8A to 8E each show a manufacturing step of a semiconductor device of the present invention.
Figure 8B:
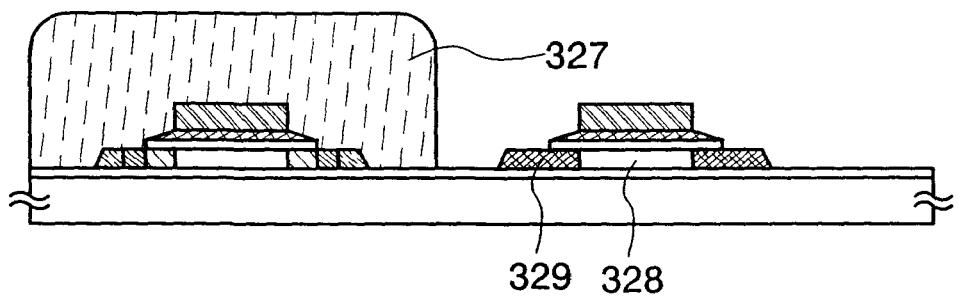

Then, an impurity imparting one conductivity type (conductivity of either n-type or p-type) is added to the island-shaped semiconductor film 303 using the gate electrodes 314 and 315, and the resists 318 and 319 as masks, thereby forming a source region, a drain region, a channel forming region, a low-concentration impurity region, and the like (see FIG. 8A).

First, using phosphorus as an element imparting n-type conductivity, phosphine ($PH_3$) is used to introduce phosphorus (P) into the island-shaped semiconductor film with an application voltage of 40 to 100 keV, for example, 60 keV, and a dose amount of $1\times10^{13}$ to $1\times10^{15}$ cm$^{-2}$, for example, $2.6\times10^{13}$ cm$^{-2}$. With this introduction of the impurity, a channel forming region 321 of an n-channel type TFT 356 is formed.

Subsequently, phosphorus (P) is introduced into the island-shaped semiconductor film 303 using phosphine ($PH_3$) with an application voltage of 10 to 60 keV, for example, 20 keV, and a dose amount of $5.0\times10^{14}$ to $2.5\times10^{16}$ cm$^{-2}$, for example, $3.0\times10^{15}$ cm$^{-2}$. With this, low-concentration impurity regions 322 and source or drain regions 323 of the n-channel type TFT 356 are formed. In addition, regions in the island-shaped semiconductor film 303 into which the element imparting n-type conductivity is not introduced because it is masked with the resists 318 are to be connection regions 324.

In this embodiment, phosphorus (P) is included in the source or drain regions 323 of the n-channel type TFT 356 at a concentration of $1\times10^{19}$ to $5\times10^{21}$ cm$^{-3}$. Also, in the low-concentration impurity regions 322 of the n-channel type TFT 356, phosphorus (P) is included at a concentration of $1\times10^{18}$ to $5\times10^{19}$ cm$^{-3}$.

However, the connection regions 324 may include phosphorus at a concentration at which silicide is not lost. In that case, as mentioned in Embodiment Mode 1, a step of adding phosphorus may be carried out which determines an impurity concentration of the low-concentration impurity regions 322, the resists 318 covering the regions of the island-shaped semiconductor film 303 that becomes the connection regions 324 are formed, and then a step of adding phosphorus which determines an impurity concentration of the source or drain regions 323 may be carried out.

Subsequently, the resist 319 is removed, and a resist 327 is formed covering the island-shaped semiconductor film 303, the gate insulating film 308, and the gate electrode 314.

In order to form a p-channel type TFT 357, diborane ($B_2H_6$) is used to introduce boron (B) into the island-shaped semiconductor film 304 under a condition in which an application voltage is 60 to 100 keV, for example, 80 keV, and a dose amount is $1\times10^{13}$ to $5\times10^{15}$ cm$^{-2}$, for example, $3\times10^{15}$ cm$^{-2}$. Consequently, source or drain regions 329 of the p-channel type TFT is formed, and in addition, a channel forming region 328 is formed with this introduction of the impurity.

Note that with regard to introducing boron into the p-channel type TFT 357, a sufficient amount of boron for forming the source or drain regions 329 is added to the island-shaped semiconductor film 304 even through the lower gate electrode 315$a$ and the gate insulating film 309, since application voltage is high.

Also, it is known that in a p-channel type TFT, silicide is not easily lost even if an oxide film over a silicide surface is removed with hydrofluoric acid or the like in a later step. Therefore, a connection region is not necessary to be formed in the p-channel type TFT 357. Of course, a connection region may be formed in the p-channel type TFT and a silicide region may be formed in one portion of a source or drain electrode and in the connection region, to electrically connect the source or drain electrode only to the connection region.

In the source or drain regions 329 of the p-channel type TFT 357, boron (B) is included at a concentration of $1\times10^{19}$ to $5\times10^{21}$ cm$^{-2}$.

Figure 8C:
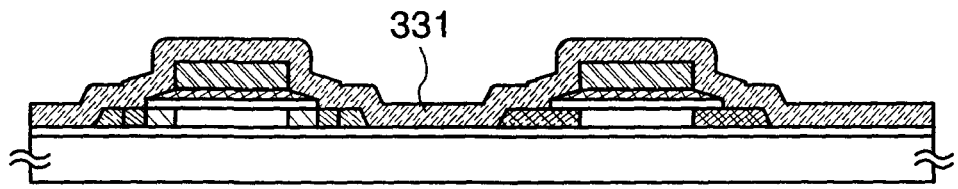

Subsequently, an insulating film 331 is formed covering the island-shaped semiconductor films 303 and 304, the gate insulating films 308 and 309, and the gate electrodes 314 and 315 (see FIG. 8C).

The insulating film 331 can be formed by a plasma CVD method or a low pressure CVD (LPCVD) method using a silicon oxide film or a silicon oxide film containing nitrogen. In this embodiment, a silicon oxide film is formed by a plasma CVD method to have a film thickness of 50 to 200 nm, preferably 100 nm.

Figure 8D:
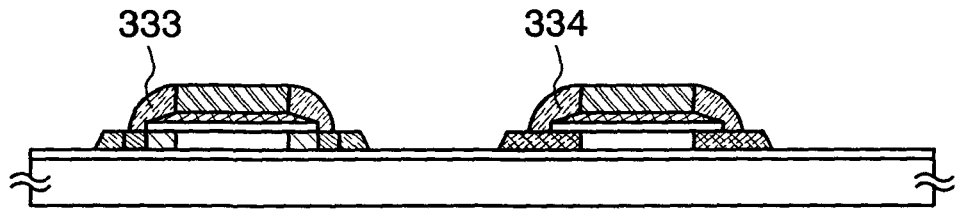

Subsequently, by etching the insulating film 331, a sidewall 333 is formed over side surfaces of the gate insulating film 308 and the gate electrode 314, and a sidewall 334 is formed over side surfaces of the gate insulating film 309 and the gate electrode 315 (see FIG. 8D). The sidewall 333 and the sidewall 334 are formed to have a taper form or a rectangular form, and in this embodiment, the sidewalls 333 and 334 are formed to have a taper form.

Figure 8E:
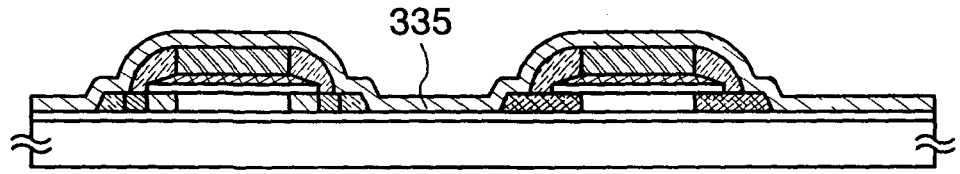

Next, a metal film 335 is formed covering the island-shaped semiconductor films 303 and 304, the gate insulating films 308 and 309, the gate electrodes 314 and 315, and the sidewalls 333 and 334 (see FIG. 8E).

For the metal film 335, titanium (Ti), nickel (Ni), cobalt (Co), tungsten (W), platinum (Pt), or the like can be used. In this embodiment, a nickel film is formed to have a thickness of 10 nm as the metal film 335.

Subsequently, the island-shaped semiconductor films 303 and 304 over which the metal film 335 is formed are heated by applying a thermal annealing method using an annealing furnace, a laser annealing method, or a rapid thermal annealing method (RTA method). Consequently, silicide regions 341 and silicide regions 342 are formed in the island-shaped semiconductor film 303 and the island-shaped semiconductor film 304, respectively. In this embodiment, the silicide regions 341 and 342 are formed by heating at a temperature of 350° C. or higher by a rapid thermal annealing method.

Figure 9A:
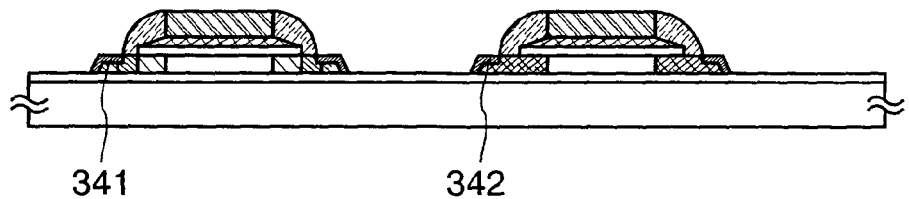
FIGS. 9A to 9D each show a manufacturing step of a semiconductor device of the present invention.
Figure 9B:
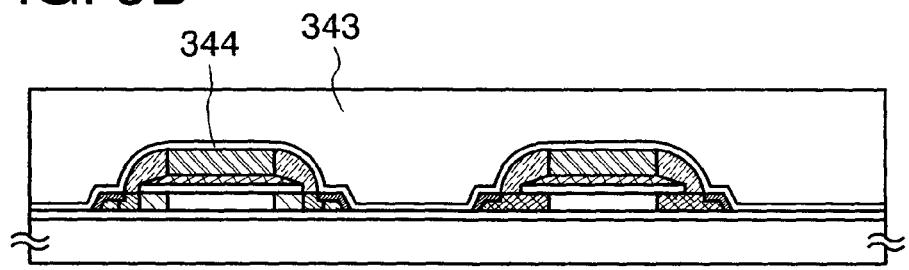
Figure 9C:
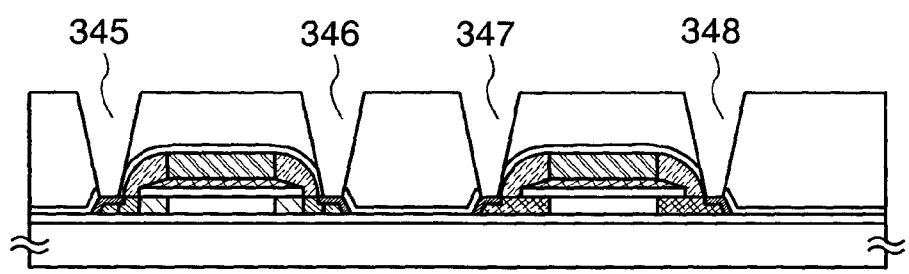

After the silicide regions 341 and 342 are formed, the unreacted metal film 335 is removed by etching with a chemical solution of sulfuric acid, nitric acid, or the like (see FIG. 9A).

Next, a first interlayer insulating film 344 is formed covering the island-shaped semiconductor films 303 and 304, the gate insulating films 308 and 309, the gate electrodes 314 and 315, and the sidewalls 333 and 334.

As the first interlayer insulating film 344, an insulating film containing silicon is formed using a plasma CVD method or a sputtering method, for example, a silicon oxide film, a silicon nitride film, or a silicon oxide film containing nitrogen, or a staked-layer film thereof. Of course, the first interlayer insulating film 344 is not limited to a silicon oxide film containing nitrogen, a silicon nitrogen film, and a staked-layer film thereof, and another insulating film containing silicon may be used as a single layer structure or a staked-layer structure.

In this embodiment, first, a silicon oxide film containing nitrogen is formed by a plasma CVD method to have a thickness of 50 nm, and an impurity is activated by a laser irradiation method. Alternatively, after forming the silicon oxide film containing nitrogen, heating may be carried out in a nitrogen atmosphere at 550° C. for four hours, and the impurity may be activated.

Next, as a second interlayer insulating film 343, 50 nm of a silicon nitride film is formed over the first interlayer insulating film 344 by a plasma CVD method, and then 600 nm of a silicon oxide film containing nitrogen is formed. This stacked-layer film of the silicon nitride film and the silicon oxide film containing nitrogen is the second interlayer insulating film 343.

Next, the entire substrate is heated at 410° C. for one hour to carry out hydrogenation by releasing hydrogen from the silicon nitride film.

Also, an insulating film may be additionally stacked over the second interlayer insulating film 343. For such an insulating film, a photosensitive or non-photosensitive organic material (polyimide, acrylic, polyamide, polyimide amide, resist, or benzocyclobutene), siloxane, or a stacked-layer structure thereof can be used. As the organic material, a positive-type photosensitive organic resin or a negative-type photosensitive organic resin can be used.

Note that a skeleton structure of siloxane includes a bond between silicon (Si) and oxygen (O), and an organic group containing at least hydrogen (for example, an alkyl group or aromatic hydrocarbon) is used for a substituent. Alternatively, a fluoro group may be used for the substituent. Further, the organic group containing at least hydrogen and the fluoro group may be used for the substituent.

Also, as the insulating film over the second interlayer insulating film 343, a film that does not easily allow penetration of moisture, oxygen, and the like compared to other insulating films may be formed. Typically, a silicon nitride film, a silicon oxide film, a silicon nitride film containing oxygen (composition ratio N>O), a silicon oxide film containing nitrogen (composition ratio N<O), a thin film mainly containing carbon (for example, a DLC film or a CN film), or the like which is obtained by a sputtering method or a CVD method, can be used.

The first interlayer insulating film 344 and the second interlayer insulating film 343 are etched to form contact holes 345 and 346 that reach the island-shaped semiconductor film 303, and contact holes 347 and 348 that reach the island-shaped semiconductor film 304, in the first interlayer insulating film 344 and the second interlayer insulating film 343.

At this time, in the island-shaped semiconductor film 303 that becomes an active layer of the n-channel type TFT 356, the contact holes 345 and 346 are formed to reach only the connection regions 324.

Also, in the island-shaped semiconductor film 304 that becomes an active layer of the p-channel type TFT 357, it is acceptable as long as the contact holes 347 and 348 reach the silicide regions 342.

Subsequently, in order to remove an oxide film over a surface of each of the connection regions 324, surfaces of the island-shaped semiconductor films 303 and 304 exposed by the contact holes 345 to 348 are washed with hydrofluoric acid. Alternatively, the surfaces of the island-shaped semiconductor films 303 and 304 exposed by the contact holes 345 to 348 are subjected to a plasma treatment by placing the substrate in a hydrogen plasma atmosphere. In this embodiment, the surfaces of the island-shaped semiconductor films 303 and 304 exposed by the contact holes 345 to 348 are treated with hydrofluoric acid. With this, electrical contact of source or drain electrodes 351 and 352 with the island-shaped semiconductor film 303, and electrical contact of the source or drain electrode 352 and a source or drain electrode 353 with the island-shaped semiconductor film 304 can be favorable.

Next, a third conductive film is formed over the second interlayer insulating film 343 via the contact holes 345 to 348, and the third conductive film is used to form the source or drain electrodes 351 to 353.

In this embodiment, a metal film is used as the third conductive film. For the metal film, a film made of aluminum (Al), titanium (Ti), molybdenum (Mo), tungsten (W), or silicon (Si), or an alloy film using these elements may be used. In this embodiment, a titanium film (Ti), an aluminum film (Al), and a titanium film (Ti) are stacked with thicknesses of 100 nm, 300 nm, and 100 nm, respectively, and then etched into a desired shape to form the source or drain electrodes 351 to 353.

Further, the source or drain electrodes 351 to 353 may be formed of an aluminum alloy film containing carbon and at least one type of element selected from nickel, cobalt, and iron. With such an aluminum alloy film, even if it comes into contact with silicon, interdiffusion of silicon and aluminum can be prevented. Also, with such an aluminum alloy film, an oxidation-reduction reaction does not occur even if it comes into contact with a transparent conductive film, for example an ITO (Indium Tin Oxide) film, and they can be in direct contact with each other. Further, such an aluminum alloy film has low resistivity and excellent heat resistance; therefore, it is useful as a wiring material.

Further, for each of the source or drain electrodes 351 to 353, the electrode and a wiring may be formed with the same material in one step, or the electrode and the wiring may be formed separately and then connected.

The source or drain electrode 351 is electrically connected to one of the source or drain regions 323 of the n-channel type TFT 356 via one of the silicide regions 341. The source or drain electrode 352 is electrically connected to the other of the source or drain regions 323 via the other of the silicide regions 341, and it is also electrically connected to one of the source or drain regions 329 of the p-channel type TFT 357 via one of the silicide regions 342. Further, the source or drain electrode 353 is electrically connected to the other of the source or drain regions 329 of the p-channel type TFT 357 via the other of the silicide regions 342.

Figure 9D:
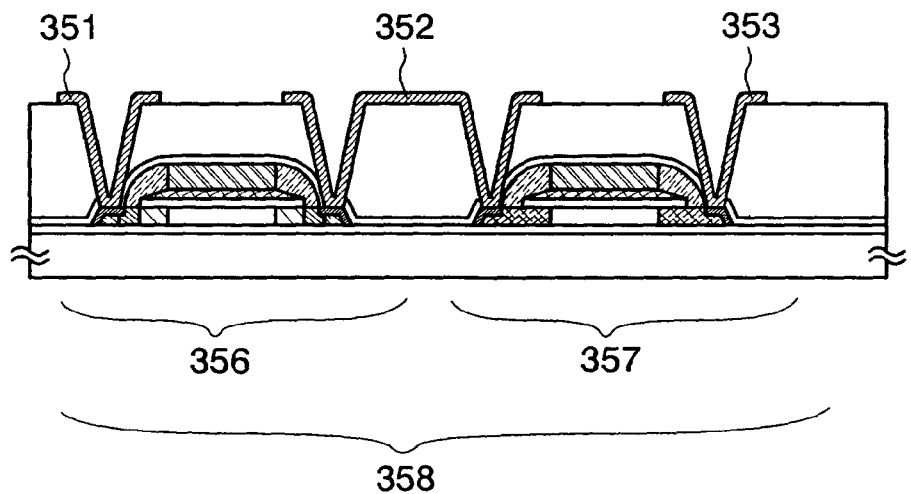

By the series of steps mentioned above, a semiconductor device including a CMOS circuit 358, which includes the n-channel type TFT 356 and the p-channel type TFT 357, can be formed (see FIG. 9D).

Also, if necessary, this embodiment can be freely combined with any part of the description of the embodiment modes.

Embodiment 3

Figure 10A:
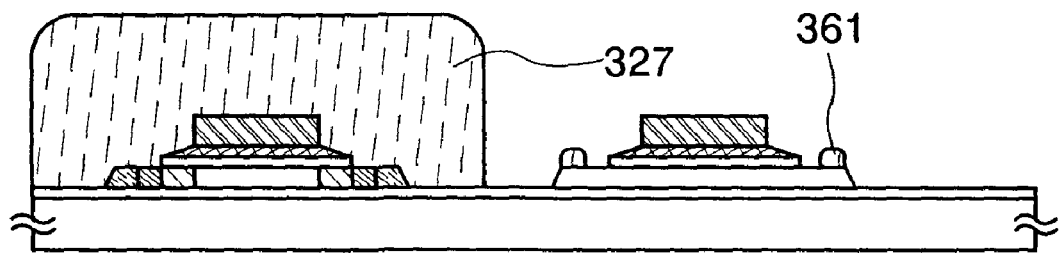
FIGS. 10A to 10C each show a manufacturing step of a semiconductor device of the present invention.

In this embodiment, an example of also forming a connection region in a p-channel type TFT is described with reference to FIGS. 10A to 10C. Note that in this embodiment, same portions as those in Embodiment 2 are denoted by the same reference numerals, and descriptions in Embodiment 2 are referred to for those without particular reference numerals.

First, based on the description in Embodiment 2, steps up to the step of adding an element imparting n-type conductivity are carried out as shown in FIG. 8A. Next, resists 361 are formed over regions that become connection regions 365 in the island-shaped semiconductor film 304 that becomes an active layer of a p-channel type TFT 367. Also, the resist 327 is formed covering the island-shaped semiconductor film 303 which becomes an active layer, the gate insulating film 308, and the gate electrode 314 of the n-channel type TFT 356 (see FIG. 10A).

Figure 10B:
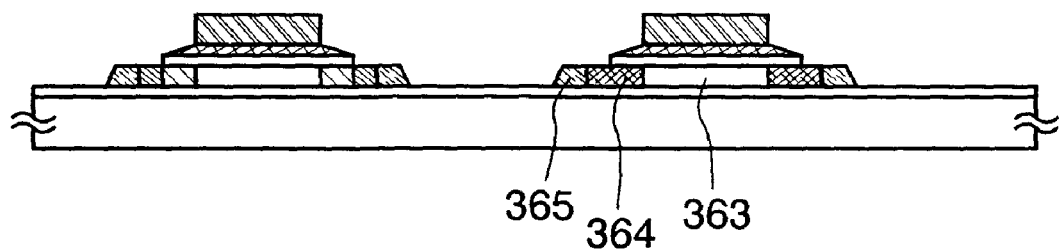
Figure 10C:
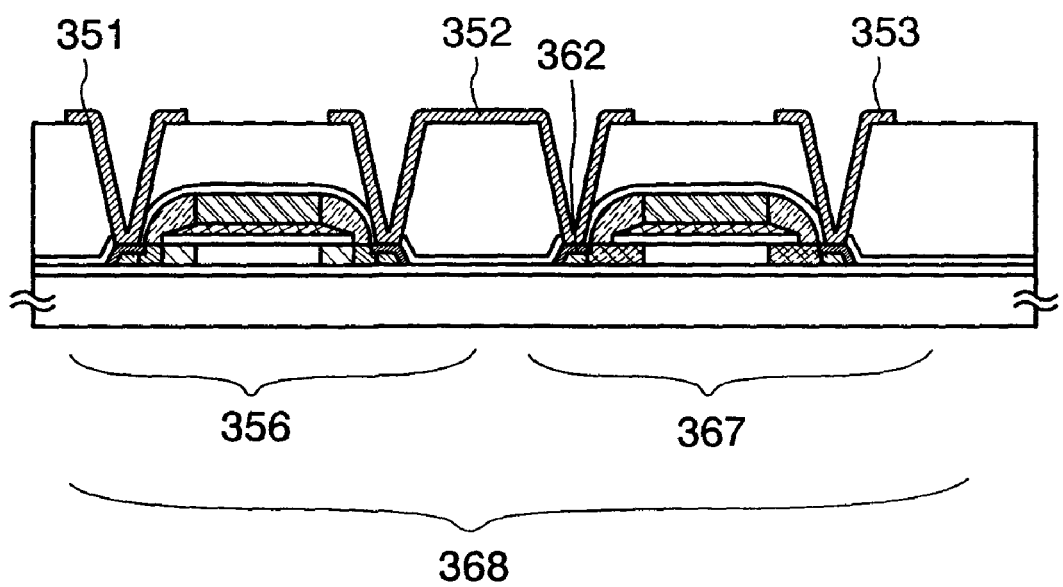

Next, based on the description in Embodiment 2, a channel forming region 363, source or drain regions 364, and connection regions 365 are formed in the island-shaped semiconductor film 304 using boron as an element imparting p-type conductivity (see FIG. 10B).

Subsequently, based on the description in Embodiment 2, sidewall formation, silicide region formation, interlayer insulating film formation, contact hole formation, and formation of the source or drain electrodes 351 to 353 are carried out (see FIG. 10C).

The source or drain electrodes 352 and 353, and the contact holes 347 and 348 in the interlayer insulating films 344 and 343 only reach silicide regions of the connection regions 365 of the p-channel type TFT 367, and do not reach the source or drain regions 364.

The source or drain electrode 351 is electrically connected one of the source or drain regions 323 of the n-channel type TFT 356 via one of the silicide regions 341. The source or drain electrode 352 is electrically connected to the other of the source or drain regions 323 of the n-channel type TFT 356 via the other of the silicide regions 341, and it is also electrically connected to one of the source or drain regions 364 of the p-channel type TFT 367 via one of the silicide region 362. Further, the source or drain electrode 353 is electrically connected to the other of the source or drain regions 364 of the p-channel type TFT 367 via the other of the silicide region 362. In the above manner, a CMOS circuit 368 is formed.

Also, if necessary, this embodiment can be freely combined with any part of the description of the embodiment modes and embodiments.

Embodiment 4

In this embodiment, an example of manufacturing a CPU (Central Processing Unit) using the present invention is described with reference to FIGS. 11A to 15C.

As shown in FIG. 11A, a base film 402 is formed over a substrate 401 having an insulating surface. As the substrate 401, a glass substrate of barium borosilicate glass, alumino borosilicate glass, or the like; a quartz substrate; a stainless steel substrates; or the like can be used, for example. Also, a substrate made of a synthetic resin having flexibility such as plastic typified by PET, PES, or PEN, or acrylic tends to have lower heat resistance temperature in general then other substrates; however, the substrate can be used if it can withstand a treatment temperature in a manufacturing process.

The base film 402 is provided to prevent an alkali metal such as Na or an alkaline earth metal contained in the substrate 401 from diffusing into a semiconductor film and having an adverse effect on a characteristic of a semiconductor element. Therefore, the base film 402 is formed using an insulating film of silicon oxide, silicon nitride, silicon oxide containing nitrogen, or the like which can suppress diffusion of the alkali metal or alkaline earth metal to the semiconductor film. In this embodiment, a silicon nitride film containing oxygen that is formed using $SiH_4$, $NH_3$, $N_2O$ and $H_2$ as a reaction gas, and a silicon nitride film containing oxygen that is formed using $SiH_4$ and $N_2O$ as a reaction gas are stacked in this order by a plasma CVD method, to have thicknesses of 10 to 200 nm (50 nm in this embodiment) and 50 to 200 nm (100 nm in this embodiment), respectively. Note that the base film 402 may have a single-layer structure, and a silicon oxide film containing nitrogen can be formed to have a thickness of 10 to 400 nm (preferably 50 to 300 nm), for example.

Further, in a case of using a substrate such as a glass substrate, a stainless steel substrate, or a plastic substrate, containing an alkali metal or an alkaline earth metal in any amount, it is effective to provide a base film in terms of preventing diffusion of an impurity; however, if diffusion of an impurity is not much of a problem as in a case of using a quartz substrate, it is not always necessary to provide a base film.

An amorphous semiconductor film 403 is formed over the base film 402. A film thickness of the amorphous semiconductor film 403 is 25 to 100 nm (preferably, 30 to 60 nm). Also, for the amorphous semiconductor film, silicon germanium can also be used as well as silicon, and when silicon germanium is used, a concentration of germanium is preferably about 0.01 to 4.5 atomic %. In this embodiment, a semiconductor film mainly containing silicon (also referred to as an amorphous silicon film, or amorphous silicon) with a thickness of 66 nm is used.

Next, a catalyst element is added to the amorphous semiconductor film 403. Here, "added" means forming the catalyst element over a surface of the amorphous semiconductor film 403 so that at least crystallization of the amorphous crystal semiconductor film is promoted. It is preferable to form the catalyst element since the amorphous semiconductor film can be crystallized at a low temperature.

For example, a film 404 containing a crystallization promoting element (note that there may be a case where the film cannot be observed as a film because it is extremely thin) is formed over the amorphous semiconductor film 403 by a spin coating method, a dipping method, or the like, using a solution (includes an aqueous solution and an acetic acid solution) containing the crystallization promoting element, for example nickel (see FIG. 11A). At this time, it is desirable to form an oxide film (not shown) with a thickness of 1 to 5 nm, in an oxygen atmosphere by UV light irradiation, a thermal oxidation method, a treatment with ozone water containing a hydroxyl radical or with hydrogen peroxide, or the like, in order to improve wettability of a surface of the amorphous semiconductor film 403 and to spread the solution over an entire surface of the amorphous semiconductor film. Further, the amorphous semiconductor film 403 may be implanted with nickel ions by an ion implanting method, heated in a water vapor atmosphere containing nickel, or subjected to sputtering with argon plasma using a nickel material as a target. In this embodiment, the crystallization promoting element is formed over the amorphous semiconductor film 403 by a spin coating method using an aqueous solution including 10 ppm of nickel acetate.

Subsequently, the amorphous semiconductor film 403 is irradiated with laser light (laser beam) 405.

For such laser irradiation, a marker can also be formed to precisely overlap the laser light and to control an irradiation starting position or an irradiation ending position. The marker may be formed over a substrate using a photolithography method.

By this laser irradiation, the amorphous semiconductor film 403 is crystallized, and a crystalline semiconductor film 406 is formed (see FIG. 11B).

Subsequently, a gettering step is carried out to reduce or remove the catalyst element. In this embodiment, a method of capturing the catalyst element with an amorphous semiconductor film as a gettering sink is described. First, an oxide film is formed over the crystalline semiconductor film by UV light irradiation in an oxygen atmosphere, a thermal oxidation method, a treatment with ozone water containing a hydroxyl radical or with hydrogen peroxide, or the like. Next, an amorphous semiconductor film is formed to have a thickness of 150 nm using a plasma CVD method with $SH_4$ and Ar for a raw material gas, a pressure of 0.3 Pa, an RF power of 3 kW, and a substrate temperature of 150° C.

Next, a heating treatment is carried out in a nitrogen atmosphere at 550° C. for four hours, to reduce or remove the catalyst element. Consequently, the amorphous semiconductor film that is the gettering sink and the oxide film are removed with hydrofluoric acid or the like, and a crystalline semiconductor film of which the catalyst element is reduced or removed, can be obtained.

As shown in FIG. 11C, island-shaped semiconductor films 407 to 410 are obtained using the crystalline semiconductor film 406. To obtain the island-shaped semiconductor films 407 to 410, a photoresist is applied to the crystalline semiconductor film 406, a predetermined mask shape is exposed to light, baked, and masks are formed over the crystalline semiconductor film 406. Using these masks, the crystalline semiconductor film is etched by a dry etching method. $CF_4$ and $O_2$ can be used for a gas in the dry etching method.

Subsequently, by steps similar to those in Embodiment Modes 1 to 3 and Embodiments 2 and 3, a step of introducing an element imparting one conductivity type, a step of forming a sidewall, and a step of forming a silicide region are carried out. Further, with regard to conditions and steps of manufacture, film formation materials, and the like in this embodiment without particular descriptions, those similar to the conditions and steps of manufacture, film formation materials, and the like in Embodiment 2 are used.

Note that, in this embodiment, n-channel type TFTs 461 and 463, and p-channel type TFTs 462 and 464 are formed over the substrate 401. In FIG. 12A, the n-channel type TFT 461 includes the island-shaped semiconductor film 407, a gate insulating film 411, and a gate electrode 471 including a lower gate electrode 471a and an upper gate electrode 471b, over the base film 402. Also, in the island-shaped semiconductor film 407, connection regions 424, source or rain regions 423, low-concentration impurity regions 422, and a channel forming region 421 are included. In a portion of each of the source or drain regions 423 and that of each of the connection regions 424, a silicide region 425 is formed, respectively. Over side surfaces of the gate insulating film 411 and the gate electrode 471, a sidewall 476 is formed.

Also, the p-channel type TFT 462 includes the island-shaped semiconductor film 408, an insulating film 412, and a gate electrode 472 including a lower gate electrode 472a and an upper gate electrode 472b, over the base film 402. Also, in the island-shaped semiconductor film 408, a source or drain regions 432 and a channel forming region 431 are included. In each of the source or drain regions 432, a silicide region 435 is formed. Over side surfaces of the gate insulating film 412 and the gate electrode 472, a sidewall 477 is formed.

The n-channel type TFT 463 includes the island-shaped semiconductor film 409, a gate insulating film 413, and a gate electrode 473 including a lower gate electrode 473a and an upper gate electrode 473b, over the base film 402. Also, in the island-shaped semiconductor film 409, connection regions 444, source or drain regions 443, low-concentration impurity regions 442, and a channel forming region 441 are included. In each of the source or drain regions 443, a silicide region 445 is formed. Over side surfaces of the gate insulating film and the gate electrode 473, a sidewall 478 is formed.

Further, the p-channel type TFT 464 includes the island-shaped semiconductor film 410, a gate insulating film 414, and a gate electrode 474 including a lower gate electrode 474a and an upper gate electrode 474b, over the base film 402. Also, in the island-shaped semiconductor film 410, source or drain regions 452 and a channel forming region 451 are included. In each of the source or drain regions 452, a silicide region 455 is formed. Over side surfaces of the gate insulating film 414 and the gate electrode 474, a sidewall 479 is formed.

Next, a first interlayer insulating film 481 is formed covering the island-shaped semiconductor films 407 to 410, the gate insulating films 411 to 414, and the gate electrodes 471 to 474. It is acceptable as long as the first interlayer insulating film 481 is an insulating film containing nitrogen, and in this embodiment, a silicon nitride film with a thickness of 100 nm is formed by a plasma CVD method.

Subsequently, a heating treatment is carried out to perform hydrogenation. In this embodiment, the heating treatment is carried out for one hour in a nitrogen atmosphere at 410° C. As a result, a dangling bond of the silicon oxide film or the silicon film is terminated with hydrogen that is released from silicon nitride.

Next, a second interlayer insulating film 482 is formed covering the first interlayer insulating film 481. For the second interlayer insulating film 482, an inorganic material (such as silicon oxide, silicon nitride, silicon nitride containing oxygen), a photosensitive or non-photosensitive organic material (polyimide, acrylic, polyamide, polyimide amide, resist, or benzocyclobutene), siloxane, or a stacked-layer structure thereof can be used.

Note that a skeleton structure of siloxane includes a bond between silicon (Si) and oxygen (O), and an organic group containing at least hydrogen (for example, an alkyl group or aromatic hydrocarbon) is used for a substituent. Alternatively, a fluoro group may be used for the substituent. Further, the organic group containing at least hydrogen and the fluoro group may be used for the substituent.

Further, when the organic material is used to form the second interlayer insulating film 482, a positive-type photosensitive organic resin or a negative-type photosensitive organic resin can be used. For example, when a positive-type photosensitive acrylic is used as the organic material, an opening portion having curvature in an upper end portion can be formed by etching the photosensitive organic resin by a light exposure treatment in a photolithography step. In this embodiment, a nitrided silicon oxide film is formed to have a thickness of 600 nm by a plasma CVD method using $SiH_4$ and $N_2O$ for a raw material gas. At this time, a temperature of a substrate is raised to 300 to 450° C., and in this embodiment, the substrate is heated to 400° C.

Next, opening portions, that is, contact holes, are formed in the first interlayer insulating film 481 and the second interlayer insulating film 482, and then electrodes or wirings 491 to 498 are formed which are connected to impurity regions. In this embodiment, the electrodes and wirings are formed together, but they may be formed separately and then electrically connected. Further, at the same time as forming the electrodes or wirings 491 to 498, a wiring that connects with the gate electrodes is formed. At this time, it is favorable to form the opening portions perpendicularly so that the diameter of each opening portion is about 1.0 µm. Therefore, the opening portions are intentionally formed so that an end portion of a resist does not become taper-formed. Also, if selectivity between the resist and the insulating film in which the contact holes are opened is high, then it is acceptable that the end portion of the resist is taper-formed. In this embodiment, because a nitrided silicon oxide film is used as the second interlayer insulating film 482, the opening portions are formed by a dry etching method using a resist mask that is formed so that an end portion is perpendicular, in other words, intentionally formed so that it does not become tapered-formed. Here, the end portion of the resist may become taper-formed in practice. Etching is carried out using $CHF_3$ and He for an etching gas, for a first etching time of several seconds, for example, 3 seconds; a second etching period of 100 to 130 seconds, for example, 117 seconds; and a third etching period of 200 to 270 seconds, for example, 256 seconds. At this time, a flow rate of the etching gas can be determined according to a condition of etching of the opening portions.

Note that when the organic material or siloxane is used for the second interlayer insulating film 482, a mask that has higher hardness than the resist mask, for example, a hard mask formed from an inorganic material such as a silicon oxide film, may be used to make side surfaces of the opening portions perpendicular.

Subsequently, the resist mask is removed by $O_2$ ashing or with a resist peeling liquid.

Then, the electrodes or wirings 491 to 498 are formed in the opening portions (see FIG. 12B). For the wirings, a film made of an element of aluminum (Al), titanium (Ti), molybdenum (Mo), tungsten (W), or silicon (Si), or an alloy film using these elements may be used. In this embodiment, a titanium film (Ti), a titanium nitride film (TiN), a titanium-aluminum alloy film (Al—Si), and a titanium film (Ti) are stacked with thicknesses of 60 nm, 40 nm, 300 nm, and 100 nm, respectively, and then etched into desired shapes to form the wirings, that is, source electrodes and drain electrodes.

Further, these electrodes or wirings 491 to 498 may be formed of an aluminum alloy film containing carbon and at least one type of element selected from nickel, cobalt, and iron. With such an aluminum alloy film, even if it comes into contact with silicon, interdiffusion of silicon and aluminum can be prevented. Also, with such an aluminum film, an oxidation-reduction reaction does not occur even if it comes into contact with a transparent conductive film, for example an ITO (Indium Tin Oxide) film, and they can be in direct contact with each other. Further, such an aluminum alloy film has low resistivity and excellent heat resistance; therefore, it is useful as a wiring material.

The electrode or wiring 491 and the electrode or wiring 492 of the n-channel type TFT 461 are formed so as not to reach the source or drain regions 423. Also, the contact holes that are formed in the first interlayer insulating film 481 and the second interlayer insulating film 482, and provided to connect the electrode or wiring 491 and the electrode or wiring 492 with the island-shaped semiconductor film 407, are formed so as not to reach the source or drain regions 423.

The electrode or wiring 495 and the electrode or wiring 496 of the n-channel type TFT 463 are formed so as not to reach the source or drain regions 443. Also, the contact holes that are formed in the first interlayer insulating film 481 and the second interlayer insulating film 482, and provided to connect the electrode or wiring 495 and the electrode or wiring 496 with the island-shaped semiconductor film 409, are formed so as not to reach the source or drain regions 443.

In the above manner, an n-channel type thin film transistor with a gate length of 1.0 µm or less, having an LDD structure formed so as to include a low-concentration impurity region can be formed. Also, a p-channel type thin film transistor with a gate length of 1.0 µm or less, having a so-called single drain structure formed so as not to include a low-concentration impurity region can be formed. Note that, a TFT with a gate length of 1.0 µm or less can also be referred to as a submicron TFT. A p-channel type thin film transistor can have a single gate structure since degradation due to hot carries or a short channel effect does not easily occur.

Note that in the present invention, the p-channel type thin film transistor may have an LDD structure. Further, the n-channel type thin film transistor and the p-channel type thin film transistor may have a so-called GOLD structure in which a low-concentration impurity region overlaps a gate electrode, instead of the LDD structure.

A semiconductor device, which in this embodiment is a CPU, including the thin film transistor formed in the above manner can be manufactured, and high speed operation of an operating frequency of 30 MHz at a driving voltage of 5V is possible.

Further, a structure of the CPU of this embodiment is described using a block diagram.

Figure 13:
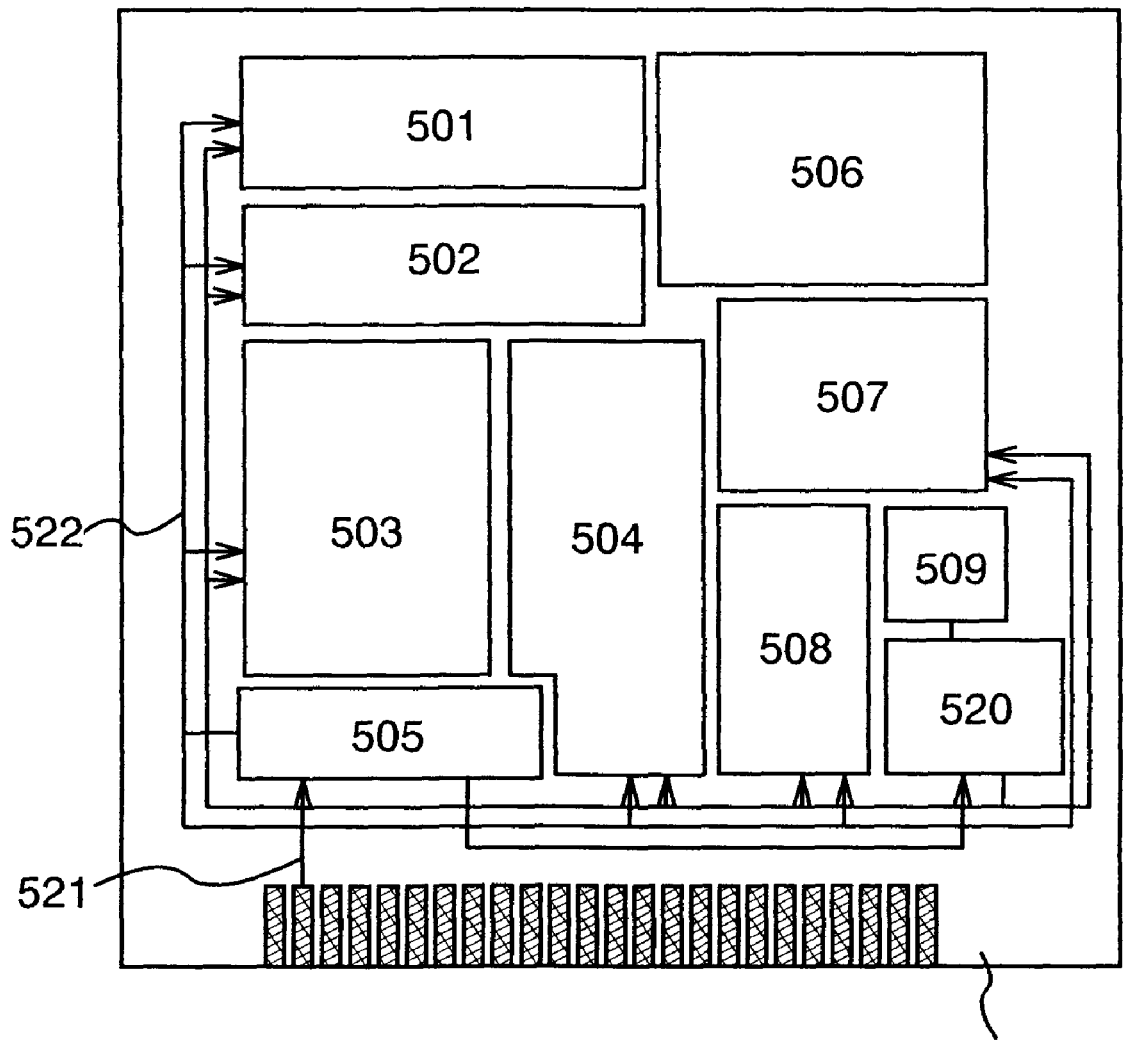
FIG. 13 shows a top view of a CPU of the present invention.

A CPU shown in FIG. 13 mainly includes an arithmetic logic unit (ALU) 501, an ALU controller 502, an instruction decoder 503, an interrupt controller 504, a timing controller 505, a register 506, a register controller 507, a bus interface (Bus I/F) 508, a rewritable ROM 509 and a ROM interface (ROM I/F) 520, over a substrate 500. Further, the ROM 509 and the ROM interface 520 may be provided over another chip.

Obviously, the CPU shown in FIG. 13 is only an example in which the configuration is simplified, and an actual CPU may have various configurations depending on the uses.

An instruction input to the CPU through the bus interface 508 is input to the instruction decoder 503, decoded therein, and then input to the ALU controller 502, the interrupt controller 504, the register controller 507 and the timing controller 505.

The ALU controller 502, the interrupt controller 504, the register controller 507 and the timing controller 505 conduct various controls based on the decoded instruction. Specifically, the ALU controller 502 generates signals for controlling the drive of the ALU 501. While the CPU is executing a program, the interrupt controller 504 judges an interrupt request from an external input/output device or a peripheral circuit based on its priority or a mask state, and processes the request. The register controller 507 generates an address of the register 506, and reads/writes data from/to the register 506 in accordance with the state of the CPU.

The timing controller 505 generates signals for controlling timing of driving of the ALU 501, the ALU controller 502, the instruction decoder 503, the interrupt controller 504, and the register controller 507. For example, the timing controller 505 is provided with an internal clock generator for generating an internal clock signal $CLK_2$ 522 based on a reference clock signal CLK$_1$ 521, and supplies the clock signal CLK$_2$ to the various above-mentioned circuits.

Figure 14:
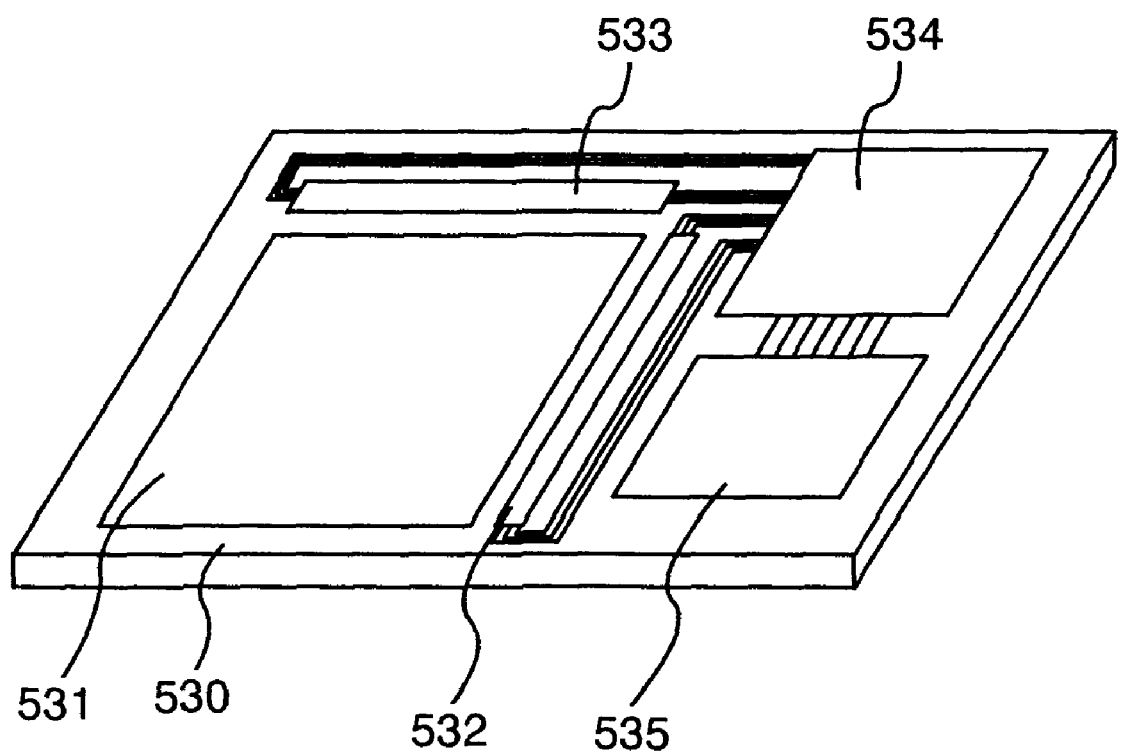
FIG. 14 shows a system-on-panel of the present invention.

FIG. 14 shows a display device, a so-called system-on-panel in which a pixel portion, a CPU and other circuits are formed over the same substrate. Over a substrate 530, a pixel portion 531, a scan line driver circuit 532 for selecting a pixel included in the pixel portion 531, and a signal line driver circuit 533 for supplying a video signal to the selected pixel are provided. A CPU 534 is connected to other circuits, for example, a control circuit 535 by wirings which are led from the scan line driver circuit 532 and the signal line driver circuit 533. It is to be noted that the control circuit includes an interface. A connecting portion with an FPC terminal is provided at an end portion of the substrate so as to interact with external signals.

As additional circuits, a video signal processing circuit, a power source circuit, a gray scale power source circuit, a video RAM, a memory (DRAM, SRAM, PROM) and the like can be provided over the substrate. Alternatively, these circuits may be formed of an IC chip and mounted over the substrate. Further, the scan line driver circuit 532 and the signal line driver circuit 533 are not necessarily required to be formed over the same substrate. For example, only the scan line driver circuit 532 may be formed over the same substrate as the pixel portion 531 while the signal line driver circuit 533 may be formed of an IC chip and mounted.

Figure 15A:
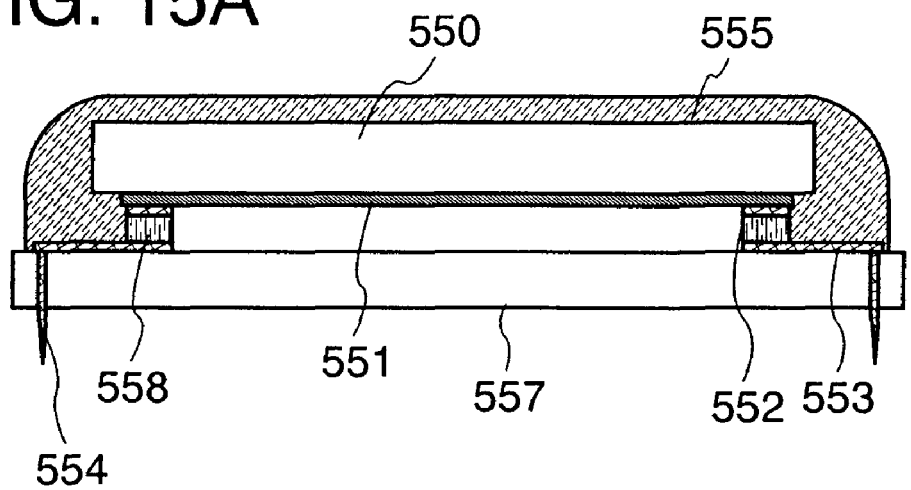
FIGS. 15A to 15C each show a manufacturing step of a CPU of the present invention.

FIG. 15A shows a mode of a packaged CPU. A thin film transistor array 551 having a function of a CPU that is formed over a substrate 550 is made to be in a face-down position so that an electrode 552 (an electrode such as a source electrode or a drain electrode, or an electrode formed thereover with an insulating film interposed therebetween) provided over a surface of the CPU is on the bottom side. Glass or plastic can be used for the substrate 550. Also, a wiring board provided with a wiring 553 formed of copper or an alloy thereof, for example, a printed board 557, is prepared. The printed board 557 is provided with a connection terminal (pin) 554. Then, the electrode 552 and the wiring 553 are connected via an anisotropic conductive film 558 or the like. Subsequently, the substrate 550 is covered by a resin 555 such as an epoxy resin from above, and the packaged CPU is completed. Alternatively, a periphery of the CPU may be surrounded with plastic or the like while keeping a hollow space.

Figure 15B:
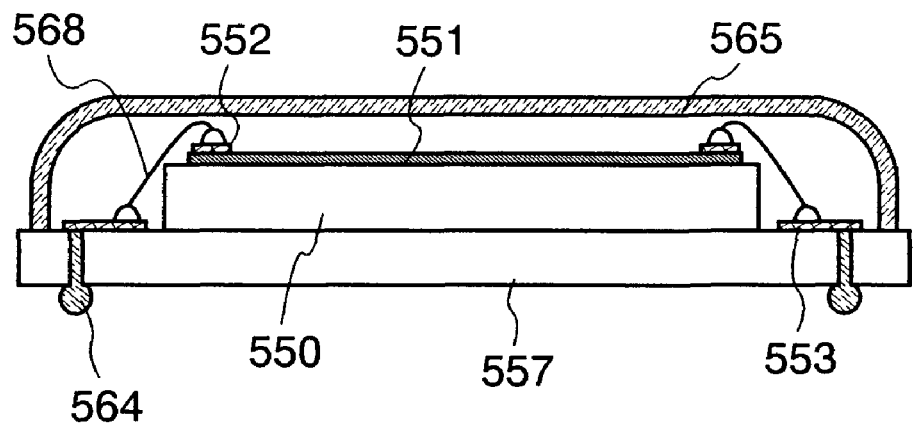

In FIG. 15B, unlike in FIG. 15A, the thin film transistor array 551 having a function of a CPU is in a face-up position so that the electrode 552 provided over a surface of the CPU is on the top side. Then, the substrate 550 is fixed over the printed board 557, and the electrode 552 and the wiring 553 are connected by a wire 568. Such connection by a wire is called wire bonding. Then, the electrode 552 and a bump 564 connected to the wiring 553 are connected. Thereafter, a periphery of the CPU may be surrounded with a plastic 565 or the like while keeping a hollow space and the packaged CPU is completed.

Figure 15C:
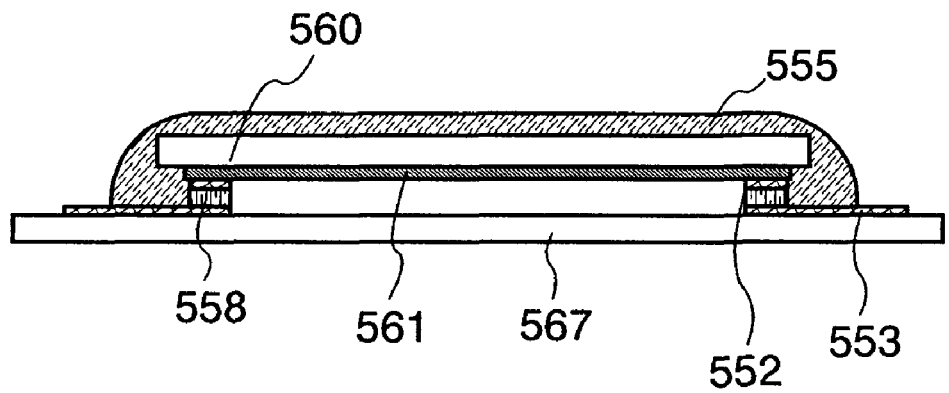

FIG. 15C shows an example in which the thin film transistor array 551 having a function of a CPU is fixed to a substrate having flexibility, for example, an FPC (Flexible Printed Circuit). The thin film transistor array 551 having a function of a CPU that is formed over a substrate 560 is made to be in a face-down position so that the electrode 552 provided over a surface of the CPU is on the bottom side. Glass, quartz, metal, a bulk semiconductor, or plastic can be used for the substrate 560; however, it is preferable to use plastic having high flexibility in FIG. 15C. Also, an FPC 567 having flexibility provided with the wiring 553 formed of copper or an alloy thereof is prepared. Then, the electrode 552 and the wiring 553 are connected via the anisotropic conductive film 558. Thereafter, the substrate 560 is covered by the resin 555 such as an epoxy resin from above, and the packaged CPU is completed.

Such a packaged CPU is protected from the exterior and it is easier to carry around. Also, the CPU can be mounted to a desired place; particularly, when the CPU has flexibility as in FIG. 15C, the degree of freedom in where it is mounted increases. Further, by packaging it, it can assist a function of the CPU.

In the above manner, a semiconductor device such as a CPU can be manufactured using a TFT of the present invention. Since a CPU formed using a thin film transistor is lightweight, burden when carrying around or mounting can be reduced. Also, a system-on-panel can be manufactured using a variety of display devices such as the CPU described in this embodiment, a liquid crystal display device, an EL display device, and the like.

Also, if necessary, this embodiment can be freely combined with any part of the description of the embodiment modes and embodiments.

Embodiment 5

In this embodiment, an example of manufacturing an ID chip (also called an ID tag, an IC chip, or an IC tag) using the present invention is described with reference to FIGS. 16A to 19B.

In this embodiment, an electrically isolated TFT as a semiconductor element is shown as an example; however, a semiconductor element used in an integrated circuit is not limited to this, and a variety or circuit elements can be used. For example, other than a TFT, a storage element, a diode, a photoelectric conversion element, a resistor, a coil, a capacitor, an inductor, and the like can be typically given.

As illustrated in FIG. 16A, a peeling layer 602 is formed over a heat-resistant substrate (first substrate) 601 by a sputtering method. A glass substrate of barium borosilicate glass or alumino borosilicate glass, a quartz substrate, a ceramic substrate, or the like can be used as the first substrate 601. In addition, a metal substrate including a stainless steel substrate or a semiconductor substrate with an insulating film formed over its surface may be used. Also, a substrate made of a synthetic resin having flexibility such as plastic tends to have lower heat resistance temperature in general than to the above substrates; however, the substrate can be used if it can withstand a treatment temperature in a manufacturing process.

The peeling layer 602 can be formed of a layer mainly containing silicon such as amorphous silicon, polycrystalline silicon, single-crystal silicon, or microcrystalline silicon (including semi-amorphous silicon). The peeling layer 602 can be formed by a sputtering method, a low pressure CVD method, a plasma CVD method, or the like. In this embodiment, the peeling layer 602 is formed of amorphous silicon in approximately 50 nm thick by a low pressure CVD method. The material of the peeling layer 602 is not limited to silicon, and a material that can be selectively etched off may be used. It is preferable that the peeling layer 602 has a thickness of 50 to 60 nm. When the peeling layer 602 is formed of the semi-amorphous silicon, it may be formed with a thickness of 30 to 50 nm.

A semi-amorphous semiconductor typified by semi-amorphous silicon has an intermediate structure of an amorphous semiconductor and a semiconductor having a crystal structure (including a single crystal and a poly crystal). The semi-amorphous semiconductor is a semiconductor which has the third state stable in terms of free energy, and which is crystalline having a short rage order and lattice distortion. The semi-amorphous semiconductor can be formed to have a grain diameter of 0.5 to 20 nm to be dispersed in a non-single crystalline semiconductor. A Raman spectrum is shifted to a lower wave number than 520 cm$^{-1}$. By X-ray diffraction, (111) and (220) diffraction peaks which may be derived from a Si crystalline lattice are observed. Hydrogen or halogen of 1 atomic % or more is contained in the semi-amorphous semiconductor as a material for terminating dangling bonds. Such a semiconductor is referred to as a semi-amorphous semiconductor (SAS). A favorable semi-amorphous semiconductor with increased stability can be obtained by further encouraging lattice distortion by means of adding a rare gas element such as helium, argon, krypton, or neon.

The SAS can be obtained by glow discharge decomposition of a gas containing silicon. As the typical gas containing silicon, $Si_2H_6$, $SiH_2Cl_2$, $SiHCl_3$, $SiCl_4$, $SiF_4$, or the like in addition to $SiH_4$ can be used. The gas containing silicon can be diluted with hydrogen, or hydrogen and one or a plurality of rare gas elements selected from helium, argon, krypton, and neon. It is preferable to dilute the gas containing silicon at a dilution rate in the range of 2 to 1000 times.

Subsequently, a base film 603 is formed over the peeling layer 602. The base film 603 is provided to prevent an alkali metal such as Na or an alkaline earth metal contained in the first substrate 601 from diffusing into a semiconductor film and having an adverse effect on a characteristic of a semiconductor element such as a TFT. Also, the base film 603 also has a role of protecting the semiconductor element in a later step of peeling off the semiconductor element. The base film 603 may be a single layer or a plurality of insulating films may be stacked. Consequently, the base film 603 is formed using an insulating film of silicon oxide, silicon nitride, silicon oxide containing nitrogen, silicon nitride containing oxygen, or the like, which can suppress diffusion of an alkali metal or an alkaline earth metal into a semiconductor film.

In this embodiment, the base film 603 is formed by stacking a silicon oxide film containing nitrogen with a thickness of 100 nm, a silicon nitride film containing oxygen with a thickness of 50 nm, and a silicon oxide film containing nitrogen with a thickness of 100 nm in this order as a lower layer base film 603a, a middle layer base film 603b, and an upper base film 603c, respectively; however, a material, thickness, and the number of stacked layers of each film are not limited thereto. For example, instead of the silicon oxide film containing nitrogen of the lower layer, a siloxane based resin may be formed to have a film thickness of 0.5 to 3 μm by a spin coating method, a slit coating method, a droplet discharging method, or the like. Further, instead of the silicon nitride film containing oxygen of the middle layer, a silicon nitride film (such as $Si_3N_4$) may be used. Furthermore, instead of the silicon oxide film containing nitrogen of the upper layer, a silicon oxide film may be used. In addition, a film thickness of each film is desirably 0.05 to 3 μm, and may be freely selected from this range.

Alternatively, the lower layer of the base film 603, which is closest to the peeling layer 602, may be formed of a silicon oxide film containing nitrogen, or a silicon oxide film; the middle layer may be formed of a siloxane based resin; and the upper layer may be formed of a silicon oxide film.

Here, the silicon oxide film can be formed using a mixed gas of $SiH_4$ and $O_2$, TEOS (tetraethoxysilane) and $O_2$, or the like, by a thermal CVD method, a plasma CVD method, a normal pressure CVD method, a bias ECRCVD method, or the like. Also, the silicon nitride film can be formed typically by using a mixed gas of $SiH_4$ and $NH_3$ by a plasma CVD method. Further, the silicon oxide film containing nitrogen (composition ratio O>N) and the silicon nitride film containing oxygen (composition ratio N>O) can be formed typically using a mixed gas of $SiH_4$ and $N_2O$, by a plasma CVD method.

Subsequently, a semiconductor film is formed over the base film 603. After forming the base film 603, the semiconductor film is preferably formed without being exposed to air. The film thickness of the semiconductor film is 20 to 200 nm (desirably, 40 to 170 nm, preferably, 50 to 150 nm). Note that the semiconductor film may be formed of an amorphous semiconductor, a semi-amorphous semiconductor, or a polycrystalline semiconductor. Not only silicon but also silicon germanium can be used as the semiconductor. When using silicon germanium, the concentration of the germanium is preferably about 0.01 to 4.5 atomic %.

The amorphous semiconductor can be obtained by glow discharge decomposition of a gas containing silicon. As the typical gas containing silicon, $SiH_4$, and $Si_2H_6$ are given. Those gases containing silicon may be used by diluting with hydrogen, or hydrogen and helium.

As described above, the semi-amorphous semiconductor can be obtained by glow-discharge decomposition of the gas containing silicon. However, a carbide gas such as $CH_4$, or $C_2H_6$, a germanium gas such as $GeH_4$ or $GeF_4$, or $F_2$ may be mixed into the gas containing silicon to adjust the width of an energy band at 1.5 to 2.4 eV or 0.9 to 1.1 eV.

In the case of using the gas in which $H_2$ is added to $SiH_4$, or the gas in which $F_2$ is added to $SiH_4$, by manufacturing a TFT using the formed semi-amorphous semiconductor, the sub-threshold coefficient (S value) of the TFT can be 0.35 V/dec or less, typically, 0.25 to 0.09 V/dec, and the mobility can be 10 cm$^2$/Vdec. And when 19-stage ring oscillator is formed with a TFT using the foregoing semi-amorphous semiconductor, for example, a property in which an oscillation frequency is 1 MHz or more, preferably, 100 MHz or more, with power voltage ranging from 3 to 5V, can be obtained. Further, in the power voltage ranging from 3 to 5V, delay time per stage of an inverter can be 26 ns, preferably, 0.26 ns or less.

Then, based on the descriptions in Embodiment Modes 1 to 3 and Embodiments 2 to 4, steps of introducing an element imparting one conductivity type, sidewall formation, and silicide region formation are carried out.

By the foregoing, an n-channel type TFT 611, a p-channel type TFT 612, and an n-channel type TFT 613 are formed (see FIG. 16A). Note that in this embodiment, the TFTs 611 to 613 have top-gate structures; however, they may have bottom-gate structures (inversely-staggered structure).

The n-channel type TFT 611 includes an island-shaped semiconductor film 621, a gate insulating film 661, and a gate electrode 671 including a lower gate electrode 671a and an upper gate electrode 671b, over the upper base film 603c. A channel forming region 631, low-concentration impurity regions 632, source or drain regions 633, connection regions 634, and silicide regions 635 are provided in the island-shaped semiconductor film 621. Each of the silicide regions 635 is formed in a portion of each of the source or drain regions 633 and in that of each of the connection region 634. Also, a sidewall 665 is formed over side surfaces of the gate insulating film 661 and the gate electrode 671.

The p-channel type TFT 612 includes an island-shaped semiconductor film 622, a gate insulating film 662, and a gate electrode 672 including a lower gate electrode 672a and an upper gate electrode 672b, over the upper base film 603c. A channel forming region 641, source or drain regions 642, silicide regions 645 are provided for the island-shaped semiconductor film 622. Each of the silicide regions 645 is formed in a portion of each of the source or drain regions 642. Also, a sidewall 666 is formed over side surfaces of the gate insulating film 662 and the gate electrode 672.

The n-channel type TFT 613 includes an island-shaped semiconductor film 623, a gate insulating film 663, and a gate electrode 673 including a lower gate electrode 673a and an upper gate electrode 673b, over the upper base film 603c. A channel forming region 651, low-concentration impurity regions 652, source or drain regions 653, connection regions 654, and silicide regions 655 are provided for the island-shaped semiconductor film 623. Each of the silicide regions 655 is formed in a portion of the source or drain regions 653 and in that of each of the connection regions 654. Also, a sidewall 667 is formed over side surfaces of the gate insulating film 663 and the gate electrode 673.

Further, after this, a passivation film 681 may be formed to protect the TFTs 611 to 613. For the passivation film 681, it is desirable to use silicon nitride, silicon oxide containing nitrogen, aluminum nitride, aluminum oxide, silicon oxide, or the like, which can prevent an alkali metal or an alkaline from entering the TFTs 611 to 613. Specifically, a silicon oxide film containing nitrogen with a film thickness of 600 nm can be used as the passivation film, for example. In this case, a hydrogenation treatment step may be carried out after forming the silicon oxide film containing nitrogen. By employing the foregoing structure, the TFTs 611 to 613 are surrounded by the base film 603 and the passivation film 681; consequently, an alkali metal such as Na or an alkaline earth metal can be prevented from diffusing into a semiconductor film used in a semiconductor element, and having an adverse affect on a characteristic of the semiconductor element.

Next, a first interlayer insulating film 682 is formed covering the TFTs 611 to 613 and the passivation film 681. For the first interlayer insulating film 682, an organic resin having a heat resistance property such as polyimide, acrylic, or polyamide can be used. Also, other than the above organic resin, a low-dielectric constant material (low-k material), a resin containing a Si—O—Si bond formed with a siloxane based material as a starting material (hereinafter referred to as a siloxane based resin), or the like can be used.

Note that a skeleton structure of siloxane includes a bond between silicon (Si) and oxygen (O), and an organic group containing at least hydrogen (for example, an alkyl group or aromatic hydrocarbon) is used for a substituent. Alternatively, a fluoro group may be used for the substituent. Further, the organic group containing at least hydrogen and the fluoro group may be used for the substituent.

In forming the first interlayer insulating film 682, spin coating, dipping, spray coating, droplet discharging (inkjet printing, screen printing, offset printing, or the like), a doctor knife, a roll coater, a curtain coater, a knife coater, or the like can be employed depending on a material thereof. Also, an inorganic material can be used, and in that case, silicon oxide, silicon nitride, silicon oxynitride, PSG (phosphosilicate glass), BPSG (borophosphosilicate glass), an alumina film, or the like can be used. Note that insulating films thereof may be stacked to form the first interlayer insulating film 682.

Further, in this embodiment, a second interlayer insulating film 683 is formed over the first interlayer insulating film 682. As the second interlayer insulating film 683, a film containing carbon such as DLC (diamond like carbon) or carbon nitride (CN), a silicon oxide film, a silicon nitride film, a silicon oxide film containing nitrogen, or the like can be used. As a formation method, a plasma CVD method, an atmospheric-pressure plasma CVD method, or the like can be used. Alternatively, a photosensitive or non-photosensitive organic material such as polyimide, acrylic, polyamide, resist, benzocyclobutene, or the like, or a siloxane based resin, or the like may be used.

Note that in order to prevent peeling of or cracks in the first interlayer insulating film 682 or the second interlayer insulating film 683 due to stress caused by a difference in coefficient of thermal expansion between the first interlayer insulating film 682 or the second interlayer insulating film 683 and a conductive material or the like included in a wiring formed later, a filler may be mixed into the first interlayer insulating film 682 or the second interlayer insulating film 683.

Subsequently, contact holes are formed in the first interlayer insulating film 682 and the second interlayer insulating film 683. Surfaces of the island-shaped semiconductor films 621 to 623 exposed by the contact holes are washed with hydrofluoric acid, or subjected to a plasma treatment with hydrogen plasma. Next, electrodes or wirings 691 to 695 that connect to the TFTs 611 to 613 via the contact holes are formed. In this embodiment, the electrodes and the wirings are formed together, but they may be formed separately and then electrically connected. Although a mixed gas of $CHF_3$ and He is used as a gas used for etching when forming the contact holes, it is not limited thereto. In this embodiment, the electrodes or wirings 691 to 695 are formed by a sputtering method so as to have a five layer structure in which a titanium (Ti) film, a titanium nitride (TiN) film, a aluminum film containing silicon (Al—Si), a titanium (Ti) film, and a titanium nitride (TiN) film are stacked.

Note that by mixing silicon (Si) into an aluminum (Al) film, generation of hillocks during resist baking when the wirings are formed can be prevented. Also, about 0.5% of Cu may be mixed instead of Si. Further, by sandwiching the Al—Si layer with Ti and TiN, hillock resistance is further improved. Note that it is desirable to use the foregoing hard mask made of silicon oxide containing nitrogen, or the like, for etching. Further, a wiring material and a formation method are not limited to these, and the material used for the aforementioned gate electrode may be employed.

Furthermore, the electrodes or wirings 691 to 695 may be formed of an aluminum alloy film containing carbon and at least one type of element selected from nickel, cobalt, and iron. With such an aluminum alloy film, even if it comes into contact with silicon, interdiffusion of silicon and aluminum can be prevented. Also, with such an aluminum alloy film, an oxidation-reduction reaction does not occur even if it comes into contact with a transparent conductive film, for example an ITO (Indium Tin Oxide) film, and they can be in direct contact with each other. Further, such an aluminum alloy film has low resistivity and excellent heat resistance; therefore, it is useful as a wiring material.

The electrode or wiring 691 and the electrode or wiring 692 are electrically connected to the silicide regions in the connection regions 634 of the n-channel type TFT 611. The electrode or wiring 692 and the electrode or wiring 693 are electrically connected to the silicide regions in the source or drain regions 642 of the p-channel type TFT 612. Also, the electrode or wiring 694 and the electrode or wiring 695 are electrically connected to silicide regions in the connection regions 654 of the n-channel type TFT 613. Further, the electrode or wiring 695 is also connected to the gate electrode 673 of the n-channel type TFT 613. The n-channel type TFT 613 can be used for a memory element of a random ROM (see FIG. 16B).

Subsequently, a third interlayer insulating film 701 is formed over the second interlayer insulating film 683 so as to cover the electrodes or wirings 691 to 695. The third interlayer insulating film 701 is formed so as to have an opening portion in a position where a portion of the electrode or wiring 691 is exposed. Note that the third interlayer insulating film 701 can be formed using a material similar to that of the first interlayer insulating film 682.

Next, an antenna 705 is formed over the third interlayer insulating film 701 (see FIG. 17A). For the antenna 705, a conductive material including one or more of the following can be used: metals such as Ag, Au, Cu, Pd, Cr, Mo, Ti, Ta, W, Al, Fe, Co, Zn, Sn, and Ni; and metal compounds thereof. The antenna 705 is connected to the electrode or wiring 691. Note that although in FIG. 17A, the antenna 705 is directly connected to the electrode or wiring 691, an ID chip of the present invention is not limited to this structure. For example, the antenna 705 and the electrode or wiring 691 may be electrically connected using a wiring that is formed separately.

The antenna 705 can be formed using a printing method, a photolithography method, an evaporation method, a droplet discharging method, or the like. Although the antenna 705 is formed of a single-layer conductive film in this embodiment, the antenna 705 in which a plurality of conductive films are stacked can be formed. For example, the antenna 705 may be formed in which a wiring formed of Ni or the like is coated with Cu by electroless plating.

Note that a droplet discharging method refers to a method of forming a prescribed pattern by discharging droplets containing a prescribed composition from fine holes, and an inkjet method and the like are included in its category. Also, a screen printing method, an offset printing method, and the like are included in printing methods. By sing a printing method or a droplet discharging method, the antenna 705 can be formed without using a mask for light exposure. Also, with a droplet discharging method or a printing method, a material is not wasted as it is by etching according to a photolithography method. Further, since an expensive mask for light exposure does not have to be used, cost of manufacturing an ID chip can be suppressed.

In a case of using a droplet discharging method or a variety of printing methods, conductive particles of Cu coated with Ag can also be used, for example. Note that in a case of forming the antenna 705 using a droplet discharging method, it is desirable that a surface of the third interlayer insulating film 701 is subjected to a treatment by which adhesiveness of the antenna 705 is improved.

As a method of improving adhesiveness, specifically, a method of attaching to a surface of the third interlayer insulating film 701 a metal or a metal compound that can improve adhesiveness of a conductive film or an insulating film by a catalyst action; a method of attaching to the surface of the third interlayer insulating film 701 an organic insulating film, a metal or a metal compound that has high adhesiveness with respect to a conductive film or an insulating film that is to be formed; a method of subjecting the surface of the third interlayer insulating film 701 to a plasma treatment under atmospheric pressure or reduced pressure to modify the surface; or the like can be given, for example. Also, as the metal that has high adhesiveness with respect to a conductive film or insulating film, Sc, Ti, V, Cr, Mn, Fe, Co, Ni, Cu, Zn, or the like which is a 3d transition element can be given in addition to titanium and an oxide of titanium. Further, as the metal compound, an oxide, a nitride, an oxynitride, or the like of the metal can be given. Furthermore, as the organic insulating film, polyimide, a siloxane based resin, and the like can be given as examples.

In a case where the metal or metal compound attached to the third interlayer insulating film 701 has conductivity, sheet resistance thereof is controlled so that it does not interfere with normal operation of the antenna. Specifically, an average thickness of the metal or metal compound having conductivity is controlled to be 1 to 10 nm, for example, and the metal or metal compound may be partially or entirely insulated by oxidation. Alternatively, the attached metal or metal compound may be selectively removed by etching except for a region in which adhesiveness is desired to be improved. Further alternatively, the metal or metal compound may be selectively attached to a specific region using a droplet discharging method, a printing method, a sol-gel method, or the like, instead of attaching to an entire surface of a substrate in advance. Note that the metal or metal compound does not have to be in a film form without a break at all, but it may be in a state in which it is dispersed to a certain degree.

Then, as shown in FIG. 17B, after the antenna 705 is formed, a protection layer 711 is formed over the third interlayer insulating film 701 so as to cover the antenna 705. For the protection film 711, a material is used by which the antenna 705 can be protected when the peeling layer 602 is later removed by etching. For example, the protection layer 711 can be formed by applying over an entire surface an epoxy based resin, an acrylate based resin, or a silicon based resin, which is soluble in water or in alcohols.

In this embodiment, the protection layer 711 is formed by applying a water soluble resin (VL-WSHL10 manufactured by TOA GOSEI Co., Ltd) by a spin coating method to have a film thickness of 30 μm, exposing the water soluble resin to light for two minutes for preliminary curing, and then exposing the water soluble resin to UV light from a rear surface of a substrate for 2.5 minutes, and then from a front surface for 10 minutes for a total of 12.5 minutes, in order to completely cure the water soluble resin. Note that in a case where a plurality of organic resins are stacked, there is a concern with organic resins in that a portion may be dissolved during application or baking depending on a catalyst that is used, or in that adhesiveness is too high. Therefore, in a case where organic resins that are both soluble in the same solvent are used for the third interlayer insulating film 701 and the protection layer 711, an inorganic insulating film (a silicon nitride film, a silicon nitride film containing oxygen, a silicon oxide film containing nitrogen, an aluminum nitride film, an aluminum nitride film containing oxygen, or an aluminum oxide film containing nitrogen) is preferably formed so as to cover the third interlayer insulating film 701, so that removal of the protection layer 711 in a later step is carried out smoothly.

Figure 18A:
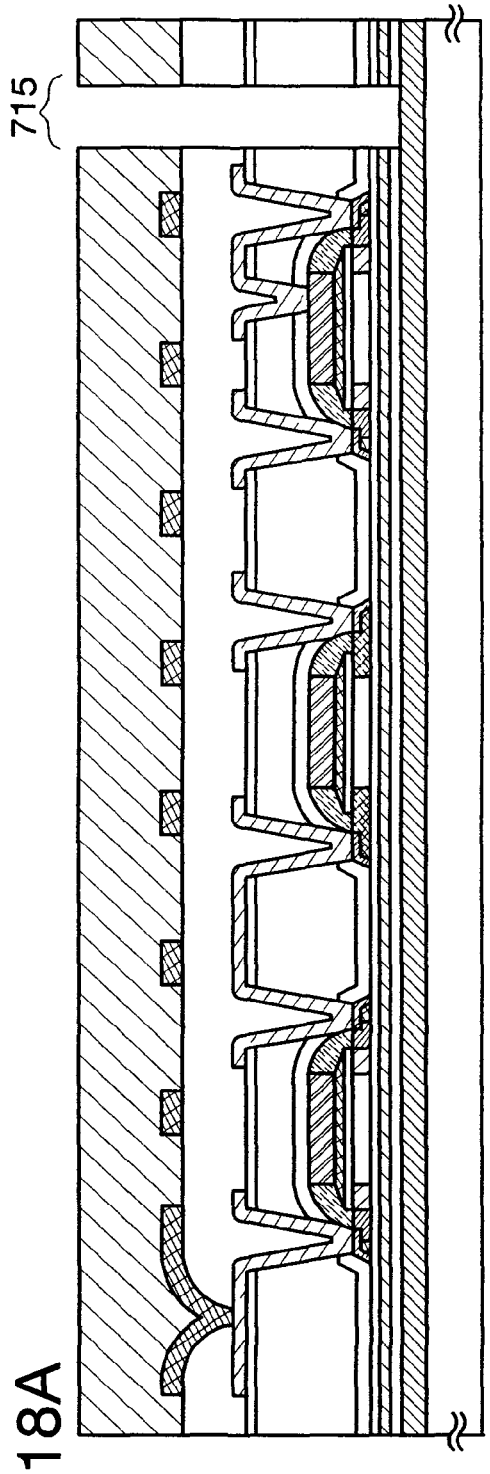
FIGS. 18A and 18B each show a manufacturing step of an ID chip of the present invention.

Next, as shown in FIG. 18A, a groove 715 is formed for separating ID chips from each other. It is acceptable as long as the groove 715 exposes the peeling layer 602. The groove 715 can be formed by dicing, scribing, or the like. Note that in a case where it is not necessary to separate ID chips formed over the first substrate 601, it is not always necessary to form the groove 715.

Figure 18B:
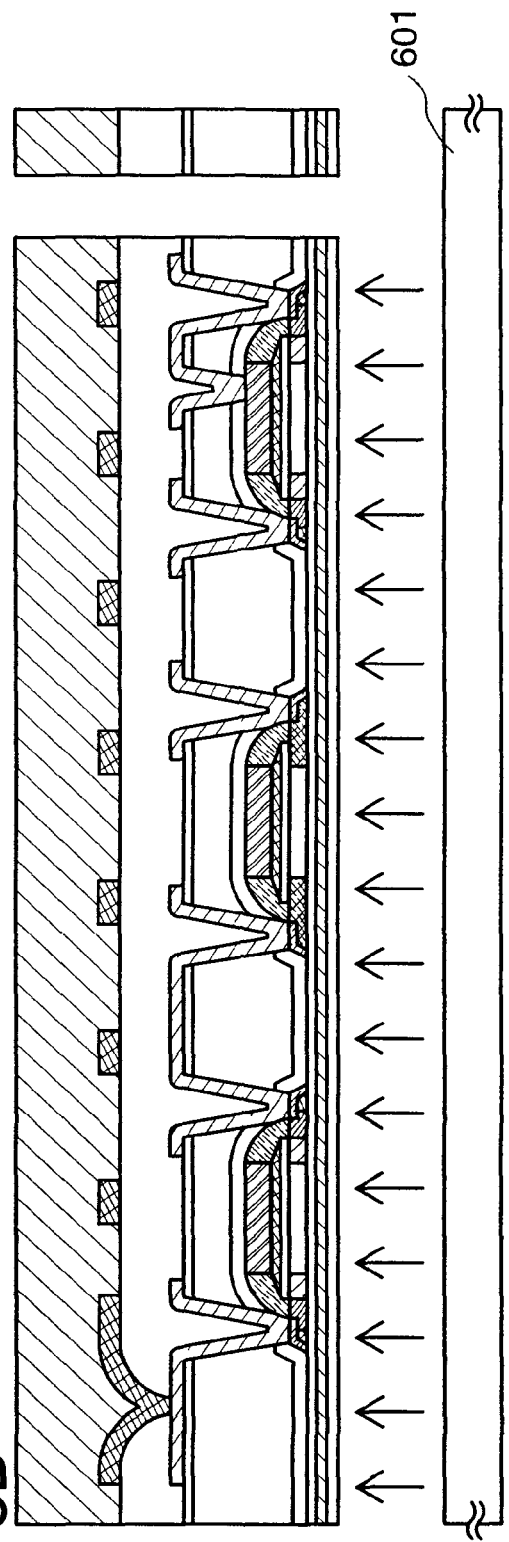

Subsequently, as shown in FIG. 18B, the peeling layer 602 is removed by etching. In this embodiment, halogen fluoride is used as an etching gas and the gas is introduced through the groove 715. In this embodiment, etching is carried out for three hours using, for example, CIF$_3$ (chlorine trifluoride) at a temperature of 350° C., a flow rate of 300 sccm, and a pressure of 798 Pa. Alternatively, a CIF$_3$ gas mixed with nitrogen may be used as well. By using halogen fluoride such as CIF$_3$, the peeling layer 602 is selectively etched, and the first substrate 601 can be peeled off from the TFTs 611 to 613. Note that halogen fluoride may be either a gas or a liquid.

Figure 19A:
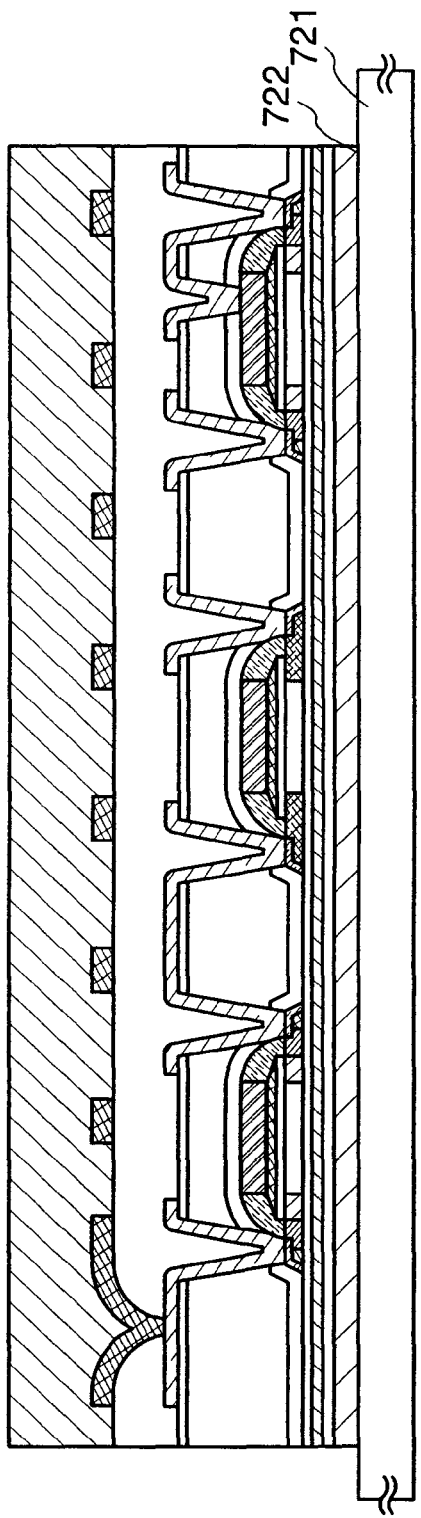
FIGS. 19A and 19B each show a manufacturing step of an ID chip of the present invention.

Next, as shown in FIG. 19A, the TFTs 611 to 613 that are peeled and the antenna 705 are attached to a second substrate 721 using an adhesive 722. For the adhesive 722, a material that can attach together the second substrate 721 and the base film 603 is used. For example, various curable adhesives may be used such as a reactive curable adhesive, a thermosetting adhesive, a photo-curable adhesive such as an ultraviolet curable adhesive, and an anaerobic adhesive.

The second substrate 721 can be made of an organic material such as flexible paper or plastic. Alternatively, a flexible inorganic material may be used for the second substrate 721. The plastic substrate may be made of ARTON (manufactured by JSR) including poly-norbornene that has a polar group. In addition, polyester typified by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, and the like are given. It is desirable that the second substrate 721 have heat conductivity as high as about 2 to 30 W/mK in order to diffuse the heat generated in the integrated circuit.

Figure 19B:
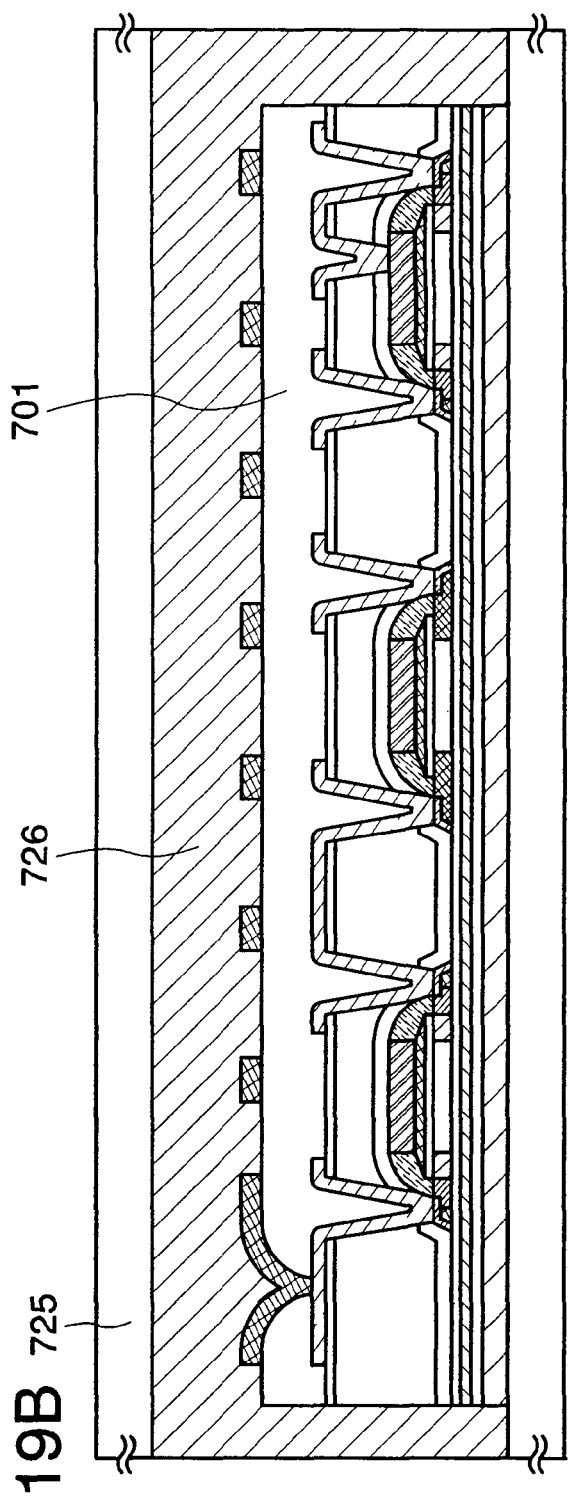

Next, as shown in FIG. 19B, after removing the protection layer 711, an adhesive 726 is applied over the third interlayer insulating film 701 so as to cover the antenna 705, and a cover material 725 is attached. For the cover material 725, an organic material such as flexible paper or plastic can be used similarly to the second substrate 721. The thickness of the adhesive 726 may be for example 10 to 200 μm.

Further, a material that can attach together the cover material 725, and the third interlayer insulating film 701 and the antenna 705 is used for the adhesive 726. For example, various curable adhesives may be used such as a reactive curable adhesive, a thermosetting adhesive, a photo-curable adhesive such as an ultraviolet curable adhesive, and an anaerobic adhesive.

An ID chip is completed through the foregoing steps. According to the above manufacturing method, a dramatically thin integrated circuit with a total film thickness of 0.3 μm or more to 3 μm or less, typically about 2 μm, can be formed between the second substrate 721 and the cover material 725. Note that the thickness of the integrated circuit includes not only a thickness of a semiconductor element itself, but also thicknesses of a variety of insulating films and interlayer insulating films formed between the adhesive 722 and the adhesive 726. Also, an area occupied by the integrated circuit included in the ID chip is 5 mm×5 mm (25 mm$^2$) or less, and desirably about 0.3 mm×0.3 mm (0.09 mm$^2$) to 4 mm×4 mm (16 mm$^2$)

Note that by placing the integrated circuit more in the middle between the second substrate 721 and the cover material 725, mechanical strength of the ID chip can be improved. Specifically, if a distance between the second substrate 721 and the cover material 725 is d, it is desirable to control thicknesses of the adhesive 722 and the adhesive 726 so that a distance between the second substrate 721 and the center in a thickness direction of the integrated circuit satisfies the following Value 1.

$$d/2-30 \text{ μm} < x < d/2+30 \text{ μm}$$

It is more preferable to control the thicknesses of the adhesive 722 and the adhesive 726 so that the following Value 2 is satisfied.

$$d/2-10 \text{ μm} < x < d/2+10 \text{ μm}$$

Although an example of using the cover material 725 is shown in FIG. 19B, the present invention is not limited thereto. For example, it may be that steps only up to the step shown in FIG. 19A are carried out.

Note that in this embodiment, although a method of peeling off an integrated circuit from a substrate by providing a peeling layer between the first substrate 601 with high heat resistance and the integrated circuit, and then removing the peeling layer by etching is shown, a manufacturing method of an ID chip of the present invention is not limited to this structure. For example, a metal oxide film may be provided between a substrate with high heat resistance and an integrated circuit, and then the integrated circuit may be peeled off by weakening the metal oxide film by crystallization. Alternatively, a peeling layer using an amorphous semiconductor film containing hydrogen may be provided between the substrate with high heat resistance and the integrated circuit, and the integrated circuit may be peeled from the substrate by removing the peeling layer by laser light irradiation. Further alternatively, the integrated circuit may be separated off from the substrate by mechanically eliminating the substrate with high heat resistance over which the integrated circuit is formed, or by removing the substrate with high heat resistance by etching with a solution or a gas.

Also, when an organic resin is used for the adhesive 722 in contact with the base film 603 to secure flexibility of an ID chip, by using a silicon nitride film or a silicon oxide film containing nitrogen as the base film 603, diffusion of an alkali metal such as Na or an alkaline earth metal from the organic resin into a semiconductor film can be prevented.

In the case that an object to be attached with an ID chip has a curved surface and the second substrate 721 of the ID chip therefore bends to have a curved surface generated by a movement of a generating line such as a conical surface, a cylindrical surface, or the like, it is desirable that a direction of the generating line is aligned with a direction in which carriers move in the TFTs 611 to 613. With the above structure, it is possible to prevent the characteristics of the TFTs 611 to 613 from being affected even if the second substrate 721 is bent. Also, by making a proportion of an area in an integrated circuit occupied by the island-shaped semiconductor film to be 1 to 30%, an effect on the characteristics of the TFTs 611 to 613 due to bending of the second substrate 721 can be suppressed.

Note that although an example of forming an antenna and an integrated circuit over the same substrate is described in this embodiment, the present invention is not limited to this structure. An antenna and an integrated circuit formed over different substrates may be electrically connected by attaching them to each other later.

Note that in general, frequency of electrical waves used for an ID chip is often 13.56 MHz or 2.45 GHz, and it is extremely important to form the ID chip so that electrical waves of this frequency can be detected in order to increase versatility.

Further, with the ID chip of this embodiment, electrical waves are less easily blocked than an ID chip formed using a semiconductor substrate, and there is an advantage that attenuation of signals due to blocking of electrical waves can be prevented. Therefore, cost of the ID chip can be significantly reduced since a semiconductor substrate is not necessary. As an example, a case of using a silicon substrate with a 12-inch diameter and a case of using a glass substrate with a size of 730×920 mm$^2$ are compared. An area of the silicon substrate is about 73,000 mm$^3$, whereas an area of the glass substrate is about 672,000 mm$^3$, and the area of the glass substrate is about 9.2 times as large as the area of the silicon substrate. Ignoring the area consumed when the substrate is divided, it is calculated that about 672,000 ID chips of 1 mm×1 mm can be formed from the latter glass substrate with the area of about 672,000 mm$^2$, and this number is about 9.2 times that of the silicon substrate. Also, since the number of steps in the case of using the glass substrate with a size of 730×920 mm² is smaller than that of the silicon substrate with a 12-inch diameter, an amount of investment in facility for mass producing the ID chip can be covered by ⅓ of that of the silicon substrate with a 12-inch diameter. Further, in the present invention, the glass substrate can be reused after an integrated circuit is peeled off. Therefore, even after taking into consideration expense in replacing broken glass substrates and cleaning surfaces of the glass substrates, cost can be significantly suppressed as compared to a case where the silicon substrate is used. Furthermore, even if the glass substrate is not reused and is disposed of, a price of the glass substrate with a size of 730×920 mm² is about half of that of the silicon substrate with a 12-inch diameter, and it is apparent that the cost of the ID chip can be significantly reduced.

Consequently, it is apparent that when the glass substrate with a size of 730×920 mm² is used, price of the ID chip can be suppressed to about ¹⁄₃₀ of that when the silicon substrate with a 12-inch diameter is used. Since disposable uses can be considered for ID chips, the ID chip of the present invention of which cost can be significantly reduced is extremely useful for the above use.

Note that although an example of peeling off an integrated circuit and sticking it on a flexible substrate is described in this embodiment, the present invention is not limited to this structure. For example, in a case of using a substrate that has a heat resistance temperature as to withstand a heat treatment in a manufacturing process of an integrated circuit, it is not always necessary to peel off the integrated circuit.

Also, if necessary, this embodiment can be freely combined with any part of the description of Embodiment Modes 1 to 3 and other embodiments.

Embodiment 6

As electronic appliances to which the present invention is applied, the following are given: a video camera, a digital camera, a goggle display, a navigation system, an audio reproducing device (such as a car audio component), a computer, a game machine, a portable information terminal (such as a mobile computer, a cellular phone, a portable game machine, and an electronic book), an image reproducing device provided with a recording medium (specifically, a device which can reproduce a recording medium such as a digital versatile disc (DVD) and includes a display capable of displaying the image), and the like. Specific examples of these electronic appliances are shown in FIGS. 20A 21D.

Figure 20A:
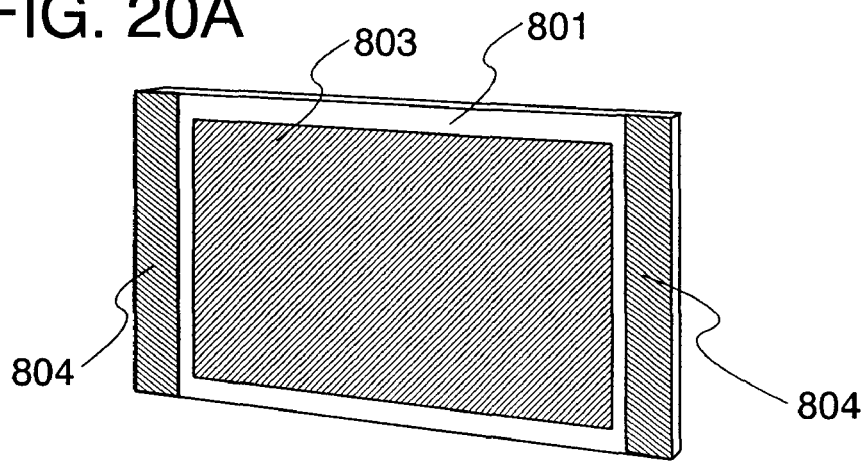
FIGS. 20A to 20D each show an example of an electronic appliance to which the present invention is applied.

FIG. 20A shows a light emitting display device to which a television receiver or the like corresponds. The light emitting display device includes a housing 801, a display portion 803, a speaker portion 804, and the like. The present invention can be applied to TFTs and the display portion 803 of a control circuit portion or the like. A polarizing plate or a circularly polarizing plate may be provided in a pixel portion in order to improve contrast. For example, a quarter-wave plate, a half-wave plate and a polarizing plate may be provided in this order over a sealing substrate. Also, an anti-reflection film may be provided over the polarizing plate. By using the present invention, a light emitting display device with high driving speed and high reliability can be obtained. Also, by sticking an ID chip manufactured according to Embodiment 5 on the light emitting display device, a distribution route and the like can be clarified.

Figure 20B:
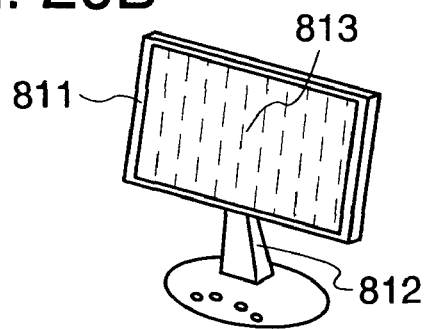

FIG. 20B shows a liquid crystal display or an OLED display, and includes a housing 811, a supporting base 812, a display portion 813, and the like. The present invention can be applied to TFTs and the display portion 813 of a control circuit portion or the like. By using the present invention, a liquid crystal display or an OLED display with high driving speed and high reliability can be obtained. Also, by sticking an ID chip manufactured according to Embodiment 5 on the liquid crystal display or the OLED display, a distribution route and the like can be clarified.

Figure 20C:
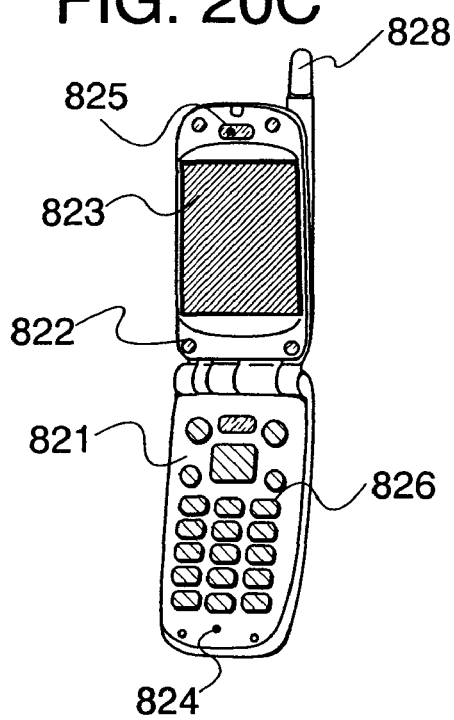

FIG. 20C shows a cellular phone which includes a main body 821, a housing 822, a display portion 823, an audio input portion 824, an audio output portion 825, an operation key 826, an antenna 828, and the like. The present invention can be applied to TFTs and the display portion 823 of a control circuit portion or the like. By using the present invention, a cellular phone with high driving speed and high reliability can be obtained. Also, by sticking an ID chip manufactured according to Embodiment 5 on the cellular phone, a distribution route and the like can be clarified.

Figure 20D:
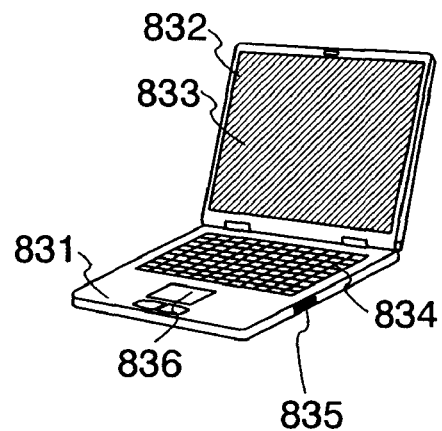

FIG. 20D shows a laptop personal computer which includes a main body 831, a housing 832, a display portion 833, a keyboard 834, an external connection port 835, a pointing mouse 836, and the like. The present invention can be applied to TFTs and the display portion 833 of a control circuit portion or the like. By using the present invention, a personal computer with high driving speed and high reliability can be obtained. Also, by sticking an ID chip manufactured according to Embodiment 5 on the personal computer, a distribution route and the like can be clarified.

Figure 21A:
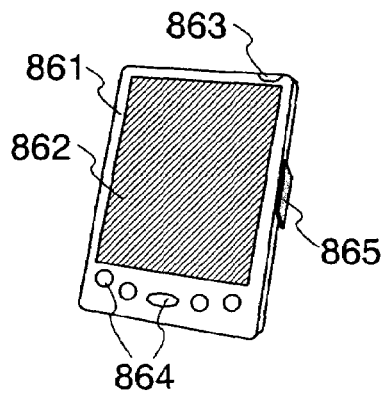
FIGS. 21A to 21D each show an example of an electronic appliance to which the present invention is applied.
Figure 21B:
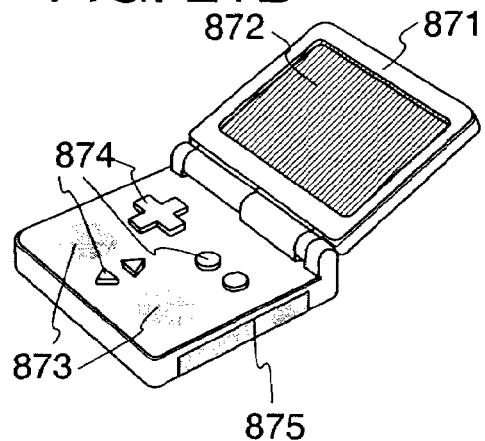
Figure 21C:
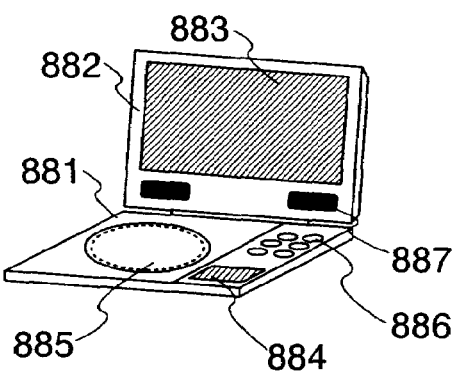
Figure 21D:
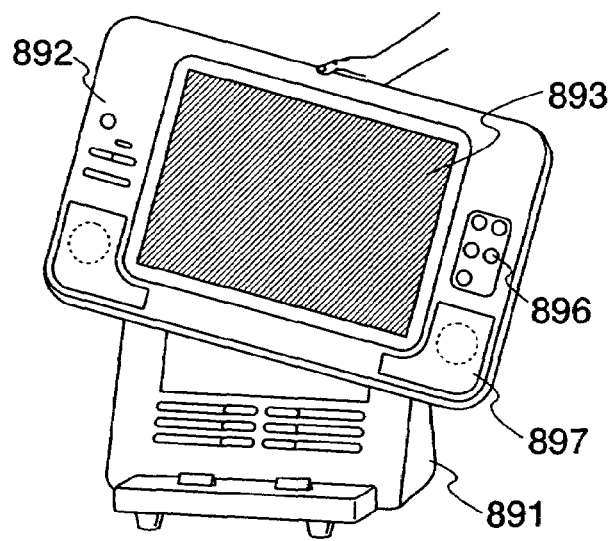

FIG. 21A shows a mobile computer which includes a main body 861, a display portion 862, a switch 863, an operation key 864, an infrared port 865, and the like. The present invention can be applied to TFTs and the display portion 862 of a control circuit portion or the like. By using the present invention, a mobile computer with high driving speed and high reliability can be obtained. Also, by sticking an ID chip manufactured according to Embodiment 5 on the mobile computer, a distribution route and the like can be clarified.

FIG. 22B shows a portable game machine which includes a housing 871, a display portion 872, a speaker portion 873, an operation key 874, a recording medium insertion portion 875, and the like. The present invention can be applied to TFTs and the display portion 872 of a control circuit portion or the like. By using the present invention, a portable game machine with high driving speed and high reliability can be obtained. Also, by sticking an ID chip manufactured according to Embodiment 5 on the portable game machine, a distribution route and the like can be clarified.

FIG. 22C shows a portable image reproducing device provided with a recording medium (specifically, a DVD reproducing device) which includes a main body 881, a housing 882, a display portion A 883, a display portion B 884, a recording medium (such as a DVD) reading portion 885, an operation key 886, a speaker portion 887, and the like. The display portion A 883 mainly displays image information, and the display portion B 884 mainly displays textual information. The present invention can be applied to the display portion A 883, the display portion B 884, and a TFT of a control circuit portion or the like. Note that a home-use game machine is included as a portable image reproducing device. By using the present invention, an image reproducing device with high driving speed and high reliability can be obtained. Also, by sticking an ID chip manufactured according to Embodiment 5 on the image reproducing device, a distribution route and the like can be clarified.

FIG. 21D shows a wireless TV of which just a display can be carried around. A battery and a signal receiver are incorporated in a housing 892, and a display portion 893 and a speaker portion 897 are driven by the battery. The battery can be repeatedly recharged by a recharger 891. Further, the recharger 891 can transmit and receive video image signals, and transmit the image signals to the signal receiver of the display. The housing 892 is controlled by an operation key 896. Also, the device shown in FIG. 21D can also be called an image sound two-way communication device, since it can transmit signals from the housing 892 to the recharger 891 by operating the operation key 896. In addition, the device shown in FIG. 21D can also be called a general-purpose remote-control device, since communication control of another electronic appliance is possible by operating the operation key 896 and sending signals from the housing 892 to the recharger 891 as well as having the other electronic appliance receive signals that can be transmitted from the recharger 891. The present invention can be applied to TFTs and the display portion 893 of a control circuit portion or the like. By using the present invention, a TV with high driving speed and high reliability can be obtained. Also, by sticking an ID chip manufactured according to Embodiment 5 on the TV, a distribution route and the like can be clarified.

For a display device used for such electronic appliances, a plastic substrate with heat resistance can be used other than a glass substrate, depending on size or strength, as well as purpose of use. Consequently, further reduction in weight can be achieved.

Note that examples shown in this embodiment are mere examples, and the present invention is not limited to these uses.

Further, this embodiment can be applied in free combination with any part of the description of Embodiment Modes 1 to 3 and the embodiments.

This application is based on Japanese Patent Application serial no. 2006-100263 filed in Japan Patent Office on Mar. 31 in 2006, the entire contents of which are hereby incorporated by reference.

What is claimed is:

1. A semiconductor device comprising:
   a semiconductor film over a substrate, wherein the semiconductor film includes at least a channel forming region, a region, a source and drain regions disposed between the channel forming region and the region, a first silicide region over the region, and a second silicide region over a portion of the source and drain regions,
   a gate insulating film over the channel forming region,
   a gate electrode over the gate insulating film,
   an insulating film over the gate insulating film and the gate electrode, wherein the insulating film has a contact hole to expose at least the first silicide region, and
   a source and drain electrodes over the insulating film, wherein each of the source and drain electrodes is electrically connected to the first silicide region via the contact hole,
   wherein the region includes an element imparting one conductivity type at a lower concentration than the source and drain regions.

2. The semiconductor device according to claim 1, wherein the first silicide region is in contact with the region.

3. The semiconductor device according to claim 1, wherein the first silicide region is formed in a vicinity of a surface of the region.

4. The semiconductor device according to claim 1, wherein the second silicide region is in contact with the source and drain regions.

5. The semiconductor device according to claim 1, wherein the second silicide region is formed in a vicinity of a surface of a portion of the source and drain regions.

6. The semiconductor device according to claim 1, wherein each of the first silicide region and the second silicide region includes at least one selected from the group consisting of titanium silicide, nickel silicide, cobalt silicide, tungsten silicide, and platinum silicide.

7. The semiconductor device according to claim 1, wherein the element imparting one conductivity type is an element imparting n-type conductivity.

8. A semiconductor device comprising:
   a semiconductor film over a substrate, wherein the semiconductor film includes a channel forming region, a region, a source and drain regions disposed between the channel forming region and the region, a first silicide region over the region, a second silicide region over a portion of the source and drain regions, and a LDD region disposed between the channel forming region and the source and drain regions,
   a gate insulating film over the channel forming region,
   a gate electrode over the gate insulating film,
   a sidewall over a side surface of the gate electrode,
   an insulating film over the gate insulating film and the gate electrode, wherein the insulating film has a contact hole to expose at least the first silicide region, and
   a source and drain electrodes over the insulating film, wherein each of the source and drain electrodes is electrically connected to the first silicide region via the contact hole,
   wherein the region includes an element imparting one conductivity type at a lower concentration than the source and drain regions.

9. The semiconductor device according to claim 8, wherein the first silicide region is in contact with the region.

10. The semiconductor device according to claim 8, wherein the first silicide region is formed in a vicinity of a surface of the region.

11. The semiconductor device according to claim 8, wherein the second silicide region is in contact with the source and drain regions.

12. The semiconductor device according to claim 8, wherein the second silicide region is formed in a vicinity of a surface of a portion of the source and drain regions.

13. The semiconductor device according to claim 8, wherein each of the first silicide region and the second silicide region includes at least one selected from the group consisting of titanium silicide, nickel silicide, cobalt silicide, tungsten silicide, and platinum silicide.

14. The semiconductor device according to claim 8, wherein the element imparting one conductivity type is an element imparting n-type conductivity.

15. The semiconductor device according to claim 8, wherein an end portion of the LDD region is aligned with an end portion of the gate insulating film.

16. The semiconductor device according to claim 8, wherein an end portion of the second silicide region is aligned with an end portion of the sidewall.

17. A manufacturing method of a semiconductor device comprising the steps of:
   forming a semiconductor film over a substrate,
   forming a gate insulating film over the semiconductor film,
   forming a gate electrode over the gate insulating film,
   forming a resist over a portion of the semiconductor film,
   introducing an element imparting one conductivity type into the semiconductor film with the resist as a mask,
   forming a source and drain regions in the semiconductor film and a region in the semiconductor film over which the resist is formed, by introducing the element,
   forming a metal film over the semiconductor film, forming a first silicide region over the region and a second silicide region over a portion of the source and drain regions by heating the semiconductor film and the metal film, forming an insulating film over the gate insulating film and the gate electrode, forming a contact hole in the insulating film that reaches at least the first silicide region, and forming a source and drain electrodes electrically connected to the first silicide region via the contact hole.

18. The manufacturing method of a semiconductor device according to claim 17, wherein the element imparting one conductivity type is an element imparting n-type conductivity.

19. The manufacturing method of a semiconductor device according to claim 17, wherein the metal film includes any one of titanium (Ti), nickel (Ni), cobalt (Co), tungsten (W), and platinum (Pt).

20. A manufacturing method of a semiconductor device comprising the steps of:

forming a semiconductor film over a substrate, forming a gate insulating film over the semiconductor film, forming a gate electrode over the gate insulating film, forming a resist over a portion of the semiconductor film, introducing an element imparting one conductivity type into the semiconductor film with the resist as a mask, forming a source and drain regions in the semiconductor film and a region in the semiconductor film over which the resist is formed, by introducing the element, forming a sidewall over a side surface of the gate electrode, forming a metal film over the semiconductor film, forming a first silicide region over the region and a second silicide region over a portion of the source and drain regions by heating the semiconductor film and the metal film, forming an insulating film over the gate insulating film and the gate electrode, forming a contact hole in the insulating film that reaches at least the first silicide region, and forming a source and drain electrodes electrically connected to the first silicide region via the contact hole.

21. The manufacturing method of a semiconductor device according to claim 20, wherein the element imparting one conductivity type is an element imparting n-type conductivity.

22. The manufacturing method of a semiconductor device according to claim 20, wherein the metal film includes any one of titanium (Ti), nickel (Ni), cobalt (Co), tungsten (W), and platinum (Pt).

* * * * *